(12) United States Patent
Sakaguchi et al.

(10) Patent No.: US 7,884,743 B2
(45) Date of Patent: Feb. 8, 2011

(54) ARITHMETIC DECODING DEVICE

(75) Inventors: Hiroaki Sakaguchi, Kanagawa (JP);
Hiroshi Yoshikawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 24 days.

(21) Appl. No.: 12/431,828

(22) Filed: Apr. 29, 2009

(65) Prior Publication Data

US 2009/0273491 A1    Nov. 5, 2009

(30) Foreign Application Priority Data

Apr. 30, 2008  (JP) ............................ P2008-118493

(51) Int. Cl.
*H03M 7/00*   (2006.01)
(52) U.S. Cl. ........................................ 341/107; 341/51
(58) Field of Classification Search ................. 341/107, 341/51; 375/242, 316, 240.03, 240.18, 240.23, 375/240.26, 240.25; 382/245, 233, 247
See application file for complete search history.

(56) References Cited

U.S. PATENT DOCUMENTS 7,573,951 B2 *   8/2009   Kim ........................... 375/316

FOREIGN PATENT DOCUMENTS

JP        2007 300517        11/2007

* cited by examiner

*Primary Examiner*—Joseph Lauture
(74) *Attorney, Agent, or Firm*—Frommer Lawrence & Haug LLP; William S. Frommer; Thomas F. Presson

(57) ABSTRACT

Disclosed herein is an arithmetic decoding device including: an arithmetic decoding unit configured to decode coded data resulting from arithmetic coding on a basis of a context variable indicating a probability state and a most probable symbol; a plurality of arithmetic registers configured to supply the context variable to the arithmetic decoding unit and retain a result of operation by the arithmetic decoding unit; and a plurality of save registers configured to save contents retained in the arithmetic registers.

9 Claims, 49 Drawing Sheets

FIG. 3

| | GROUP | | SE (SYNTAX ELEMENT) | MEANING |
|---|---|---|---|---|
| FIRST HALF | MB TYPE CONTEXT GROUP | FOR I SLICES | mb_type(SI slices only) | MACROBLOCK TYPE (SI SLICES ONLY) |
| | | | mb_type(I slices only) | MACROBLOCK TYPE (I SLICES ONLY) |
| | | FOR P SLICES | mb_skip_flag(P,SP slices only) | MACROBLOCK SKIP FLAG (P AND SP SLICES ONLY) |
| | | | mb_type(P,SP slices only) | MACROBLOCK TYPE (P AND SP SLICES ONLY) |
| | | | sub_mb_type(P,SP slices only) | SUB-MACROBLOCK TYPE (P AND SP SLICES ONLY) |
| | | FOR B SLICES | mb_skip_flag(B slices only) | MACROBLOCK SKIP FLAG (B SLICES ONLY) |
| | | | mb_type(B slices only) | MACROBLOCK TYPE (B SLICES ONLY) |
| | | | sub_mb_type(B slices only) | SUB-MACROBLOCK TYPE (B SLICES ONLY) |
| | MVD CONTEXT GROUP | | mvd_l0[][][0],mvd_l1[][][0] | MOTION VECTOR INFORMATION IN HORIZONTAL DIRECTION |
| | | | mvd_l0[][][1],mvd_l1[][][1] | MOTION VECTOR INFORMATION IN VERTICAL DIRECTION |
| | PREDICTION CONTEXT GROUP | | ref_idx_l0,ref_idx_l1 | REFERENCE INDEX |
| | | | mb_qp_delta | MACROBLOCK QUANTIZATION PARAMETER |
| | | | intra_chroma_pred_mode | INTRA-SCREEN COLOR-DIFFERENCE PREDICTION MODE |
| | | | prev_intra4x4_pred_mode_flag, prev_intra8x8_pred_mode_flag | INTRA-SCREEN LUMINANCE PREDICTION MODE FLAG |
| | | | rem_intra4x4_pred_mode, rem_intra8x8_pred_mode | INTRA-SCREEN LUMINANCE PREDICTION MODE |
| | BLOCK INFORMATION CONTEXT GROUP | | mb_field_decoding_flag | MACROBLOCK FIELD DECODING FLAG |
| | | | coded_block_pattern | CODED BLOCK PATTERN |
| | | | transform_size_8x8_flag | ORTHOGONAL TRANSFORM SIZE 8X8 FLAG |
| SECOND HALF | RESIDUAL CONTEXT GROUP | | coded_block_flag | CODED BLOCK FLAG |
| | | | significant_coeff_flag | SIGNIFICANT COEFFICIENT FLAG |
| | | | last_significant_coeff_flag | LAST SIGNIFICANT COEFFICIENT FLAG |
| | | | coeff_abs_level_minus1 | COEFFICIENT ABSOLUTE VALUE INFORMATION |

FIG.4A
FOR I SLICES (1)

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 0 | 1 | 2 | 3 | 4 | 5 | 6 | 7 | 8 | 9 | 10 | | | | | |
| SE | mb_type (SI slices only) | | | mb_type (I slices only) | | | | | | | | | | | | |

FIG.4B
FOR I SLICES (2)

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 0 | 1 | 2 | 3 | 4 | 5 | 6 | 7 | 8 | 9 | 10 | 399 | 400 | 401 | | |
| SE | mb_type (SI slices only) | | | mb_type (I slices only) | | | | | | | | transform_size_8x8_flag | | | | |

FIG.4C
FOR P SLICES

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 11 | 12 | 13 | 14 | 15 | 16 | 17 | 18 | 19 | 20 | 21 | 22 | 23 | | | |
| SE | mb_skip_flag (P,SP slices only) | | | mb_type (P,SP slices only) | | | | | | | sub_mb_type (P,SP slices only) | | | | | |

FIG.4D
FOR B SLICES

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 24 | 25 | 26 | 27 | 28 | 29 | 30 | 31 | 32 | 33 | 34 | 35 | 36 | 37 | 38 | 39 |
| SE | mb_skip_flag (B slices only) | | | mb_type (B slices only) | | | | | | | | | sub_mb_type (B slices only) | | | |

FIG. 5

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 40 | 41 | 42 | 43 | 44 | 45 | 46 | 47 | 48 | 49 | 50 | 51 | 52 | 53 | | |
| SE | mvd_l0[][][0], mvd_l1[][][0] ||||||| mvd_l0[][][1], mvd_l1[][][1] ||||||| | |

FIG. 6

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 54 | 55 | 56 | 57 | 58 | 59 | 60 | 61 | 62 | 63 | 64 | 65 | 66 | 67 | 68 | 69 |
| SE | ref_idx_l0, ref_idx_l1 |||||| mb_qp_delta |||| intra_chroma_pred_mode |||| *1 | *2 |

*1 prev_intra4x4_pred_mode_flag, prev_intra8x8_pred_mode_flag

*2 rem_intra4x4_pred_mode, rem_intra8x8_pred_mode

FIG.7

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 73 | 74 | 75 | 76 | 77 | 78 | 79 | 80 | 81 | 82 | 83 | 84 | 70 | 71 | 72 | |
| SE | coded_block_pattern | | | | | | | | | | | | mb_field_decoding_flag | | | |
| ctxIdx | | | | | | | | | | | | | 399 | 400 | 401 | |
| SE | | | | | | | | | | | | | transform_size_8x8_flag | | | |

FIG. 8A
COMMON TO FRAME CODED BLOCKS AND FIELD CODED BLOCKS

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 227 | 228 | 229 | 230 | 231 | 232 | 233 | 234 | 235 | 236 | | | 85 | 86 | 87 | 88 |
| SE | coeff_abs_level_minus1 (blocks with ctxBlockCat=0) | | | | | | | | | | | | coded_block_flag (blocks with ctxBlockCat=0) | | | |

FIG. 8B
FRAME CODED BLOCKS ONLY

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 105 | 106 | 107 | 108 | 109 | 110 | 111 | 112 | 113 | 114 | 115 | 116 | 117 | 118 | 119 | |
| SE | significant_coeff_flag (frame coded blocks with ctxBlockCat=0) | | | | | | | | | | | | | | | |
| ctxIdx | 166 | 167 | 168 | 169 | 170 | 171 | 172 | 173 | 174 | 175 | 176 | 177 | 178 | 179 | 180 | |
| SE | last_significant_coeff_flag (frame coded blocks with ctxBlockCat=0) | | | | | | | | | | | | | | | |

FIG. 8C
FIELD CODED BLOCKS ONLY

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 277 | 278 | 279 | 280 | 281 | 282 | 283 | 284 | 285 | 286 | 287 | 288 | 289 | 290 | 291 | |
| SE | significant_coeff_flag (field coded blocks with ctxBlockCat=0) | | | | | | | | | | | | | | | |
| ctxIdx | 338 | 339 | 340 | 341 | 342 | 343 | 344 | 345 | 346 | 347 | 348 | 349 | 350 | 351 | 352 | |
| SE | last_significant_coeff_flag (field coded blocks with ctxBlockCat=0) | | | | | | | | | | | | | | | |

FIG. 9A
COMMON TO FRAME CODED BLOCKS AND FIELD CODED BLOCKS

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 237 | 238 | 239 | 240 | 241 | 242 | 243 | 244 | 245 | 246 | | | 89 | 90 | 91 | 92 |
| SE | coeff_abs_level_minus1 (blocks with ctxBlockCat=1) | | | | | | | | | | | | coded_block_flag (blocks with ctxBlockCat=1) | | | |

FIG. 9B
FRAME CODED BLOCKS ONLY

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 120 | 121 | 122 | 123 | 124 | 125 | 126 | 127 | 128 | 129 | 130 | 131 | 132 | 133 | | |
| SE | significant_coeff_flag (frame coded blocks with ctxBlockCat=1) | | | | | | | | | | | | | | | |
| ctxIdx | 181 | 182 | 183 | 184 | 185 | 186 | 187 | 188 | 189 | 190 | 191 | 192 | 193 | 194 | | |
| SE | last_significant_coeff_flag (frame coded blocks with ctxBlockCat=1) | | | | | | | | | | | | | | | |

FIG. 9C
FIELD CODED BLOCKS ONLY

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 292 | 293 | 294 | 295 | 296 | 297 | 298 | 299 | 300 | 301 | 302 | 303 | 304 | 305 | | |
| SE | significant_coeff_flag (field coded blocks with ctxBlockCat=1) | | | | | | | | | | | | | | | |
| ctxIdx | 353 | 354 | 355 | 356 | 357 | 358 | 359 | 360 | 361 | 362 | 363 | 364 | 365 | 366 | | |
| SE | last_significant_coeff_flag (field coded blocks with ctxBlockCat=1) | | | | | | | | | | | | | | | |

FIG.10A
COMMON TO FRAME CODED BLOCKS AND FIELD CODED BLOCKS

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 247 | 248 | 249 | 250 | 251 | 252 | 253 | 254 | 255 | 256 | | | 93 | 94 | 95 | 96 |
| SE | coeff_abs_level_minus1 (blocks with ctxBlockCat=2) | | | | | | | | | | | | coded_block_flag (blocks with ctxBlockCat=2) | | | |

FIG.10B
FRAME CODED BLOCKS ONLY

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 134 | 135 | 136 | 137 | 138 | 139 | 140 | 141 | 142 | 143 | 144 | 145 | 146 | 147 | 148 | |
| SE | significant_coeff_flag (frame coded blocks with ctxBlockCat=2) | | | | | | | | | | | | | | | |
| ctxIdx | 195 | 196 | 197 | 198 | 199 | 200 | 201 | 202 | 203 | 204 | 205 | 206 | 207 | 208 | 209 | |
| SE | last_significant_coeff_flag (frame coded blocks with ctxBlockCat=2) | | | | | | | | | | | | | | | |

FIG.10C
FIELD CODED BLOCKS ONLY

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 306 | 307 | 308 | 309 | 310 | 311 | 312 | 313 | 314 | 315 | 316 | 317 | 318 | 319 | 320 | |
| SE | significant_coeff_flag (field coded blocks with ctxBlockCat=2) | | | | | | | | | | | | | | | |
| ctxIdx | 367 | 368 | 369 | 370 | 371 | 372 | 373 | 374 | 375 | 376 | 377 | 378 | 379 | 380 | 381 | |
| SE | last_significant_coeff_flag (field coded blocks with ctxBlockCat=2) | | | | | | | | | | | | | | | |

COMMON TO FRAME CODED BLOCKS AND FIELD CODED BLOCKS

FRAME CODED BLOCKS ONLY

FIELD CODED BLOCKS ONLY

FIG.12A
COMMON TO FRAME CODED BLOCKS AND FIELD CODED BLOCKS

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 266 | 267 | 268 | 269 | 270 | 271 | 272 | 273 | 274 | 275 | | | 101 | 102 | 103 | 104 |
| SE | coeff_abs_level_minus1 (blocks with ctxBlockCat=4) | | | | | | | | | | | | coded_block_flag (blocks with ctxBlockCat=4) | | | |

FIG.12B
FRAME CODED BLOCKS ONLY

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 152 | 153 | 154 | 155 | 156 | 157 | 158 | 159 | 160 | 161 | 162 | 163 | 164 | 165 | | |
| SE | significant_coeff_flag (frame coded blocks with ctxBlockCat=4) | | | | | | | | | | | | | | | |
| ctxIdx | 213 | 214 | 215 | 216 | 217 | 218 | 219 | 220 | 221 | 222 | 223 | 224 | 225 | 226 | | |
| SE | last_significant_coeff_flag (frame coded blocks with ctxBlockCat=4) | | | | | | | | | | | | | | | |

FIG.12C
FIELD CODED BLOCKS ONLY

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 324 | 325 | 326 | 327 | 328 | 329 | 330 | 331 | 332 | 333 | 334 | 335 | 336 | 337 | | |
| SE | significant_coeff_flag (field coded blocks with ctxBlockCat=4) | | | | | | | | | | | | | | | |
| ctxIdx | 385 | 386 | 387 | 388 | 389 | 390 | 391 | 392 | 393 | 394 | 395 | 396 | 397 | 398 | | |
| SE | last_significant_coeff_flag (field coded blocks with ctxBlockCat=4) | | | | | | | | | | | | | | | |

FIG.13A
COMMON TO FRAME CODED BLOCKS AND FIELD CODED BLOCKS

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 426 | 427 | 428 | 429 | 430 | 431 | 432 | 433 | 434 | 435 | | | | | | |
| SE | coeff_abs_level_minus1 (blocks with ctxBlockCat=5) | | | | | | | | | | | | | | | |

FIG.13B
FRAME CODED BLOCKS ONLY

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 402 | 403 | 404 | 405 | 406 | 407 | 408 | 409 | 410 | 411 | 412 | 413 | 414 | 415 | 416 | |
| SE | significant_coeff_flag (frame coded blocks with ctxBlockCat=5) | | | | | | | | | | | | | | | |
| ctxIdx | 417 | 418 | 419 | 420 | 421 | 422 | 423 | 424 | 425 | | | | | | | |
| SE | last_significant_coeff_flag (frame coded blocks with ctxBlockCat=5) | | | | | | | | | | | | | | | |

FIG.13C
FIELD CODED BLOCKS ONLY

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 436 | 437 | 438 | 439 | 440 | 441 | 442 | 443 | 444 | 445 | 446 | 447 | 448 | 449 | 450 | |
| SE | significant_coeff_flag (field coded blocks with ctxBlockCat=5) | | | | | | | | | | | | | | | |
| ctxIdx | 451 | 452 | 453 | 454 | 455 | 456 | 457 | 458 | 459 | | | | | | | |
| SE | last_significant_coeff_flag (field coded blocks with ctxBlockCat=5) | | | | | | | | | | | | | | | |

FIG.14A

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| BIT WIDTH | 1 7 | 1 7 | 1 7 | 1 7 | 1 7 | 1 7 | 1 7 | 1 7 | 1 7 | 1 7 | 1 7 | 1 7 | 1 7 | 1 7 | 1 7 | 1 7 |
| CONTEXT VARIABLE | ✗C0✗ | ✗C1✗ | ✗C2✗ | ✗C3✗ | ✗C4✗ | ✗C5✗ | ✗C6✗ | ✗C7✗ | ✗C8✗ | ✗C9✗ | ✗C10✗ | ✗C11✗ | ✗C12✗ | ✗C13✗ | ✗C14✗ | ✗C15 |

FIG.14B

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| BIT WIDTH | 1 7 | 1 7 | 1 7 | 1 7 | 1 7 | 1 7 | 1 7 | 1 7 | 1 7 | 1 7 | 1 7 | 1 7 | 1 7 | 1 7 | 1 7 | 1 7 |
| CONTEXT VARIABLE | C0 | C1 | C2 | C3 | C4 | C5 | C6 | C7 | C8 | C9 | C10 | C11 | C12 | C13 | C14 | C15 |

CONTEXT VARIABLE: C16 | C17 | EXCHANGE INFORMATION BIT

FIG.31

CONTEXT INITIALIZATION INSTRUCTION
FORMAT: init cv_dst, imm_cidx, imm_ctxIdx, imm_cnum

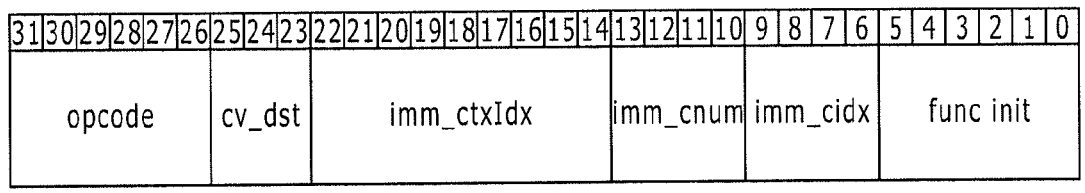

| OPERAND NAME | DESCRIPTION |
|---|---|
| cv_dst | REGISTER NUMBER OF REGISTER (CV0 TO CV7) STORING CONTEXT VARIABLE |
| imm_cidx | IMMEDIATE VALUE INDICATING cidx OF LOCATION WHERE CONTEXT VARIABLE IS STORED |
| imm_cnum | IMMEDIATE VALUE INDICATING NUMBER OF CONTEXT VARIABLES |
| imm_ctxIdx | IMMEDIATE VALUE INDICATING ctxIdx DEFINED IN H.264 |

FIG. 32

CONTEXT EXCHANGE TRANSFER INSTRUCTION (cnden=0)
FORMAT: swap cv_dst, cv_src

CONDITIONAL CONTEXT EXCHANGE TRANSFER INSTRUCTION (cnden=1)
FORMAT: swap_cnd cv_dst, cv_src, cndsw

| 31 30 29 28 27 26 | 25 24 23 | 22 21 20 | 19 18 17 16 15 14 13 12 11 10 9 8 | 7 | 6 | 5 4 3 2 1 0 |
|---|---|---|---|---|---|---|
| opcode | cv_dst | cv_src | 0 | cndsw | cnden | func swap |

| OPERAND NAME | DESCRIPTION |
|---|---|
| cv_dst | REGISTER NUMBER INDICATING EXCHANGE TRANSFER DESTINATION REGISTER (CV0 TO CV7) |
| cv_src | REGISTER NUMBER INDICATING EXCHANGE TRANSFER SOURCE REGISTER (CV0 TO CV7) |
| cnden | FLAG INDICATING WHETHER TO MAKE EXCHANGE AT TIME OF TRANSFER UNCONDITIONALLY OR CONDITIONALLY<br>  0: UNCONDITIONAL EXCHANGE TRANSFER<br>  1: CONDITIONAL EXCHANGE TRANSFER<br>    (EXCHANGE TRANSFER WHEN EXCHANGE INFORMATION BITS OF cndsw AND cv_src ARE DIFFERENT FROM EACH OTHER, AND TRANSFER WITHOUT EXCHANGE WHEN EXCHANGE INFORMATION BITS OF cndsw AND cv_src ARE EQUAL TO EACH OTHER) |
| cndsw | OBJECT FOR DETERMINING WHETHER EXCHANGE IS MADE AT TIME OF TRANSFER WHEN cnden = 1 |

FIG. 33

TRANSFER INSTRUCTION
FORMAT: mov cv_dst, cv_src

| 31 30 29 28 27 26 | 25 24 23 | 22 21 20 | 19 18 17 16 15 14 13 12 11 10 9 8 7 6 | 5 4 3 2 1 0 |
|---|---|---|---|---|
| opcode | cv_dst | cv_src | 0 | func mov |

| OPERAND NAME | DESCRIPTION |
|---|---|
| cv_dst | REGISTER NUMBER INDICATING EXCHANGE TRANSFER DESTINATION REGISTER (CV0 TO CV7) |
| cv_src | REGISTER NUMBER INDICATING EXCHANGE TRANSFER SOURCE REGISTER (CV0 TO CV7) |

FIG.44
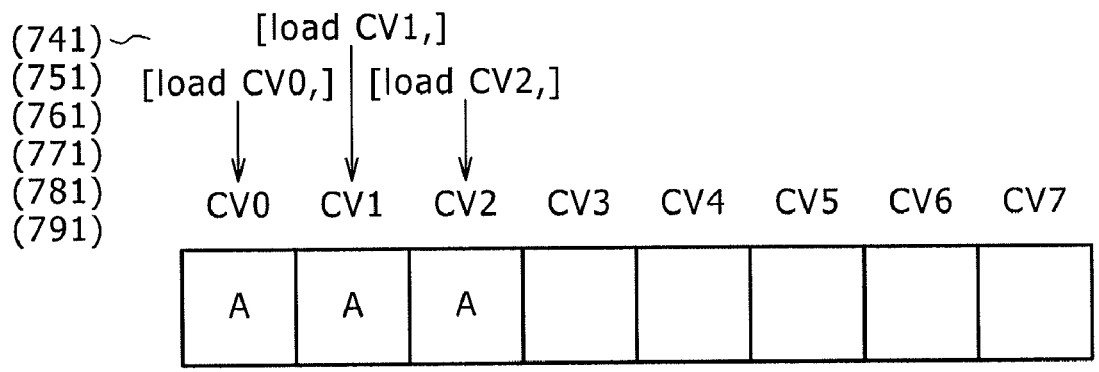
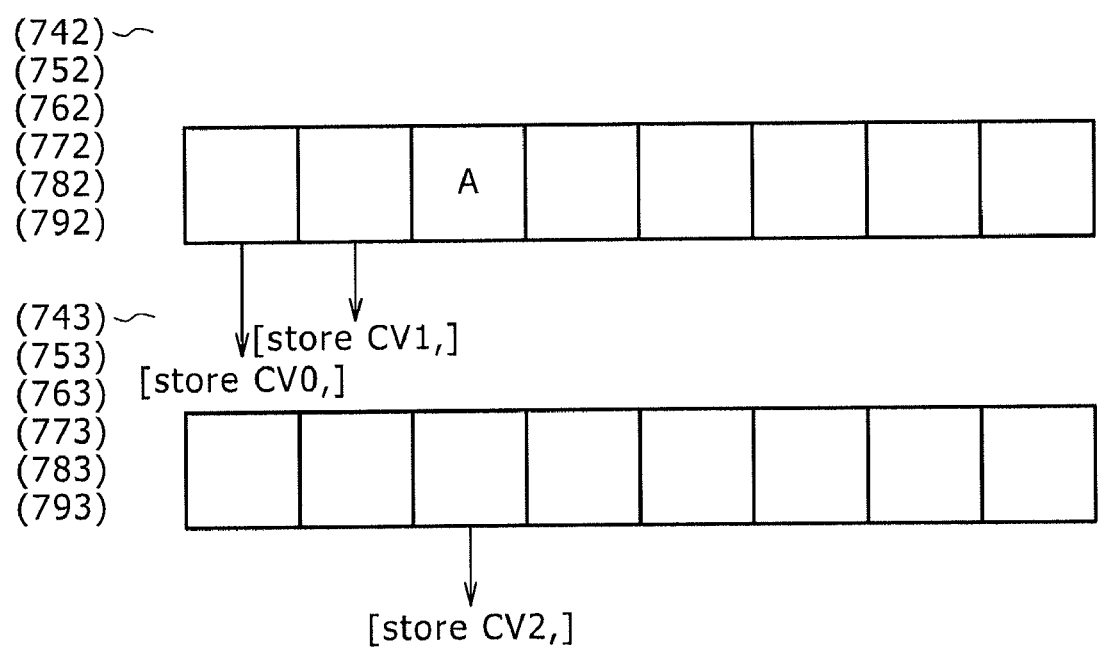

FIG.47

| CONTEXT INDEX (ctxIdx) | SE (SYNTAX ELEMENT) | NOTES |
|---|---|---|
| 0~2 | mb_type(SI slices only) | SI SLICES |
| 3~10 | mb_type(I slices only) | I SLICES |
| 11~13 | mb_skip_flag(P,SP slices only) | P AND SP SLICES |
| 14~20 | mb_type(P,SP slices only) | P AND SP SLICES |
| 21~23 | sub_mb_type(P,SP slices only) | P AND SP SLICES |
| 24~26 | mb_skip_flag(B slices only) | B SLICES |
| 27~35 | mb_type(B slices only) | B SLICES |
| 36~39 | sub_mb_type(B slices only) | B SLICES |
| 40~46 | mvd_l0[][][0],mvd_l1[][][0] | |
| 47~53 | mvd_l0[][][1],mvd_l1[][][1] | |
| 54~59 | ref_idx_l0,ref_idx_l1 | |
| 60~63 | mb_qp_delta | |
| 64~67 | intra_chroma_pred_mode | |
| 68 | prev_intra4x4_pred_mode_flag, prev_intra8x8_pred_mode_flag | |
| 69 | rem_intra4x4_pred_mode, rem_intra8x8_pred_mode | |
| 70~72 | mb_field_decoding_flag | |
| 73~84 | coded_block_pattern | |

FIG.48

| CONTEXT INDEX (ctxIdx) | SE (SYNTAX ELEMENT) | NOTES |
|---|---|---|
| 85~88 | coded_block_flag (ctxBlockCat=0) | BLOCK CATEGORY 0 |
| 89~92 | coded_block_flag (ctxBlockCat=1) | BLOCK CATEGORY 1 |
| 93~96 | coded_block_flag (ctxBlockCat=2) | BLOCK CATEGORY 2 |
| 97~100 | coded_block_flag (ctxBlockCat=3) | BLOCK CATEGORY 3 |
| 101~104 | coded_block_flag (ctxBlockCat=4) | BLOCK CATEGORY 4 |
| 105~119 | significant_coeff_flag (frame coded,ctxBlockCat=0) | FRAME CODING, BLOCK CATEGORY 0 |
| 120~133 | significant_coeff_flag (frame coded,ctxBlockCat=1) | FRAME CODING, BLOCK CATEGORY 1 |
| 134~148 | significant_coeff_flag (frame coded,ctxBlockCat=2) | FRAME CODING, BLOCK CATEGORY 2 |
| 149~151 | significant_coeff_flag (frame coded,ctxBlockCat=3) | FRAME CODING, BLOCK CATEGORY 3 |
| 152~165 | significant_coeff_flag (frame coded,ctxBlockCat=4) | FRAME CODING, BLOCK CATEGORY 4 |
| 166~180 | last_significant_coeff_flag (frame coded,ctxBlockCat=0) | FRAME CODING, BLOCK CATEGORY 0 |
| 181~194 | last_significant_coeff_flag (frame coded,ctxBlockCat=1) | FRAME CODING, BLOCK CATEGORY 1 |
| 195~209 | last_significant_coeff_flag (frame coded,ctxBlockCat=2) | FRAME CODING, BLOCK CATEGORY 2 |
| 210~212 | last_significant_coeff_flag (frame coded,ctxBlockCat=3) | FRAME CODING, BLOCK CATEGORY 3 |
| 213~226 | last_significant_coeff_flag (frame coded,ctxBlockCat=4) | FRAME CODING, BLOCK CATEGORY 4 |
| 227~236 | coeff_abs_level_minus1 (ctxBlockCat=0) | BLOCK CATEGORY 0 |
| 237~246 | coeff_abs_level_minus1 (ctxBlockCat=1) | BLOCK CATEGORY 1 |
| 247~256 | coeff_abs_level_minus1 (ctxBlockCat=2) | BLOCK CATEGORY 2 |
| 257~265 | coeff_abs_level_minus1 (ctxBlockCat=3) | BLOCK CATEGORY 3 |
| 266~275 | coeff_abs_level_minus1 (ctxBlockCat=4) | BLOCK CATEGORY 4 |
| 276 | end_of_slice_flag | SLICE END FLAG |

FIG.49

| CONTEXT INDEX (ctxIdx) | SE (SYNTAX ELEMENT) | NOTES |
|---|---|---|
| 277~291 | significant_coeff_flag (field coded, ctxBlockCat=0) | FIELD CODING, BLOCK CATEGORY 0 |
| 292~305 | significant_coeff_flag (field coded, ctxBlockCat=1) | FIELD CODING, BLOCK CATEGORY 1 |
| 306~320 | significant_coeff_flag (field coded, ctxBlockCat=2) | FIELD CODING, BLOCK CATEGORY 2 |
| 321~323 | significant_coeff_flag (field coded, ctxBlockCat=3) | FIELD CODING, BLOCK CATEGORY 3 |
| 324~337 | significant_coeff_flag (field coded, ctxBlockCat=4) | FIELD CODING, BLOCK CATEGORY 4 |
| 338~352 | last_significant_coeff_flag (field coded, ctxBlockCat=0) | FIELD CODING, BLOCK CATEGORY 0 |
| 353~366 | last_significant_coeff_flag (field coded, ctxBlockCat=1) | FIELD CODING, BLOCK CATEGORY 1 |
| 367~381 | last_significant_coeff_flag (field coded, ctxBlockCat=2) | FIELD CODING, BLOCK CATEGORY 2 |
| 382~384 | last_significant_coeff_flag (field coded, ctxBlockCat=3) | FIELD CODING, BLOCK CATEGORY 3 |
| 385~398 | last_significant_coeff_flag (field coded, ctxBlockCat=4) | FIELD CODING, BLOCK CATEGORY 4 |
| 399~401 | transform_size_8×8_flag | |
| 402~416 | significant_coeff_flag (frame coded, ctxBlockCat=5) | FRAME CODING, BLOCK CATEGORY 5 |
| 417~425 | last_significant_coeff_flag (frame coded, ctxBlockCat=5) | FRAME CODING, BLOCK CATEGORY 5 |
| 426~435 | coeff_abs_level_minus1 (ctxBlockCat=5) | BLOCK CATEGORY 5 |
| 436~450 | significant_coeff_flag (field coded, ctxBlockCat=5) | FIELD CODING, BLOCK CATEGORY 5 |
| 451~459 | last_significant_coeff_flag (field coded, ctxBlockCat=5) | FIELD CODING, BLOCK CATEGORY 5 |

US 7,884,743 B2

ARITHMETIC DECODING DEVICE

BACKGROUND OF THE INVENTION

1. Field of the Invention

The present invention relates to an arithmetic decoding system, and particularly to an arithmetic decoding device that decodes data coded by a context-adaptive binary arithmetic coding (CABAC) system.

2. Description of the Related Art

The context-adaptive binary arithmetic coding (CABAC) system is one of entropy coding systems in H.264 standardized at the ITU-T (International Telecommunication Union-Telecommunication standardization sector). In this CABAC, various kinds of multilevel data are binarized by being represented by symbols of "0" or "1" before coding. The binarized data is coded by a binary arithmetic coding process. The reverse of the process is performed at a time of decoding (decode).

The binary arithmetic coding process further converts the data represented by the symbols of "0" or "1" from {0, 1} to {LPS, MPS}, with a symbol estimated to have a higher probability of occurrence as a most probable symbol (MPS) and with a symbol other than the MPS as a least probable symbol (LPS). Then, the binary data represented by the two symbols of the LPS or the MPS is coded by arithmetic coding. Whether the MPS is "0" or "1" is predicted and determined for each symbol on the basis of processed data. That is, at a time of coding (encode), the MPS value of the symbol to be coded next is determined from only coded data, and at a time of decoding, the MPS value of the symbol to be decoded next is determined from only decoded data.

In addition, the binary arithmetic coding process is performed while a probability model suitable to a current state is sequentially selected from among a plurality of probability models (contexts) prepared in advance. In CABAC, context variables corresponding to respective contexts are stored in a context variable table, and a context variable context[ctxIdx] is identified by a context index (ctxIdx). There are a total of 460 context variables necessary for CABAC decoding of H.264. That is, the context index (ctxIdx) indicates a value of "0" to "459." Relation between each context variable and the context index is as shown in FIGS. 47 to 49.

Each context variable is formed by a value of seven bits composed of a probability state index pStateIdx of six bits indicating a probability of occurrence and valMPS of one bit indicating a most probable symbol (MPS) having a high probability of occurrence. pStateIdx indicates an estimated value of a probability of occurrence of an LPS in the context by a probability state of "0" to "63" defined in advance. valMPS indicates whether a symbol corresponding to the MPS is "0" or "1."

A CABAC decoder selects one context variable, and decodes one bin (one bit of binary data) on the basis of the context variable. The context variable is updated by the decoded bin. In the CABAC decoder, a decoding method is defined for each parameter for forming a macroblock. This parameter is referred to as a syntax element (SE). One syntax element is decoded by obtaining the multilevel data of the syntax element for a plurality of bins decoded using a plurality of context variables according to a multilevel conversion method determined for each syntax element.

When one bin is decoded, a bin whose context index is determined by the value of an immediately preceding decoded bin is often present at the head or an intermediate position of each syntax element in ascending order of the context index. The length of bins of each syntax element is often undetermined until an immediately preceding bin is decoded. Thus, also when the decoding of one syntax element is ended and another syntax element is decoded, the context index is undetermined until an immediately preceding bin is decoded. Further, in decoding one syntax element, the context variable of a same context index may be used consecutively, or the context variable of a different context index may be used each time.

For example, FIG. 50 is a diagram showing a flow of decoding of "mb_type" when a slice type is a B slice. There is a process of determining whether a first context index starts at "27," "28," or "29," and thereafter a branch to take changes depending on an immediately preceding decoding result. A label of "0" or "1" indicates a bin as an immediately preceding decoding result, and the process of each branch is performed according to the label. A process without a branch label is performed irrespective of an immediately preceding bin. A number in a circle is a context index.

In addition, the number of context variables assigned to each syntax element is various. The context indexes of context variables of a same syntax element are close values, and are arranged in ascending order starting with a context index used first. However, syntax elements whose context indexes are close values are not necessarily arranged in order in which the syntax elements are decoded.

Consideration will be given to a case where context variables are managed as a sequence arranged in order of the context indexes in memory, read from a processor, and processed. When a plurality of context variables are accessed in bloc in a unit of 32 bits or the like, and are assigned to a same syntax element, the context variables are arranged close to each other, so that the number of times of memory access is reduced and a relatively high efficiency is obtained. When the context variables of a plurality of syntax elements are accessed simultaneously in a large unit such as 128 bits to further reduce the number of times of access, another syntax element taken in simultaneously is not necessarily decoded immediately, so that efficiency is degraded.

Suppose that in order to reduce an occupied amount of memory, context variables are arranged in units of eight bits without a gap in order of the context indexes. Because the largest number of context variables of a syntax element is 15, one syntax element can be contained with 128 bits (8 bits× 15=120 bits). On the other hand, when syntax elements are arranged astride an alignment boundary of 128-bit units, one time of memory access in a unit of 128 bits does not suffice for a same syntax element.

For more efficient operation of the CABAC decoder, a short latency of access to context variables is desirable, and changes in access latency due to factors other than a CABAC decoding process make it difficult to ensure decoding process speed performance and are thus undesirable. It is therefore ideal to store context variables in a dedicated storage area. However, it is not practical to implement all the dedicated storage area as a flip-flop register in order to store 460 context variables because of too large a circuit scale. Thus the dedicated storage area is implemented by a SRAM (Static Random Access Memory) or the like. When a SRAM is used, the latency of access to context variables is increased, and therefore CABAC decoding process speed is lowered. As a technique for solving this, a moving image processing device has been proposed which processes a syntax element with a high frequency of occurrence using context variables retained in a memory with a small access latency, for example (see Japanese Patent Laid-Open No. 2007-300517 (FIG. 1), for example).

SUMMARY OF THE INVENTION

According to the above-described technique in related art, a memory with a small access latency can be used when a syntax element with a high frequency of occurrence is processed, and therefore processing speed can be increased.

However, the above-described technique in related art assumes "coeff_abs_level_minus1," which is a syntax element with a high frequency of occurrence, as a syntax element to be temporarily stored at a storage location with a short access latency, and is therefore not necessarily sufficient to increase the speed of the entire decoding process.

The present invention has been made in view of such a situation, and it is desirable to provide an arithmetic decoding device having a register configuration conforming to a mode of processing of syntax elements for a context-adaptive binary arithmetic decoding process.

According to a first embodiment of the present invention, there is provided an arithmetic decoding device including: an arithmetic decoding unit configured to decode coded data resulting from arithmetic coding on a basis of a context variable indicating a probability state and a most probable symbol; a plurality of arithmetic registers configured to supply the context variable to the arithmetic decoding unit and retain a result of operation by the arithmetic decoding unit; and a plurality of save registers configured to save contents retained in the arithmetic registers. This provides an effect of supplying context variables from the plurality of arithmetic registers to the arithmetic decoding unit, performing decoding, and saving the contents retained in the arithmetic registers to the plurality of save registers according to the progress of the decoding process.

In addition, in the first embodiment, the plurality of save registers may save only context variables relating to predetermined syntax elements among the context variables. This provides an effect of the saved context variables not being stored in memory and the contents of the saved context variables being retained until used next. For example, context variables relating to the syntax elements of a first to a fourth context group in an embodiment to be described later are stored in save registers, whereby access to a memory is avoided.

In addition, in this case, the predetermined syntax elements may be classified into a plurality of groups, and each of the plurality of save registers may save context variables in correspondence with the classified groups. This provides an effect of saving context variables for each group. In the case of the first to fourth context groups in the embodiment to be described later, context variables are saved for each context group.

For example, the plurality of groups may include a group of syntax elements related to macroblocks, a group of syntax elements related to motion vector information, a group of syntax elements related to pixel prediction, and a group of syntax elements related to block information.

More specifically, the group of syntax elements related to the macroblocks may include "mb_type," "mb_skip_flag," and "sub_mb_type," the group of syntax elements related to the motion vector information may include "mvd_l0[ ][ ][0]," "mvd_l1[ ][ ][0]," "mvd_l0[ ][ ][1]," and "mvd_l1[ ][ ][1]," the group of syntax elements related to the pixel prediction may include "ref_idx_l0," "ref_idx_l1," "mb_qp_delta," "intra_chroma_pred_mode," "prev_intra4×4_pred_mode_flag," "prev_intra8×8_pred_mode_flag," "rem_intra4×4_pred_mode," and "rem_intra8×8_pred_mode," and the group of syntax elements related to the block information may include "mb_field_decoding_flag," "coded_block_pattern," and "transform_size_8×8_flag." In addition, when a slice type of a decoding object is I or SI, "transform_size_8×8_flag" may be included and managed in the group of syntax elements related to the pixel prediction.

In addition, in the first embodiment, each of the plurality of arithmetic registers and the plurality of save registers may be a register of a 128-bit width and store 16 context variables with one context variable of 7 bits assigned to each unit of 8 bits, and one or two context variables may be stored with 16 bits obtained by collecting one surplus bit of each unit of 8 bits as a surplus register. This provides an effect in that while context variables are assigned so as to be aligned in each unit of 8 bits, a context variable is further assigned to surplus areas.

In addition, in this case, the arithmetic decoding device may further include an exchange transfer processing block configured to set one of the plurality of arithmetic registers and the plurality of save registers as a transfer source register, exchange 7 bits of two of the 16 context variables stored in the transfer source register, exchange a value of 14 bits of two other context variables and a value of 14 bits of the surplus register, and perform a transfer with one of the plurality of arithmetic registers and the plurality of save registers as a transfer destination register. This provides an effect in that context variables assigned to surplus areas are exchange-transferred to areas aligned in each unit of 8 bits and used.

In addition, in this case, exchange state information indicating that the exchange has been made may be assigned to the surplus register, and when a value of one specified bit and the exchange state information are equal to each other, the exchange transfer processing block may transfer contents stored in the transfer source register to the transfer destination register without making the exchange, and when the value of the one specified bit and the exchange state information are different from each other, the exchange transfer processing block may transfer the contents stored in the transfer source register to the transfer destination register after making the exchange and inverting the exchange state information. This provides an effect of making a change as to whether to perform an exchange transfer according to the exchange state information.

In addition, in this case, the arithmetic decoding device may further include: a transfer buffer configured to retain contents stored in one of the plurality of arithmetic registers and the plurality of save registers; and a context variable initial value generating block configured to generate an initial value of a specified context variable of context variables retained in the transfer buffer; wherein the transfer buffer may transfer the contents stored in the transfer buffer to the transfer destination register after changing the contents stored in the transfer buffer by the initial value generated by the context variable initial value generating block. This provides an effect of setting an initial value in an arithmetic register or a save register.

According to the present invention, it is possible to produce an excellent effect of being able to provide an arithmetic decoding device having a register configuration conforming to a mode of processing of syntax elements for a context-adaptive binary arithmetic decoding process.

BRIEF DESCRIPTION OF THE DRAWINGS

FIG. 3 is a diagram showing an example of context groups of syntax elements in the embodiment of the present invention;

FIGS. 4A, 4B, 4C, and 4D are diagrams showing an example of assignment of context variables of a macroblock type context group in the embodiment of the present invention;

FIG. 5 is a diagram showing an example of assignment of context variables of an MVD context group in the embodiment of the present invention;

FIG. 6 is a diagram showing an example of assignment of context variables of a prediction context group in the embodiment of the present invention;

FIG. 7 is a diagram showing an example of assignment of context variables of a block information context group in the embodiment of the present invention;

FIGS. 8A, 8B, and 8C are diagrams showing an example of assignment of context variables of Block Category 0 of a residual context group in the embodiment of the present invention;

FIGS. 9A, 9B, and 9C are diagrams showing an example of assignment of context variables of Block Category 1 of the residual context group in the embodiment of the present invention;

FIGS. 10A, 10B, and 10C are diagrams showing an example of assignment of context variables of Block Category 2 of the residual context group in the embodiment of the present invention;

FIGS. 12A, 12B, and 12C are diagrams showing an example of assignment of context variables of Block Category 4 of the residual context group in the embodiment of the present invention;

FIGS. 13A, 13B, and 13C are diagrams showing an example of assignment of context variables of Block Category 5 of the residual context group in the embodiment of the present invention;

FIGS. 14A and 14B are diagrams showing an example of relation between each register of the register file in the embodiment of the present invention and context variables;

FIG. 31 is a diagram showing an example of the format of a context initialization instruction of a CABAC decoding arithmetic unit in the embodiment of the present invention;

FIG. 32 is a diagram showing an example of the format of a context exchange transfer instruction of the CABAC decoding arithmetic unit in the embodiment of the present invention;

FIG. 33 is a diagram showing an example of the format of a transfer instruction of the CABAC decoding arithmetic unit in the embodiment of the present invention;

FIG. 44 is a diagram showing a mode of transfer between registers according to the process procedures of FIGS. 38 to 43;

FIG. 47 is a first diagram showing relation between context variables necessary for CABAC decoding of H.264 and context indexes;

FIG. 48 is a second diagram showing relation between context variables necessary for CABAC decoding of H.264 and context indexes;

FIG. 49 is a third diagram showing relation between context variables necessary for CABAC decoding of H.264 and context indexes.

DETAILED DESCRIPTION OF THE PREFERRED EMBODIMENTS

Preferred embodiments of the present invention will next be described in detail with reference to the drawings.

Figure 1:
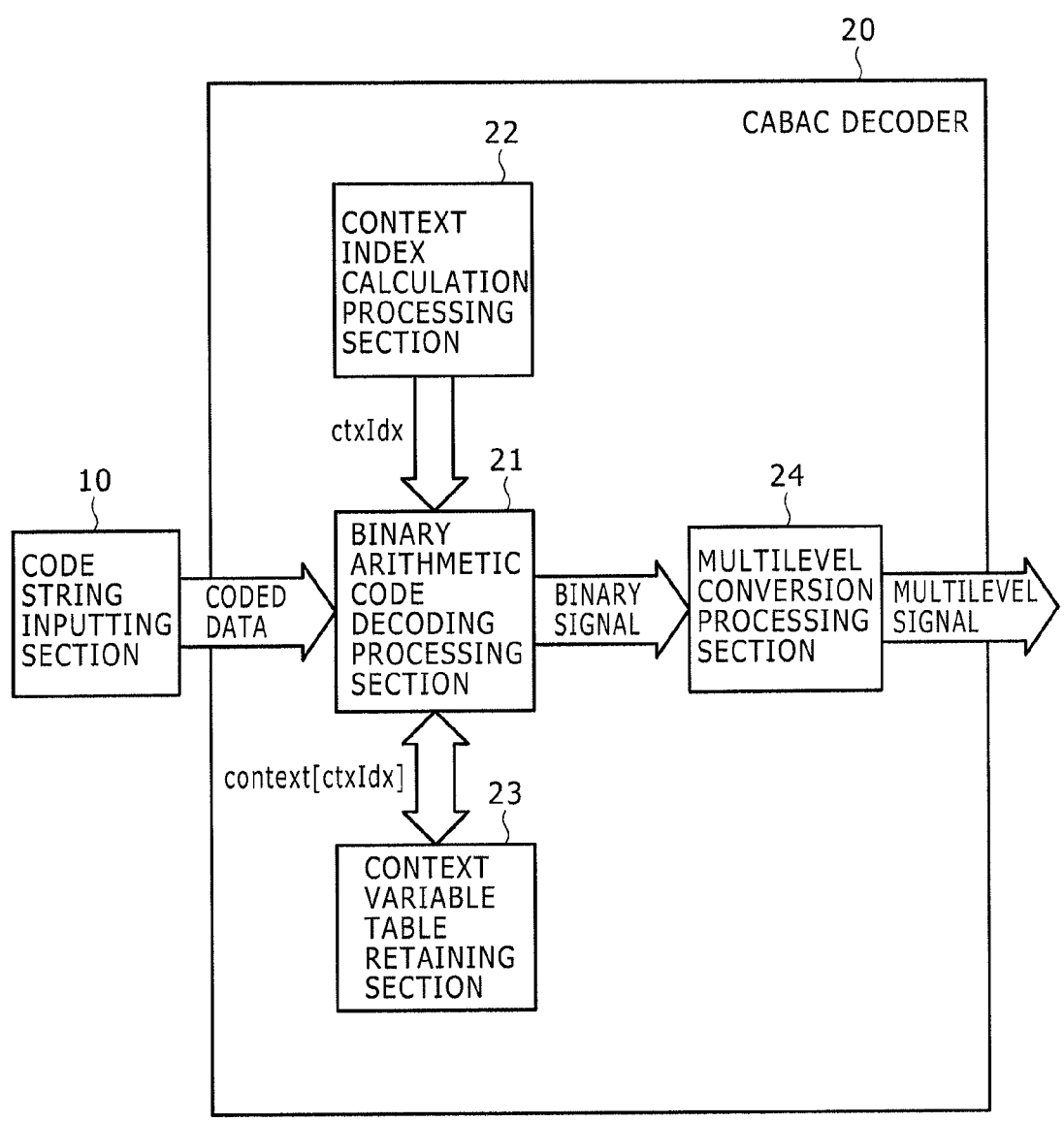
FIG. 1 is a diagram showing an example of configuration of a CABAC decoder as an example of an arithmetic decoding device according to an embodiment of the present invention.

FIG. 1 is a diagram showing an example of configuration of a CABAC decoder 20 as an example of an arithmetic decoding device according to an embodiment of the present invention. The CABAC decoder 20 receives coded data from a code string inputting section 10, decodes the coded data into a binary signal, and then converts the binary signal into a multilevel signal by multilevel conversion. The CABAC decoder 20 includes a binary arithmetic code decoding processing section 21, a context index calculation processing section 22, a context variable table retaining section 23, and a multilevel conversion processing section 24.

The context index calculation processing section 22 calculates a context index (ctxIdx), and then supplies the calculated ctxIdx to the binary arithmetic code decoding processing section 21.

The context variable table retaining section 23 retains context variables corresponding to each context as a context variable table. Each context variable is composed of a probability state index pStateIdx indicating a probability of occurrence and valMPS indicating a most probable symbol (MPS) having a high probability of occurrence. The context variables retained in the context variable table retaining section 23 are identified by ctxIdx, and represented as context[ctxIdx].

The binary arithmetic code decoding processing section 21 decodes coded data input from the code string inputting section 10 into a binary signal. When decoding one symbol, the binary arithmetic code decoding processing section 21 receives ctxIdx from the context index calculation processing section 22, and obtains a context variable context[ctxIdx] from the context variable table retaining section 23 on the basis of the ctxIdx. The binary arithmetic code decoding processing section 21 decodes the symbol on the basis of the context variable, and outputs the binary signal to the multilevel conversion processing section 24.

The multilevel conversion processing section 24 converts the binary signal output from the binary arithmetic code decoding processing section 21 into an original multilevel signal by multilevel conversion. In binary arithmetic coding, conversion from a multilevel signal to a binary signal is performed according to a syntax element (SE). The multilevel conversion processing section 24 performs a process of restoring such a binary signal to the original multilevel signal. The syntax element is information specified to be transmitted in syntax in H.264.

Figure 2:
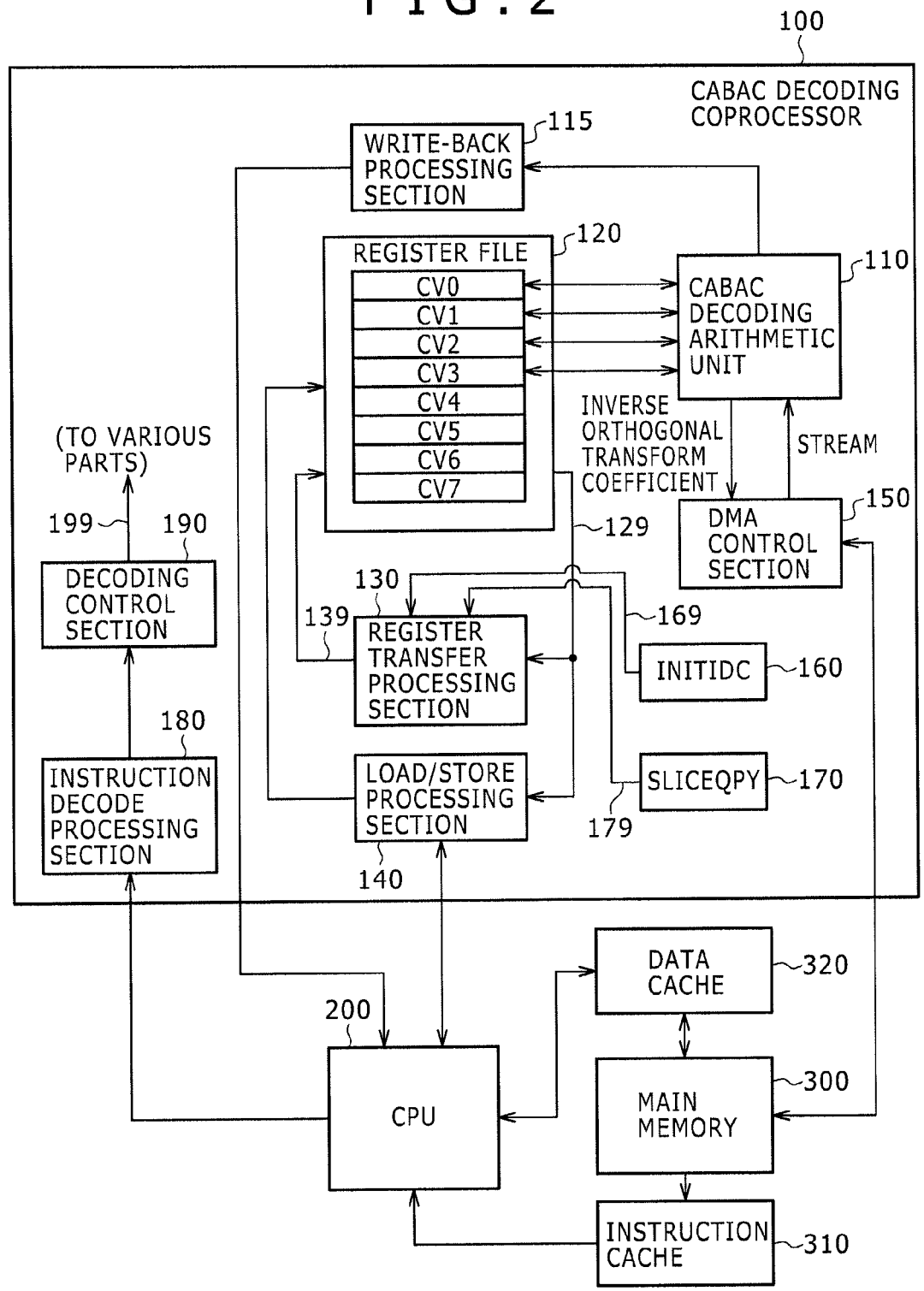
FIG. 2 is a diagram showing an example of configuration in a case where the arithmetic decoding device according to the embodiment of the present invention is implemented as a CABAC decoding coprocessor.

FIG. 2 is a diagram showing an example of configuration in a case where the arithmetic decoding device according to the embodiment of the present invention is implemented as a CABAC decoding coprocessor 100. The CABAC decoding coprocessor 100 operates as a coprocessor connected to a CPU (Central Processing Unit) 200. That is, the CABAC decoding coprocessor 100 performs a process according to an instruction issued from the CPU 200. The CPU 200 uses a main memory 300 as a work area of the CPU 200. An instruction cache 310 for retaining an instruction and a data cache 320 for retaining data are connected between the main memory 300 and the CPU 200.

The CABAC decoding coprocessor 100 includes a CABAC decoding arithmetic unit 110, a write-back processing section 115, a register file 120, a register transfer processing section 130, a load/store processing section 140, a DMA control section 150, an INITIDC control register 160, a SLICEQPY control register 170, an instruction decode processing section 180, and a decoding control section 190.

The CABAC decoding arithmetic unit 110 performs a process for decoding data coded by the CABAC coding system. The CABAC decoding arithmetic unit 110 performs a process necessary for decoding according to an instruction from the decoding control section 190. The write-back processing section 115 writes a result of the process by the CABAC decoding arithmetic unit 110 to the register (not shown) of the CPU 200. Incidentally, the CABAC decoding arithmetic unit 110 is an example of an arithmetic decoding unit described in claims.

The register file 120 is a register for retaining context variables. The register file 120 has eight registers of a 128-bit width. These eight registers will be designated as CV0 to CV7. Four (CV0 to CV3) of the eight registers are arithmetic registers directly connected to the CABAC decoding arithmetic unit 110. The four registers CV0 to CV3 supply context variables to the CABAC decoding arithmetic unit 110, and retain a result of operation by the CABAC decoding arithmetic unit 110. The other four registers (CV4 to CV7) are save registers for saving contents retained by the arithmetic registers. As regards the context variables of specific syntax elements, the use of the save registers enables the contents retained by the arithmetic registers to be managed in the register file 120 without being stored in the main memory 300 or the like. Incidentally, the register file 120 is an example of arithmetic registers and save registers described in claims.

The register transfer processing section 130 performs a process for transfer between registers in the register file 120. The register transfer processing section 130 has a function of exchanging a part of bits, as later described, at a time of transfer between registers. The register transfer processing section 130 also has a function of setting an internally generated initial value in a register, as later described.

The load/store processing section 140 performs a load process from the main memory 300 to the register file 120 or a store process from the register file 120 to the main memory 300. Incidentally, the main memory 300 is accessed via the CPU 200 and the data cache 320, and a process may be performed on the data cache 320 without the main memory 300 being accessed.

The DMA control section 150 performs DMA (Direct Memory Access) control between the CABAC decoding arithmetic unit 110 and the main memory 300. The DMA control section 150 performs a stream inputting process that supplies a stream read from the main memory 300 to the CABAC decoding arithmetic unit 110 and a coefficient outputting process that writes an inverse orthogonal transform coefficient decoded by the CABAC decoding arithmetic unit 110 to the main memory 300.

The INITIDC control register 160 and the SLICEQPY control register 170 are a control register for generating the initial value of a context variable. The INITIDC control register 160 retains an index cabac_init_idc for determining an initialization table or a slice type. The SLICEQPY control register 170 retains a slice quantization parameter Y (SliceQP$_Y$). Incidentally, INITIDC and SLICEQPY are not a value changed for each context variable, and are thus supplied by the control register rather than as an operand of an instruction.

The instruction decode processing section 180 is a decoder that decodes a coprocessor instruction issued from the CPU 200 to the CABAC decoding coprocessor 100 (instruction decode). The instruction decode result is supplied to the decoding control section 190.

The decoding control section 190 controls various parts according to the instruction decode result supplied from the instruction decode processing section 180. The output of the decoding control section 190 is supplied to the various parts via a signal line 199.

The CABAC decoding coprocessor 100 is connected to the CPU 200. The CPU 200 is connected with the data cache 320 and the instruction cache 310. Data in the main memory 300 is read out to the CPU 200 via one of the caches, and data expelled from the data cache 320 is written into the main memory 300. A case where the main memory 300 is connected via a secondary cache, for example, is also assumed. A program in the main memory 300 is read out to the CPU 200 via the instruction cache 310, and is also supplied to the CABAC decoding coprocessor 100. Though not shown in FIG. 2, the CPU 200 also has a register file and a load/store processing section, and performs load/store processing. Because the data cache 320 is shared by the CPU 200 and the CABAC decoding coprocessor 100, a mechanism for performing arbitration to prevent contention for cache access between the CPU 200 and the CABAC decoding coprocessor 100 is provided within the CPU 200. The load/store processing section 140 of the CABAC decoding coprocessor 100 is connected to the data cache 320 via the CPU 200.

Each processing section waits until a new process is accepted when a connected processing section is in the middle of processing and does not accept the new process in a next cycle. For example, the CPU 200 outputs an instruction only when the instruction decode processing section 180 can receive an instruction, or continues outputting the same instruction until the instruction is received. The instruction decode processing section 180 generates a control signal for the decoding control section 190 when the decoding control section 190 can control a new process in a next cycle. When each processing section can perform new control in a next cycle, the decoding control section 190 instructs each processing section to perform the control to execute an instruction.

FIG. 3 is a diagram showing an example of context groups of syntax elements in the embodiment of the present invention. In the embodiment of the present invention, context variables are grouped into five context groups with consideration given to the limitation of context variables used for each slice type and with consideration given to order in which syntax elements are decoded.

The first context group is a macroblock (MB) type context group. This macroblock type context group is a group of syntax elements relating to macroblocks, and is further classified into three groups according to the slice types of slices within macroblocks. However, only one corresponding classification is used in one slice.

In the macroblock type context group, "mb_type (SI slices only)" and "mb_type (I slices only)" are classified as syntax elements for I slices. "mb_type" is a syntax element indicating a macroblock type.

In the macroblock type context group, "mb_skip_flag (P and SP slices only)," "mb_type (P and SP slices only)," and "sub_mb_type (P and SP slices only)" are classified as syntax elements for P slices. "mb_skip_flag" is a syntax element indicating a macroblock skip flag. "sub_mb_type" is a syntax element indicating a sub-macroblock type.

In the macroblock type context group, "mb_skip_flag (B slices only)," "mb_type (B slices only)," and "sub_mb_type (B slices only)" are classified as syntax elements for B slices.

The second context group is an MVD (Motion Vector Difference) context group. This MVD context group is a group of syntax elements relating to motion vector information. "mvd_l0[ ][ ][0]," "mvd_l1[ ][ ][0]," "mvd_l0[ ][ ][1]," and "mvd_l1[ ][ ][1]" are classified into the MVD context group. These are syntax elements indicating motion vector information in a horizontal direction and a vertical direction.

The third context group is a prediction context group. This prediction context group is a group of syntax elements relating to pixel prediction. "ref_idx_l0," "ref_idx_l1," "mb_qp_delta," "intra_chroma_pred_mode," "prev_intra4×4_pred_mode_flag," "prev_intra8×8_pred_mode_flag," "rem_intra4×4_pred_mode," and "rem_intra8×8_pred_mode" are classified into the prediction context group. "ref_idx_l0" and "ref_idx_l1" are a syntax element indicating a reference index. "mb_qp_delta" is a syntax element indicating a macroblock quantization parameter. "intra_chroma_pred_mode" is a syntax element indicating an intra-screen color-difference prediction mode. "prev_intra4×4_pred_mode_flag" and "prev_intra8×8_pred_mode_flag" are a syntax element indicating an intra-screen luminance prediction mode flag. "rem_intra4×4_pred_mode" and "rem_intra8×8_pred_mode" are a syntax element indicating an intra-screen luminance prediction mode.

The fourth context group is a block information context group. The block information context group is a group of syntax elements relating to block information such as a block coding system and the like. "mb_field_decoding_flag," "coded_block_pattern," and "transform_size_8×8_flag" are classified into the block information context group. "mb_field_decoding_flag" is a syntax element indicating a macroblock field decoding flag. "coded_block_pattern" is a syntax element indicating a coded block pattern. "transform_size_8×8_flag" is a syntax element indicating an orthogonal transform size 8×8 flag.

The fifth context group is a residual context group. "coded_block_flag," "significant_coeff_flag," "last_significant_coeff_flag," and "coeff_abs_level_minus1" are classified into the residual context group. "coded_block_flag" is a syntax element indicating a coded block size. "significant_coeff_flag" is a syntax element indicating a significant coefficient flag. "last_significant_coeff_flag" is a syntax element indicating a last significant coefficient flag. "coeff_abs_level_minus1" is a syntax element indicating coefficient absolute value information.

As will be described later, the syntax elements of the first to fourth context groups are decoded in the first half of a decoding process, and the syntax elements of the fifth context group are decoded in the second half of the decoding process. That is, a context variable being used changes according to the progress of the decoding process. Description in the following will be made of relation between the context variables of the syntax elements of these context groups and the registers of the register file 120.

FIGS. 4A, 4B, 4C, and 4D are diagrams showing an example of assignment of context variables of the macroblock type context group in the embodiment of the present invention. "cidx" denotes a relative context index from a head in this assignment example. "ctxIdx" denotes a context index defined in H.264. The same is true for subsequent figures.

FIG. 4A shows an example of assignment of context variables for I slices. In this case, three context variables from the head of a register are assigned to "mb_type (SI slices only)," and the following eight context variables are assigned to "mb_type (I slices only)."

FIG. 4B shows another example of assignment of context variables for I slices. In this case, as in FIG. 4A, three context variables from the head of a register are assigned to "mb_type (SI slices only)," and the following eight context variables are assigned to "mb_type (I slices only)." In this example, three more context variables are assigned to "transform_size_8×8_flag" of the block information context group.

FIG. 4C shows an example of assignment of context variables for P slices. In this case, three context variables from the head of a register are assigned to "mb_skip_flag (P and SP slices only)," the following seven context variables are assigned to "mb_type (P and SP slices only)," and the following three context variables are assigned to "sub_mb_type (P and SP slices only)."

FIG. 4D shows an example of assignment of context variables for B slices. In this case, three context variables from the head of a register are assigned to "mb_skip_flag (B slices only)," the following nine context variables are assigned to "mb_type (B slices only)," and the following four context variables are assigned to "sub_mb_type (B slices only)."

Of these figures, FIG. 4D includes the most context variables. FIG. 4D includes 16 context variables, and even when a context variable is assigned to each unit of 8 bits, 8 bits×16=128 bits suffices and can be retained in one register of the 128-bit width of the register file 120.

FIG. 5 is a diagram showing an example of assignment of context variables of the MVD context group in the embodiment of the present invention. In this case, seven context variables from the head of a register are assigned to "mvd_l0[ ][ ][0]" and "mvd_l1[ ][ ][0]," and the following seven context variables are assigned to "mvd_l0[ ][ ][1]" and "mvd_l1[ ][ ][1]." FIG. 5 includes 14 context variables, and even when a context variable is assigned to each unit of 8 bits, 8 bits×14=112 bits suffices and can be retained in one register of the 128-bit width of the register file 120.

FIG. 6 is a diagram showing an example of assignment of context variables of the prediction context group in the embodiment of the present invention. In this case, six context variables from the head of a register are assigned to "ref_idx_l0" and "ref_idx_l1," the following four context variables are assigned to "mb_qp_delta," the following four context variables are assigned to "intra_chroma_pred_mode," the following one context variable is assigned to "prev_intra4×4_pred_mode_flag" and "prev_intra8×8_pred_mode_flag," and the following one context variable is assigned to "rem_intra4×4_pred_mode" and "rem_intra8×8_pred_mode." FIG. 6 includes 16 context variables, and even when a context variable is assigned to each unit of 8 bits, 8 bits×16=128 bits suffices and can be retained in one register of the 128-bit width of the register file 120.

FIG. 7 is a diagram showing an example of assignment of context variables of the block information context group in the embodiment of the present invention. In this case, 12 context variables from the head of a register are assigned to "coded_block_pattern," and the following three context variables are assigned to "mb_field_decoding_flag." "transform_size_8×8_flag" requiring three context variables is classified as a syntax element of the block information context group. When the three context variables are added, 18 context variables are included. When a context variable is assigned to each unit of 8 bits, 8 bits×18=144 bits is required and therefore cannot be retained in one register of the 128-bit width of the register file 120.

However, the three context variables of "transform_size_8×8_flag" are not used in a main profile (MP). Therefore a CABAC decoder limited to streams of the main profile can retain the context variables in one register. On the other hand, in order to handle streams of a high profile (HP), the 18 context variables are operated on one register by using an exchange transfer function to be described later.

Thus, for the syntax elements of the first to fourth context groups decoded in the first half, one register can be assigned to each context group. It is therefore understood that all necessary context variables can be saved to four save registers in a stage where the process in the first half is completed. Thereby the context variables of the first to fourth context groups do not need to be stored in the main memory 300 or loaded from the main memory 300.

FIGS. 8A to 13C are diagrams showing an example of assignment of context variables of the residual context group in the embodiment of the present invention. In this case, syntax elements are classified into six types according to block categories (ctxBlockCat) defined in H.264.

FIGS. 8A, 8B, and 8C are diagrams showing an example of assignment of context variables of Block Category 0 of the residual context group in the embodiment of the present invention. In this Block Category 0, first, as context variables common to frame coded blocks and field coded blocks, 10 context variables from the head of a register are assigned to "coeff_abs_level_minus1," and a 13th to a 16th context variable (cidx=12 to 15) are assigned to "coded_block_flag." In addition, as context variables for frame coded blocks, 15 context variables from the head of one register are assigned to "significant_coeff_flag," and 15 context variables from the head of another register are assigned to "last_significant_coeff_flag." On the other hand, as context variables for field coded blocks, 15 context variables from the head of one register are assigned to "significant_coeff_flag," and 15 context variables from the head of another register are assigned to "last_significant_coeff_flag."

FIGS. 9A, 9B, and 9C are diagrams showing an example of assignment of context variables of Block Category 1 of the residual context group in the embodiment of the present invention. In this Block Category 1, first, as context variables common to frame coded blocks and field coded blocks, 10 context variables from the head of a register are assigned to "coeff_abs_level_minus1," and a 13th to a 16th context variable (cidx=12 to 15) are assigned to "coded_block_flag." In addition, as context variables for frame coded blocks, 14 context variables from the head of one register are assigned to "significant_coeff_flag," and 14 context variables from the head of another register are assigned to "last_significant_coeff_flag." On the other hand, as context variables for field coded blocks, 14 context variables from the head of one register are assigned to "significant_coeff_flag," and 14 context variables from the head of another register are assigned to "last_significant_coeff_flag."

FIGS. 10A, 10B, and 10C are diagrams showing an example of assignment of context variables of Block Category 2 of the residual context group in the embodiment of the present invention. In this Block Category 2, first, as context variables common to frame coded blocks and field coded blocks, 10 context variables from the head of a register are assigned to "coeff_abs_level_minus1," and a 13th to a 16th context variable (cidx=12 to 15) are assigned to "coded_block_flag." In addition, as context variables for frame coded blocks, 15 context variables from the head of one register are assigned to "significant_coeff_flag," and 15 context variables from the head of another register are assigned to "last_significant_coeff_flag." On the other hand, as context variables for field coded blocks, 15 context variables from the head of one register are assigned to "significant_coeff_flag," and 15 context variables from the head of another register are assigned to "last_significant_coeff_flag."

Figure 11A:
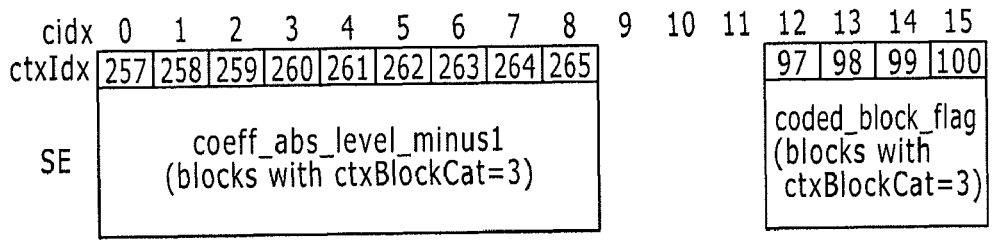
FIGS. 11A, 11B, and 11C are diagrams showing an example of assignment of context variables of Block Category 3 of the residual context group in the embodiment of the present invention.
Figure 11B:
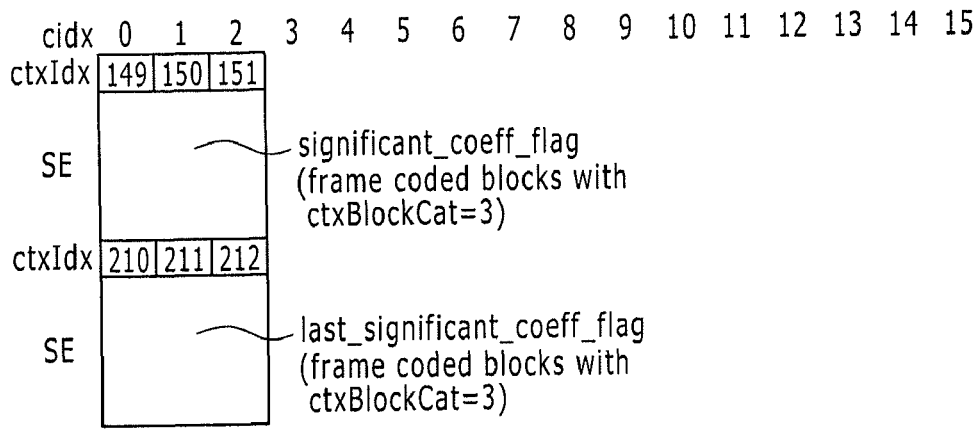
Figure 11C:
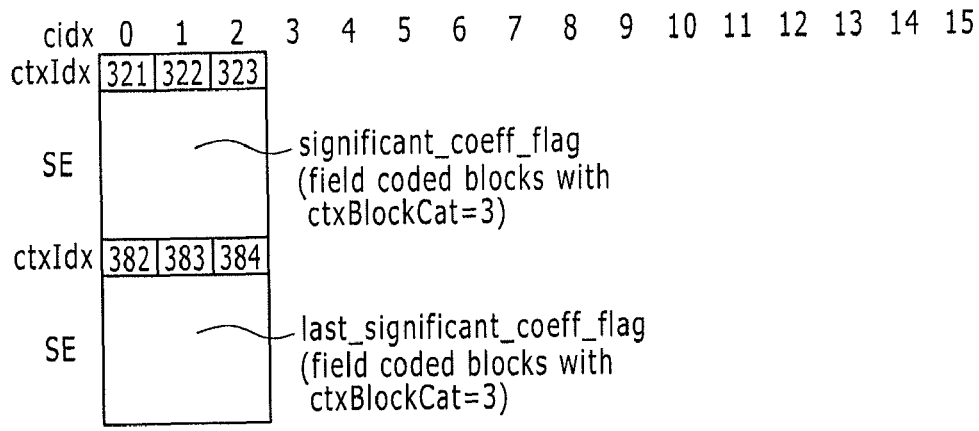

FIGS. 11A, 11B, and 11C are diagrams showing an example of assignment of context variables of Block Category 3 of the residual context group in the embodiment of the present invention. In this Block Category 3, first, as context variables common to frame coded blocks and field coded blocks, 9 context variables from the head of a register are assigned to "coeff_abs_level_minus1," and a 13th to a 16th context variable (cidx=12 to 15) are assigned to "coded_block_flag." In addition, as context variables for frame coded blocks, three context variables from the head of one register are assigned to "significant_coeff_flag," and three context variables from the head of another register are assigned to "last_significant_coeff_flag." On the other hand, as context variables for field coded blocks, three context variables from the head of one register are assigned to "significant_coeff_flag," and three context variables from the head of another register are assigned to "last_significant_coeff_flag."

FIGS. 12A, 12B, and 12C are diagrams showing an example of assignment of context variables of Block Category 4 of the residual context group in the embodiment of the present invention. In this Block Category 4, first, as context variables common to frame coded blocks and field coded blocks, 10 context variables from the head of a register are assigned to "coeff_abs_level_minus1," and a 13th to a 16th context variable (cidx=12 to 15) are assigned to "coded_block_flag." In addition, as context variables for frame coded blocks, 14 context variables from the head of one register are assigned to "significant_coeff_flag," and 14 context variables from the head of another register are assigned to "last_significant_coeff_flag." On the other hand, as context variables for field coded blocks, 14 context variables from the head of one register are assigned to "significant_coeff_flag," and 14 context variables from the head of another register are assigned to "last_significant_coeff_flag."

FIGS. 13A, 13B, and 13C are diagrams showing an example of assignment of context variables of Block Category 5 of the residual context group in the embodiment of the present invention. In this Block Category 5, first, as context variables common to frame coded blocks and field coded blocks, 10 context variables from the head of a register are assigned to "coeff_abs_level_minus1." Incidentally, there is no "coded_block_flag" in Block Category 5. In addition, as context variables for frame coded blocks, 15 context variables from the head of one register are assigned to "significant_coeff_flag," and 9 context variables from the head of another register are assigned to "last_significant_coeff_flag." On the other hand, as context variables for field coded blocks, 15 context variables from the head of one register are assigned to "significant_coeff_flag," and 9 context variables from the head of another register are assigned to "last_significant_coeff_flag."

Thus, the syntax elements of the fifth context group decoded in the second half are classified into six types according to the block categories. Thereby, three registers can be assigned to each Block Category.

As is understood from FIGS. 47 to 49, the syntax elements of the residual context group account for about 80 percent of the 460 context variables. Implementing a register file of such a size as to put all of these context variables in a register by a flip-flop is not very different from putting all of the 460 context variables in terms of circuit scale. It is therefore natural to consider storing the context variables of the residual context group in the main memory 300 as a SRAM. A macroblock is a block of 16×16 pixels, and is further divided into four parts to be decoded in each sub-macroblock of 8×8 pixels. Inverse orthogonal transform coefficients of Luma (luminance component Y) and chroma (color saturation components Cr and Cb) are coded separately from each other.

As to luma, there is a case where a macroblock is coded by one 4×4 block (Block Category 0) that collects only direct-current components of 16 blocks obtained by dividing 16×16 pixels by a block of 4×4 pixels and sixteen 4×4 blocks (Block Category 1) of only alternating-current components other than the direct-current components, there is a case where a macroblock is coded by sixteen 4×4 blocks (Block Category 2) including direct-current components and alternating-current components, and there is a case where a macroblock is coded by four 8×8 blocks (Block Category 5) including direct-current components and alternating-current components.

As to chroma, in the case of a 4:2:0 format (NumC8×8 is "1"), one 2×2 block (Block Category 3) that collects only direct-current components and four 4×4 blocks (Block Category 4) of only alternating-current components are coded for each of the components Cr and Cb. Once context variables for three 128-bit registers are loaded, decoding can be performed while only the context variables continue to be used for a period that coefficients for blocks of sizes such as 2×2, 4×4, 8×8 and the like are decoded. As for blocks including alternating-current components (Block Categories 1, 2, 4, and 5), in particular, decoding can be performed while only the same context variables continue to be used during the further decoding of a plurality of blocks. Therefore the number of loads per bin is very small as compared with a case where the context variables of the syntax elements of the first to fourth context groups decoded in the first half are arranged in memory and loaded before being used. Then, because decoding is performed in the unit of a Block Category, it suffices to perform three times of loading into the 128-bit registers and three times of storing in bloc before and after each Block Category. The embodiment of the present invention has four arithmetic registers, and is thus able to perform a decoding process without any unnecessary transfer being made between registers.

FIGS. 14A and 14B are diagrams showing an example of relation between each register of the register file 120 in the embodiment of the present invention and context variables. FIG. 14A shows an example in which one 7-bit context variable is assigned to each unit of 8 bits of one register of the 128-bit width and 16 context variables C0 to C15 are stored in the register. In the cases of FIGS. 4A to 6 and FIGS. 8A to 13C, a maximum of 16 context variables are assigned to one register. Therefore all of necessary context variables can be stored by storing the context variables as in FIG. 14A.

On the other hand, a device needs to be applied as follows when a maximum of 18 context variables are to be assigned to one register as in the case of FIG. 7. FIG. 14B shows an example in which one 7-bit context variable is assigned to each unit of 8 bits of one register of the 128-bit width and two more context variables are stored in the register by collecting the remainder of one bit. Specifically, in this example, surplus bits each as one bit remaining in the context variables C0 to C6 are collected, and a context variable C16 is assigned to the seven surplus bits. Similarly, surplus bits each as one bit remaining in the context variables C7 to C13 are collected, and a context variable C17 is assigned to the seven surplus bits. In addition, an exchange information bit is assigned to the surplus bit of the context variable C14. This exchange information bit will be described with reference to a next diagram.

Figure 15:
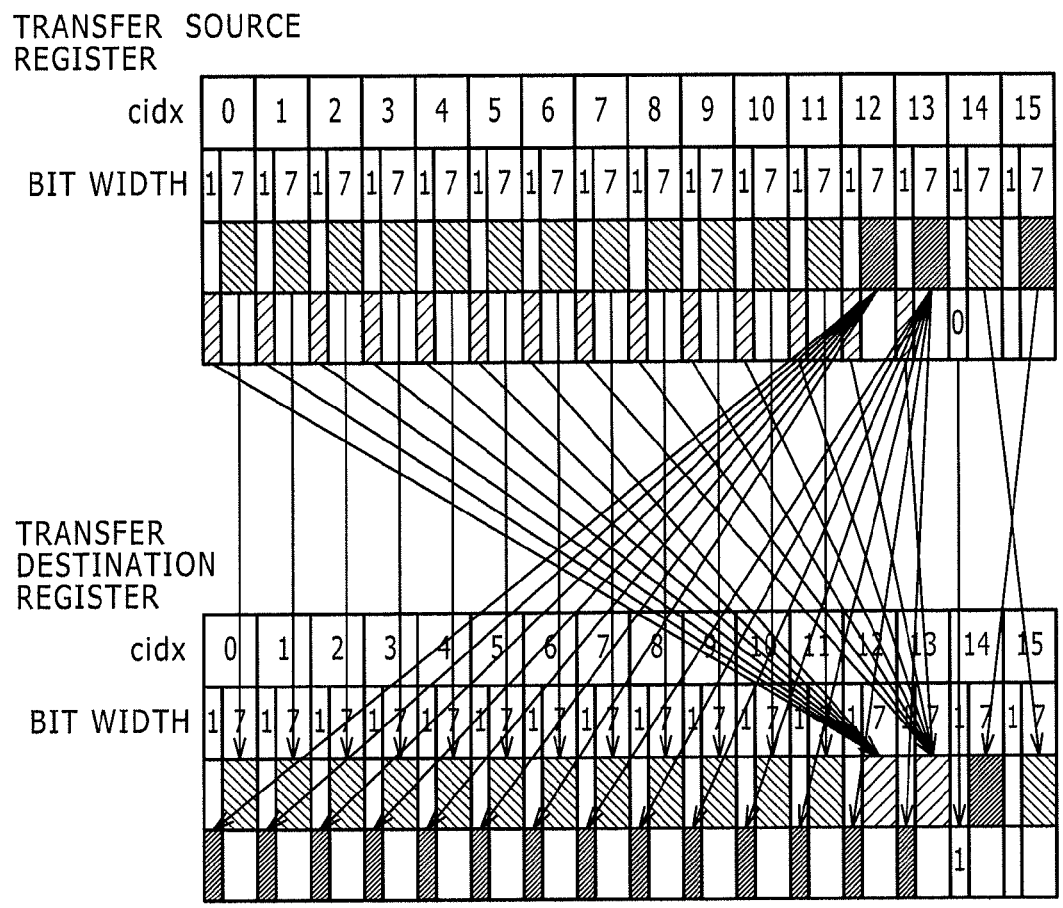
FIG. 15 is a diagram showing an example of a mode of exchange transfer between registers of the register file in the embodiment of the present invention.

FIG. 15 is a diagram showing an example of a mode of exchange transfer between registers of the register file 120 in the embodiment of the present invention. In FIG. 15, an upper side is a transfer source register, and a lower side is a transfer destination register.

The storage positions of 12 context variables C0 to C11 before and after the exchange transfer are unchanged. A context variable C12 is distributed to the seven surplus bits of context variables C0 to C6 after the transfer. Similarly, a context variable C13 is distributed to the seven surplus bits of context variables C7 to C13 after the transfer. On the other hand, a context variable C16 stored in the surplus bits of the context variables C0 to C6 is stored at the position of the context variable C12 after the transfer. Similarly, a context variable C17 stored in the surplus bits of the context variables C7 to C13 is stored at the position of the context variable C13 after the transfer. Context variables C14 and C15 are interchanged with each other and stored after the transfer.

In the case of such exchange transfer, the exchange information bit corresponding to the surplus bit of the context variable C14 is inverted after the transfer. Specifically, when the exchange information bit is "0" before the transfer as in FIG. 15, the exchange information bit is set to "1." Conversely, when the exchange information bit is "1" before the transfer, the exchange information bit is set to "0."

Such exchange transfer enables context variables necessary for a process to be arranged in each unit of eight bits on a register each time when 18 context variables are stored as in the example of FIG. 7. For example, when "mb_field_decoding_flag" is used, the context variables of "mb_field_decoding_flag" are stored at the positions of the 13th to 15th context variables (cidx=12 to 14). At this time, suppose that the context variables of "transform_size_8x8_flag" are stored as the surplus bits of the context variables C0 to C6, the surplus bits of the context variables C7 to C13, and the context variable C15, respectively.

Thereafter, when "transform_size_8x8_flag" is used, exchange transfer is performed. Thereby, the context variables of "transform_size_8x8_flag" are stored at the positions of the 13th to 15th context variables (cidx=12 to 14).

The use of such a mechanism enables a maximum of 18 context variables to be stored in one register while cidx remains limited to four bits. Incidentally, this exchange transfer is performed according to a context exchange transfer instruction to be described later.

Figure 16:
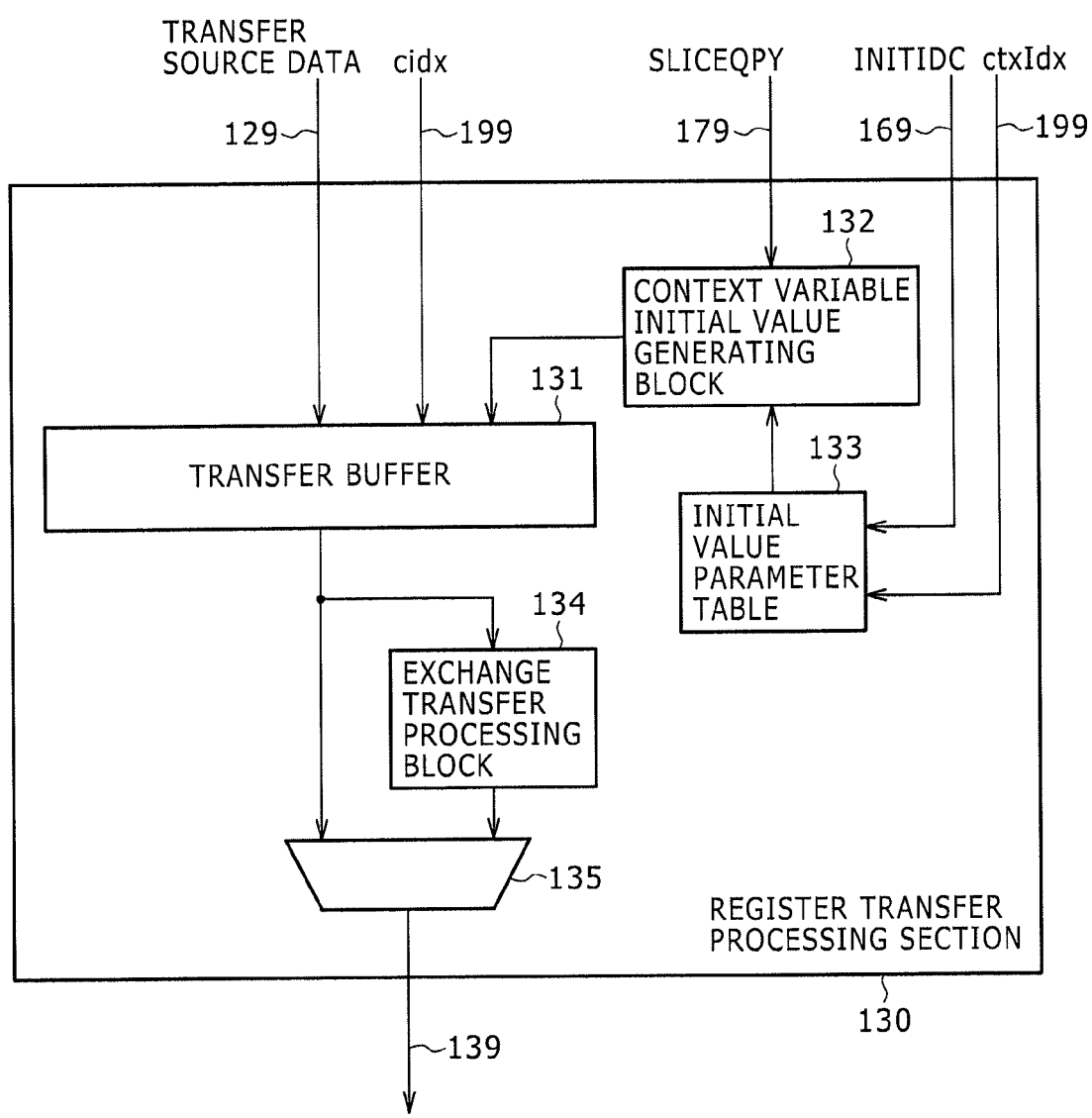
FIG. 16 is a diagram showing an example of configuration of the register transfer processing section in the embodiment of the present invention.

FIG. 16 is a diagram showing an example of configuration of the register transfer processing section 130 in the embodiment of the present invention. The register transfer processing section 130 includes a transfer buffer 131, a context variable initial value generating block 132, an initial value parameter table 133, an exchange transfer processing block 134, and a selector 135.

The transfer buffer 131 is a 128-bit buffer for retaining data from a transfer source register of the register file 120. This transfer buffer 131 allows the process of the exchange transfer processing block 134 to be pipelined. In addition, an initial value is set in the transfer buffer 131 according to a context initialization instruction to be described later. The initial value in this case is generated in the context variable initial value generating block 132, and the storage position of the initial value is specified from the decoding control section 190 via the signal line 199.

The context variable initial value generating block 132 generates the initial values of context variables. The context variable initial value generating block 132 generates the initial values of context variables the number (four-bit value imm_cnum) of which is specified by an operand of the context initialization instruction to be described later, one in each cycle, in order from ctxIdx (nine-bit value imm_ctxIdx) specified by an operand of the context initialization instruction, starting at the position of cidx (four-bit value imm_cidx) specified by an operand of the context initialization instruction. The context variable initial value generating block 132 then repeats a process of writing the initial value of a context variable to seven bits at a corresponding position of a transfer buffer (cv_dst) specified by an operand of the context initialization instruction imm_cnum times. The initial value generated by the context variable initial value generating block 132 is a value defined by H.264, and is determined by an initial value parameter (m and n) supplied from the initial value parameter table 133 and a quantization parameter (SliceQP$_Y$) supplied from the SLICEQPY control register 170 via a signal line 179.

The initial value parameter table 133 retains the initial value parameter (m and n). The initial value parameter table 133 is indexed by ctxIdx specified by the operand of the context initialization instruction and a value supplied from the INITIDC control register 160 via a signal line 169. The value of the INITIDC control register 160 is used as cabac_init_idc when the value is "0" to "2," and indicates an I slice or an SI slice when the value is "3."

The initial value parameter (m and n) is defined in a tabular form so as to be able to be identified by slice_type included in slice_header( ), cabac_init_idc, and ctxIdx in H.264. The quantization parameter (SliceQP$_Y$) is a value calculated for each slice according to slice_qp_delta included in slice_header( ) and pic_init_qp_minus26 included in pic_parameter_set_rbsp( ).

preCtxState=Clip3(1, 126, ((m ? SliceQPY)>>4)+n);

```
if(preCtxState <= 63) {
    pStateIdx = 63 – preCtxState;
    valMPS = 0;
} else {
    pStateIdx = preCtxState – 64;
    valMPS = 1;
}
``` where Clip3 is the following function.

```
int Clp3(int x, int y, int z) {
    if (z > x) return x;
    if (z > y) return y;
    return z;
}
```

In order to perform such initialization by software, m and n need to be stored in memory and referred to for each slice. Four types of m and n are prepared as m and n of most context variables, and m and n are selected from slice_type and cabac_init_idc. Therefore, m and n need a capacity of a few Kbytes when stored as an array, and occupy most of the primary data cache of a processor, which often has a size of 4 Kbytes or 8 Kbytes. That is, when a process is performed while context variables are retained in the primary data cache, there is a strong possibility of the context variables being expelled from the cache for each slice. In this regard, according to the embodiment of the present invention, the initial value parameter table 133 is provided separately so that a process can be performed without the primary data cache being occupied.

Directly generating an initial value in a register by the initial value parameter table 133 and the context variable initial value generating block 132 obviates a need to load or store a context variable for the syntax elements of the first to fourth context groups decoded in the first half. As for the syntax elements of the fifth context group decoded in the second half, context variables can be initialized by storing in memory an initial value generated in a register.

The exchange transfer processing block 134 performs the exchange transfer process described with reference to FIG. 15. Specifically, the exchange transfer processing block 134 exchanges the surplus bits of context variables C0 to C13 and context variables C12 and C13, interchanges context variables C14 and C15, and inverts an exchange information bit.

The selector 135 selects one of data retained by the transfer buffer 131 and data resulting from the exchange transfer process by the exchange transfer processing block 134. The data selected by the selector 135 is output to the transfer destination register of the register file 120 via a signal line 139. Which data to select is determined by an executed instruction. In the case of a transfer instruction, data retained by the transfer buffer 131 is always selected. In the case of a context exchange transfer instruction, which data to select is determined according to an operand and a state of the exchange information bit.

Figure 17:
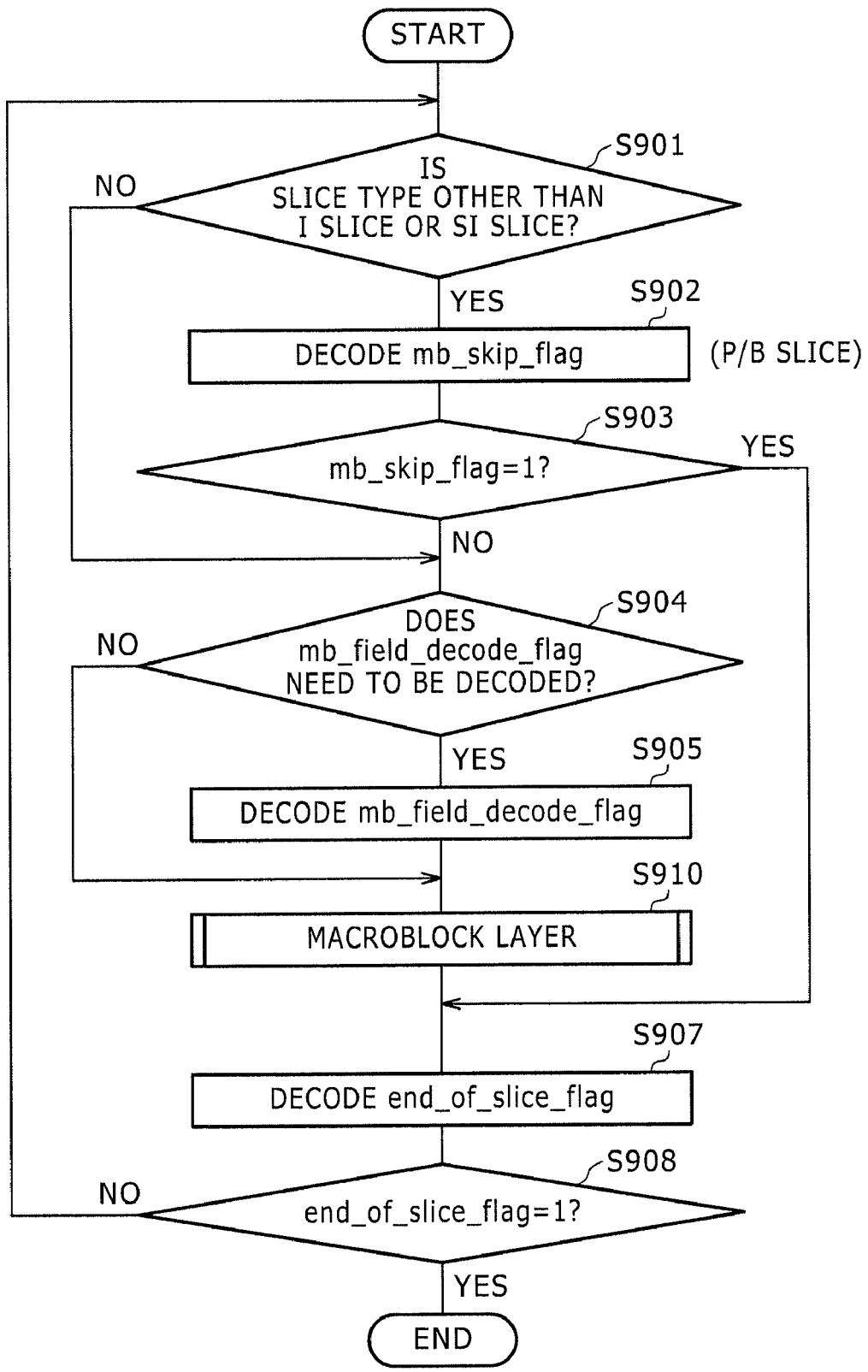
FIG. 17 is a flowchart extracting a process of parsing the syntax elements of slice_data in H.264.

FIG. 17 is a flowchart extracting a process of parsing the syntax elements of slice_data in H.264.

First, when a slice type is other than an I slice (slice_type !=I) and other than an SI slice (slice_type !=SI) (step S901), "mb_skip_flag" is decoded (step S902). Context variables used at this time are the context variables of "mb_skip_flag" for P or SP slices (ctxIdx=11 to 13) or B slices (ctxIdx=24 to 26). When "mb_skip_flag" indicates "1," a next process relating to a macroblock (steps S904, S905, and S910) is skipped (step S903).

When "mb_skip_flag" does not indicate "1," whether "mb_field_decode_flag" needs to be decoded is determined (step S904). When it is determined that "mb_field_decode_flag" needs to be decoded, "mb_field_decode_flag" is decoded (step S905). Context variables used at this time are the context variables of "mb_field_decode_flag" (ctxIdx=70 to 72). Thereafter a macroblock layer is decoded (step S910).

Then, "end_of_slice" is decoded (step S907). When "end_of_slice" indicates "1," the parsing process is ended (step S908). When "end_of_slice" does not indicate "1," the process is repeated from the start (step S901).

Figure 18:
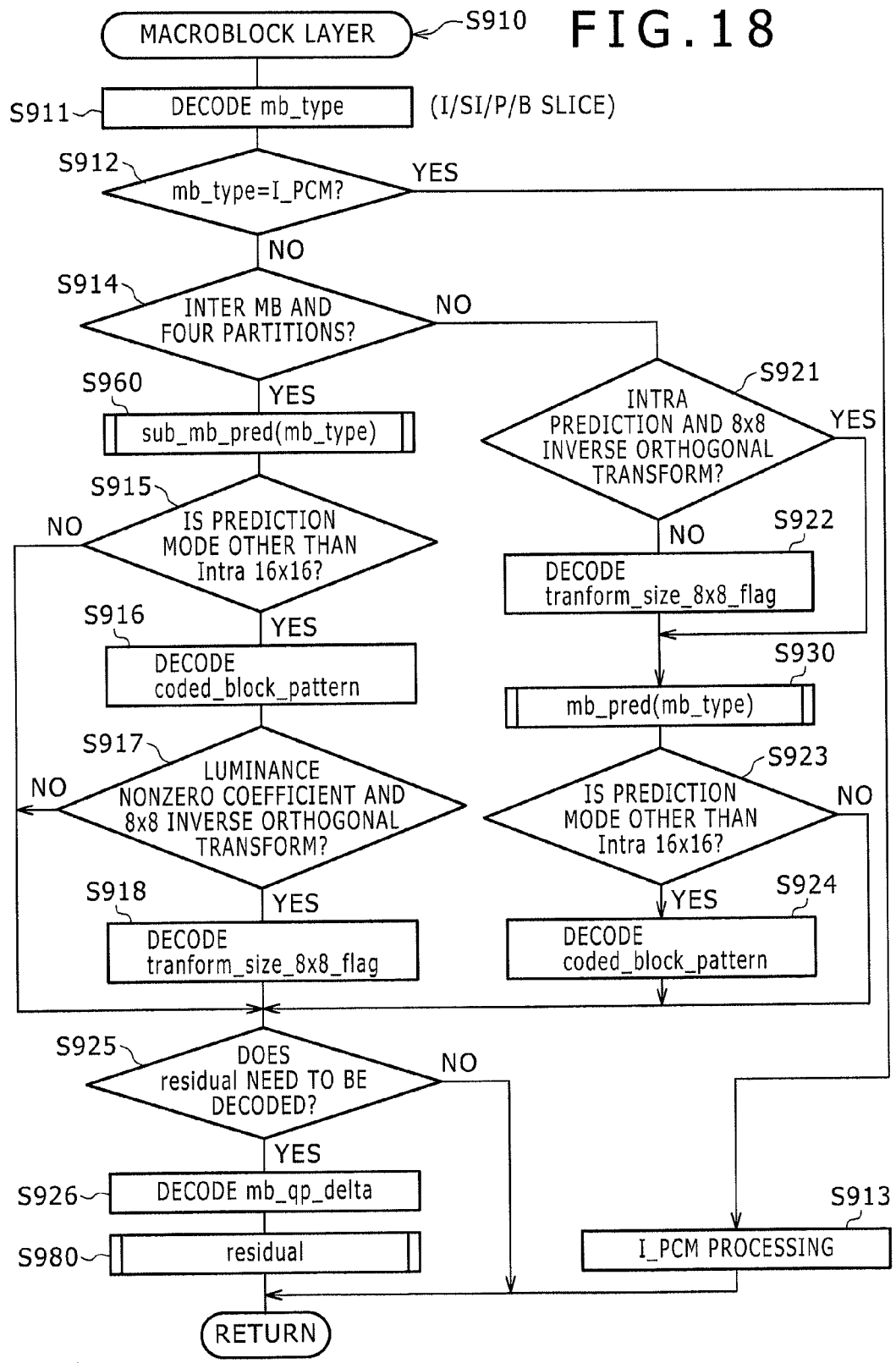
FIG. 18 is a diagram of a procedure for decoding a macroblock layer.

FIG. 18 is a diagram of a procedure for decoding the macroblock layer (step S910). First, "mb_type" is decoded (step S911). Context variables used at this time are the context variables of "mb_type" for SI slices (ctxIdx=0 to 2), for I slices (ctxIdx=3 to 10), for P or SP slices (ctxIdx=14 to 20), or for B slices (ctxIdx=27 to 35).

When "mb_type" is Intra-frame PCM (Pulse Code Modulation) (mb_type=I_PCM) (step S912), a process for Intra-frame PCM is performed (step S913).

When "mb_type" is Inter macroblock and there are four partitions (step S914), "sub_mb_pred" is decoded (step S960). Then, when a macroblock partition prediction mode is not "Intra_16×16" (step S915), "coded_block_pattern" is decoded (step S916). Context variables used at this time are the context variables of "coded_block_pattern" (ctxIdx=73 to 84). Then, when there is a nonzero inverse orthogonal transform coefficient of luma and there is a possibility of an 8×8 size inverse orthogonal transform (step S917), "transform_size_8×8_flag" is decoded (step S918). Context variables used at this time are the context variables of "transform_size_8×8_flag" (ctxIdx=399 to 401).

When it is not determined in step S914 that "mb_type" is Inter macroblock and that there are four partitions, on the other hand, and when there is a possibility of intra prediction ("mb_type" is "I_4×4" or "I_8×8") and an 8×8 size inverse orthogonal transform (step S921), "transform_size_8×8_flag" is decoded (step S922). Context variables used at this time are the context variables of "transform_size_8×8_flag" (ctxIdx=399 to 401). After "mb_pred" is decoded (step S930), when the macroblock partition prediction mode is not "Intra_16×16" (step S923), "coded_block_pattern" is decoded (step S924). Context variables used at this time are the context variables of "coded_block_pattern" (ctxIdx=73 to 84).

Then, whether "residual" needs to be decoded is determined (step S925). When it is determined that "residual" needs to be decoded, "mb_qp_delta" is decoded (step S926), and "residual" is decoded (step S980).

As is understood from the procedure for decoding the macroblock layer, the order of decoding of "transform_size_8×8_flag" is reversed with respect to the other syntax elements depending on the branching path. On the other hand, when "transform_size_8×8_flag" is not present as in the case of a main profile, the decoding order is the same regardless of the branching path. In addition, "mb_field_decoding_flag" in FIG. 17 at the time of a P, SP, or B slice needs to be decoded between "mb_skip_flag" and "mb_type." Context variables are managed as in FIG. 7 to use "transform_size_8×8_flag" and "mb_field_decoding_flag" as exceptional syntax elements together.

Another exceptional syntax element is "mb_qp_delta." "mb_qp_delta" does not need to be decoded when "residual" does not need to be decoded, but "mb_qp_delta" needs to be decoded when there is "residual." It is therefore necessary to decode the MVD context group and the block information context group after decoding the syntax element of the prediction context group, and further decode the syntax element of the prediction context group.

Because of presence of these exceptional syntax elements, if the CABAC decoder can access only one arithmetic register, syntax elements need to be transferred to the arithmetic register and substituted each time a group of syntax elements is changed. If "transform_size_8×8_flag," "mb_field_decoding_flag," and "mb_qp_delta" are not present, it suffices only to transfer (restore) syntax elements of each group to the arithmetic register only once for each macroblock, and transfer (save) the syntax elements to the original register when the group is changed. However, when exceptional syntax elements are present, there occurs a group that requires context variables for the syntax elements of the same group to be transferred twice or more to be restored to an arithmetic register and saved for each macroblock. In order to avoid this, in the embodiment of the present invention, three or more arithmetic registers are provided, whereby excess transfers can be reduced. Incidentally, when two arithmetic registers are provided, the number of transfers can be reduced as compared with one arithmetic register.

Figure 19:
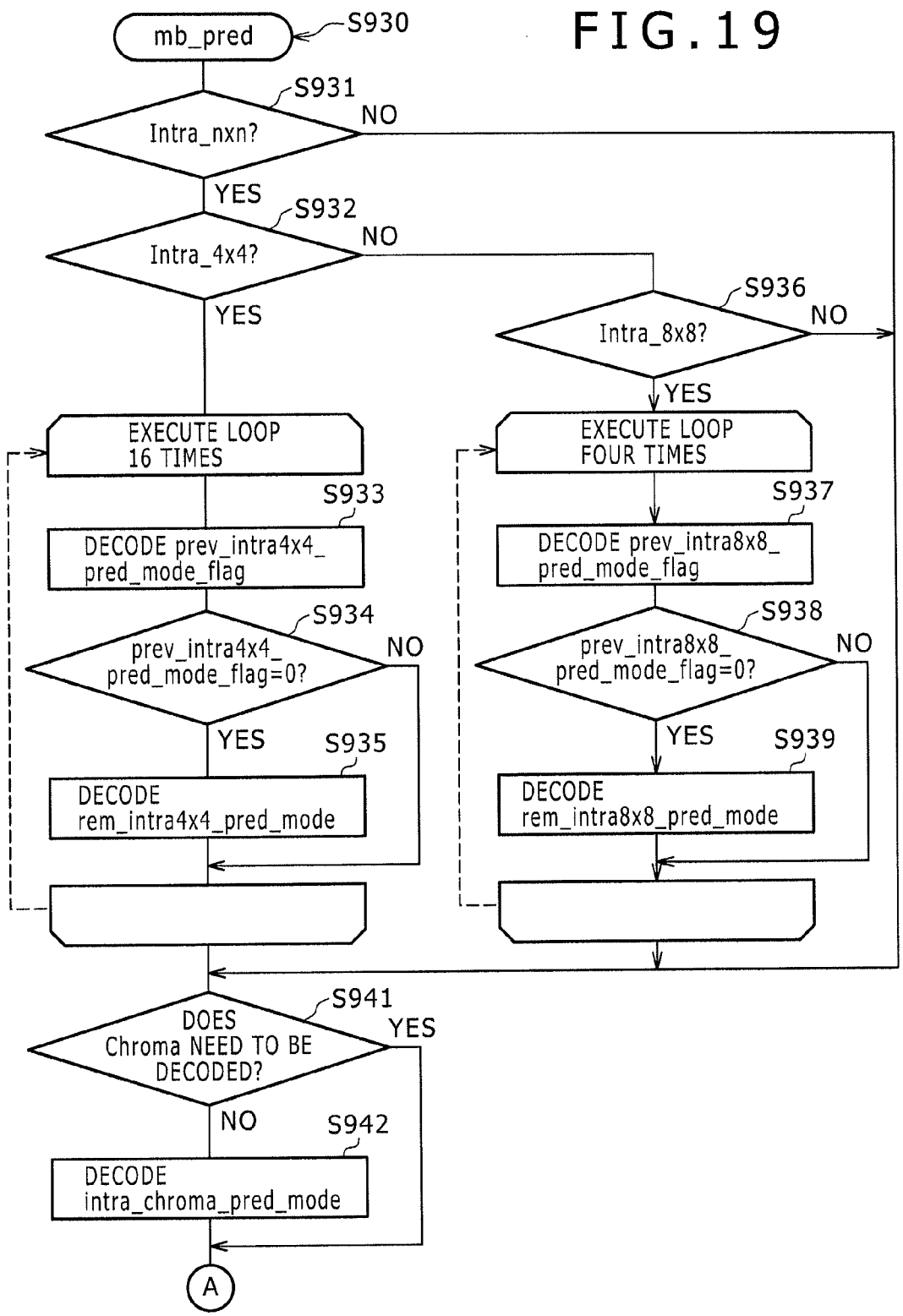
FIG. 19 is a diagram of the first half of a procedure for decoding "mb_pred"
Figure 20:
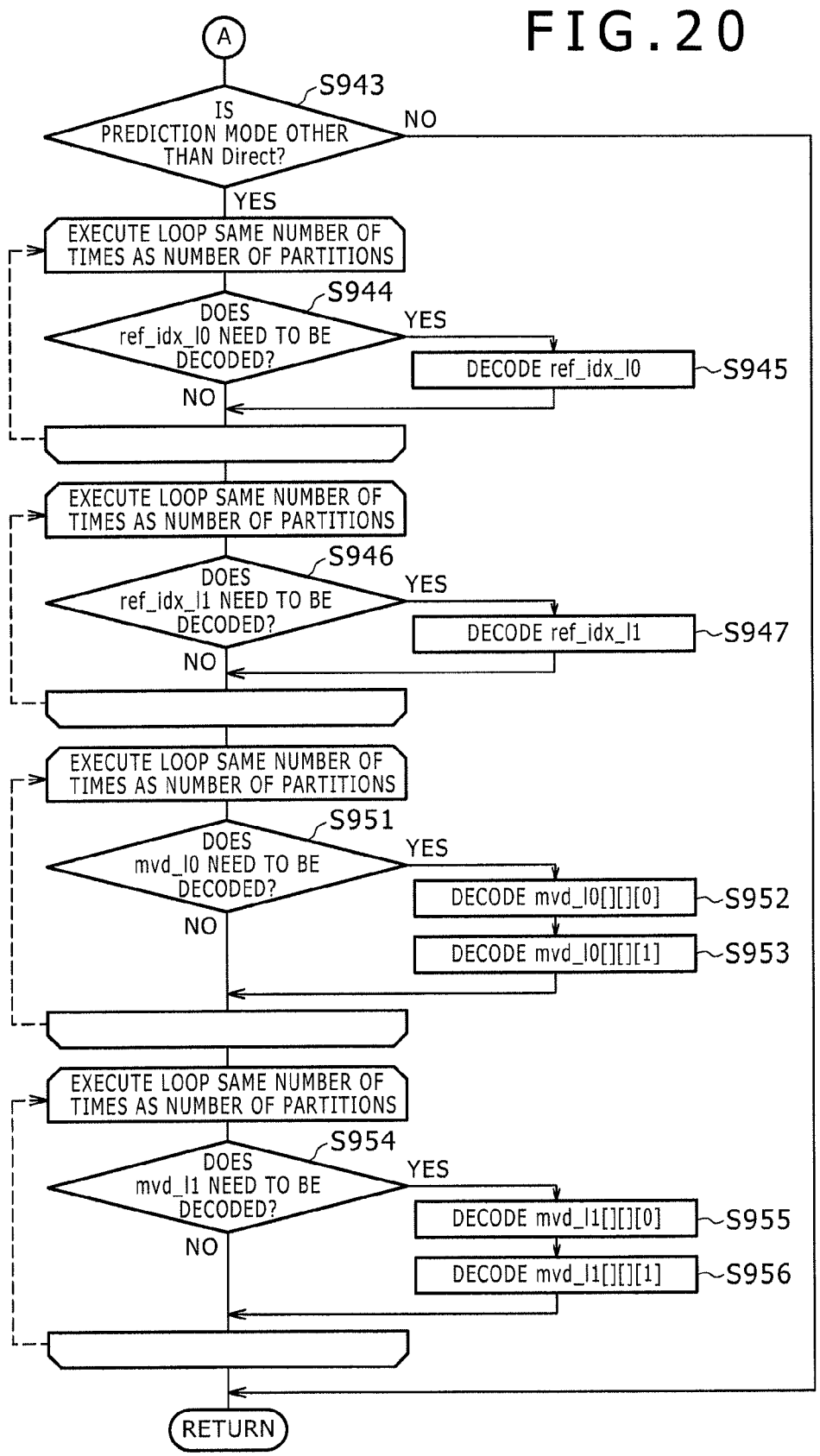
FIG. 20 is a diagram of the second half of the procedure for decoding "mb_pred"

FIG. 19 and FIG. 20 are diagrams of a procedure for decoding "mb_pred" (step S930).

When the macroblock partition prediction mode is "Intra_4×4" (step S932), the following process (steps S933 to S935) is repeatedly performed 16 times. That is, "prev_intra4×4_pred_mode_flag" is decoded (step S933). A context variable used at this time is the context variable of "prev_intra4×4_pred_mode_flag" (ctxIdx=68). When "prev_intra4×4_pred_mode_flag" indicates "0" (step S934), "rem_intra4×4_pred_mode" is decoded (step S935). A context variable used at this time is the context variable of "rem_intra4×4_pred_mode" (ctxIdx=69).

When the macroblock partition prediction mode is "Intra_8×8" (step S936), the following process (steps S937 to S939) is repeatedly performed four times. That is, "prev_intra8×8_pred_mode_flag" is decoded (step S937). A context variable used at this time is the context variable of "prev_intra8×8_pred_mode_flag" (ctxIdx=68). When "prev_intra8×8_pred_mode_flag" indicates "0" (step S938), "rem_intra8×8_pred_mode" is decoded (step S939). A context variable used at this time is the context variable of "rem_intra8×8_pred_mode" (ctxIdx=69).

Incidentally, when the macroblock partition prediction mode is other than Intra_4×4 or Intra_8×8, the above process (steps S932 to S939) is not performed (step S931).

When chroma does not need to be decoded (step S941), "intra_chroma_pred_mode" is decoded (step S942). Context variables used at this time are the context variables of "intra_chroma_pred_mode" (ctxIdx=64 to 67).

When the macroblock partition prediction mode is Direct, the decoding of "mb_pred" is ended here (step S943). When the macroblock partition prediction mode is not Direct, the following process (steps S944 to S956) is performed. For each partition, whether "ref_idx_l0" needs to be decoded is determined (step S944), and when "ref_idx_l0" needs to be decoded, "ref_idx_l0" is decoded (step S945). Context variables used at this time are the context variables of "ref_idx_l0" (ctxIdx=54 to 59). Similarly, for each partition, whether "ref_idx_l1" needs to be decoded is determined (step S946), and when "ref_idx_l1" needs to be decoded, "ref_idx_l1" is deoded (step S947). Context variables used at this time are the context variables of "ref_idx_l1" (ctxIdx=54 to 59).

In addition, for each partition, whether "mvd_l0" needs to be decoded is determined (step S951), and when "mvd_l0" needs to be decoded, "mvd_l0[ ][ ][0]" and "mvd_l0[ ][ ][1]" are decoded (steps S952 and S953). Context variables used at this time are the context variables of "mvd_l0[ ][ ][0]" and "mvd_l0[ ][ ][1]" (ctxIdx=40 to 53). Similarly, for each partition, whether "mvd_l1" needs to be decoded is determined (step S954), and when "mvd_l1" needs to be decoded, "mvd_l1[ ][ ][0]" and "mvd_l1[ ][ ][1]" are decoded (steps S955 and S956). Context variables used at this time are the context variables of "mvd_l1[ ][ ][0]" and "mvd_l1[ ][ ][1]" (ctxIdx=40 to 53).

Figure 21:
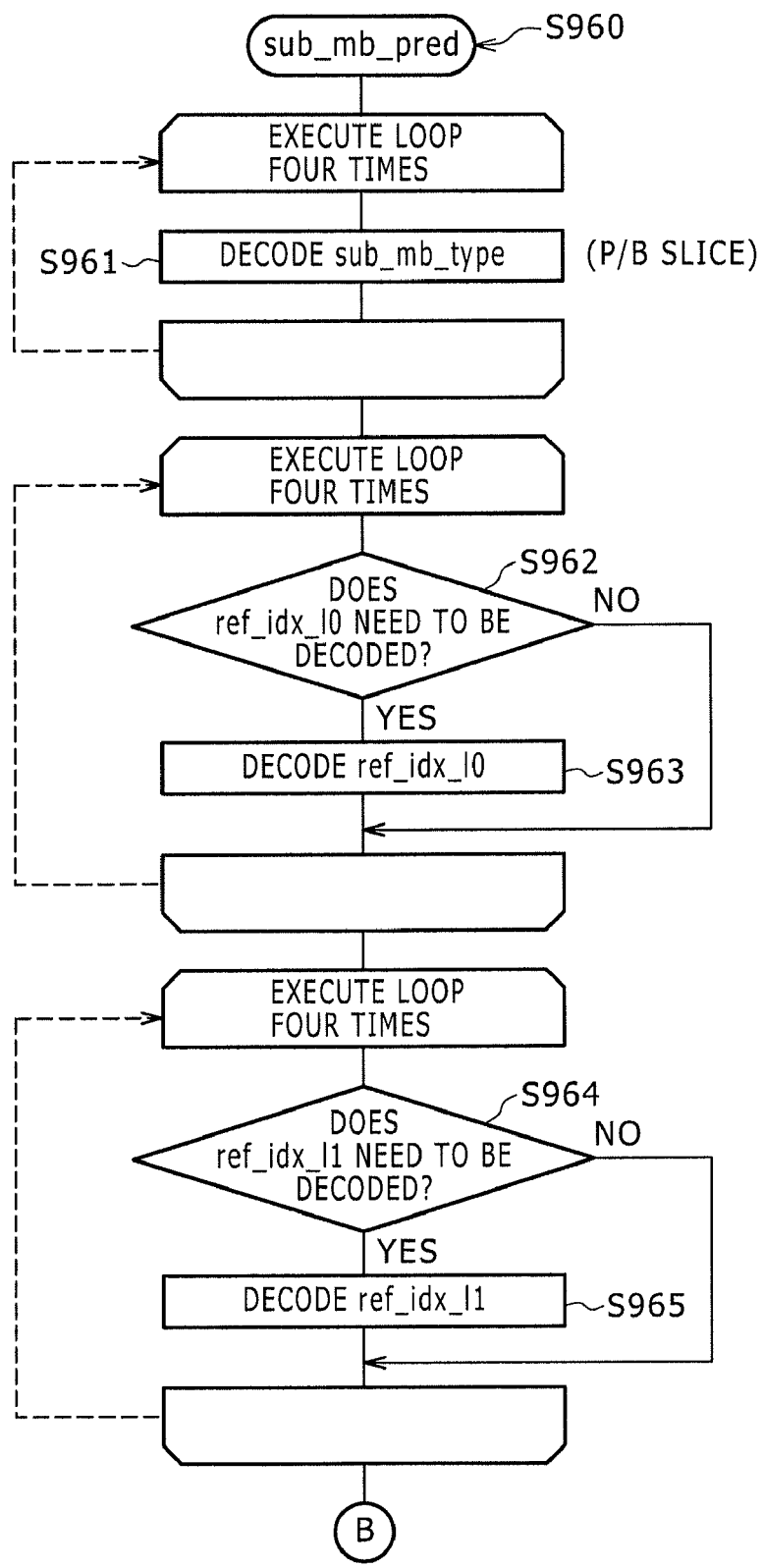
FIG. 21 is a diagram of the first half of a procedure for decoding "sub_mb_pred"
Figure 22:
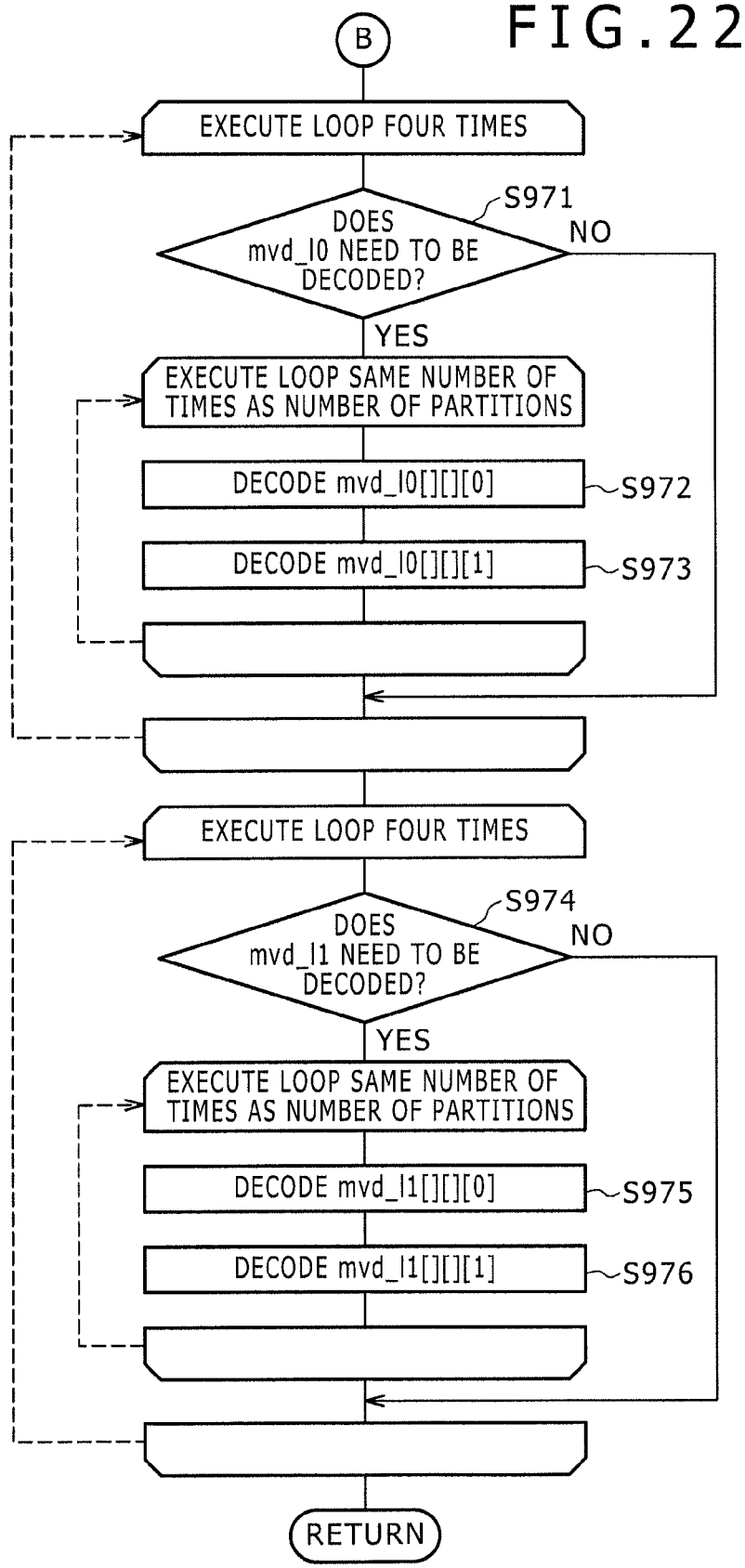
FIG. 22 is a diagram of the second half of the procedure for decoding "sub_mb_pred"

FIG. 21 and FIG. 22 are diagrams of a procedure for decoding "sub_mb_pred" (step S960).

For each of four sub-macroblocks within the macroblock, "sub_mb_type" is decoded (step S961). Context variables used at this time are the context variables of "sub_mb_type" for P or SP slices (ctxIdx=21 to 23) or for B slices (ctxIdx=36 to 39).

In addition, whether "ref_idx_l0" needs to be decoded is determined (step S962), and when "ref_idx_l0" needs to be decoded, "ref_idx_l0" is decoded (step S963). Context variables used at this time are the context variables of "ref_idx_l0" (ctxIdx=54 to 59). Similarly, whether "ref_idx_l1" needs to be decoded is determined (step S964), and when "ref_idx_l1" needs to be decoded, "ref_idx_l1" is decoded (step S965). Context variables used at this time are the context variables of "ref_idx_l1" (ctxIdx=54 to 59).

In addition, for each of the four sub-macroblocks within the macroblock, whether "mvd_l0" needs to be decoded is determined (step S971), and when "mvd_l0" needs to be decoded, "mvd_l0[ ][ ][0]" and "mvd_l0[ ][ ][1]" are decoded for each sub-macroblock partition (steps S972 and S973). Context variables used at this time are the context variables of "mvd_l0[ ][ ][0]" and "mvd_l0[ ][ ][1]" (ctxIdx=40 to 53). Similarly, for each of the four sub-macroblocks within the macroblock, whether "mvd_l1" needs to be decoded is determined (step S974), and when "mvd_l1" needs to be decoded, "mvd_l1[ ][ ][0]" and "mvd_l1[ ][ ][1]" are decoded for each sub-macroblock partition (steps S975 and S976). Context variables used at this time are the context variables of "mvd_l1[ ][ ][0]" and "mvd_l1[ ][ ][1]" (ctxIdx=40 to 53).

Figure 23:
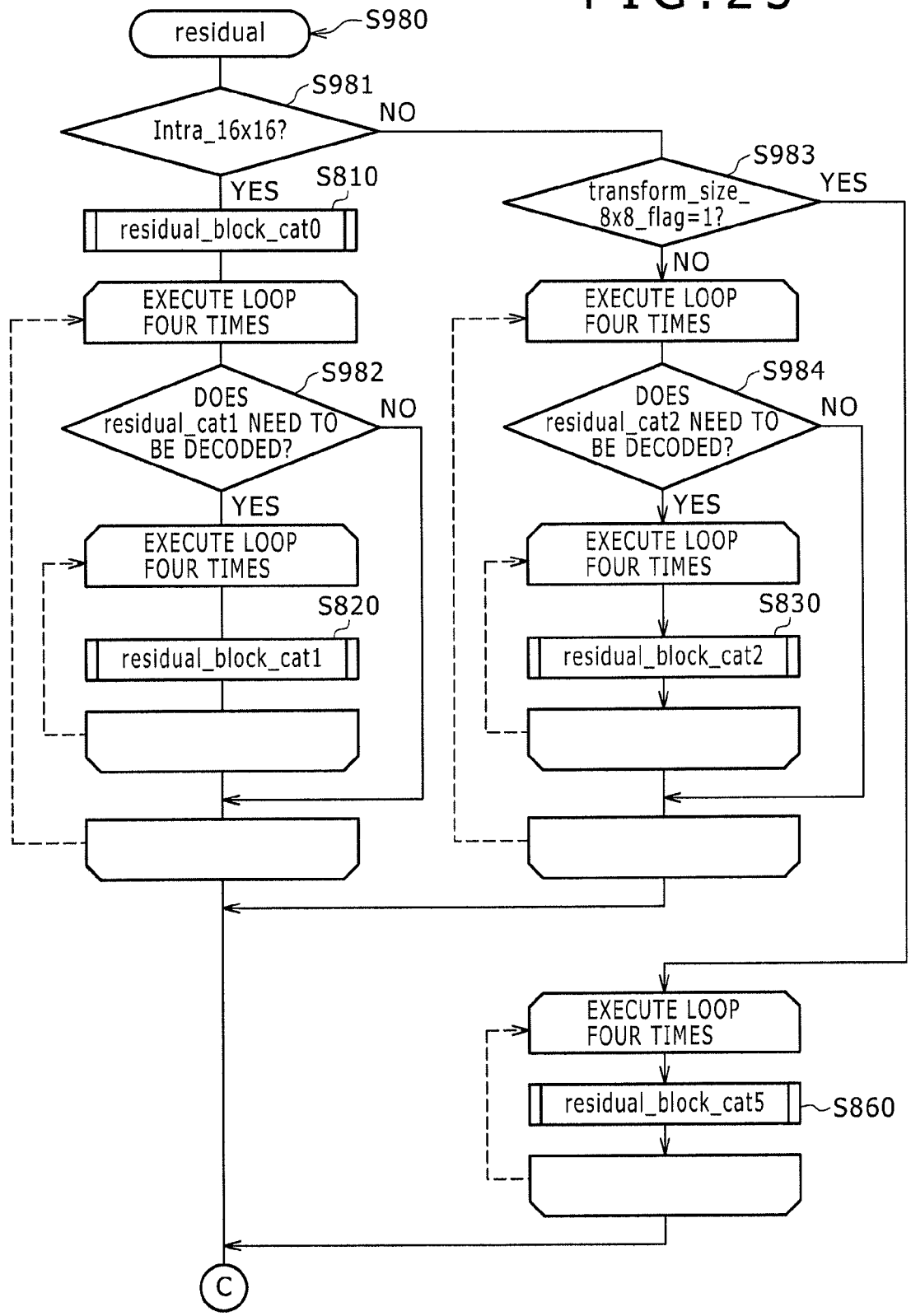
FIG. 23 is a diagram of the first half of a procedure for decoding "residual"
Figure 24:
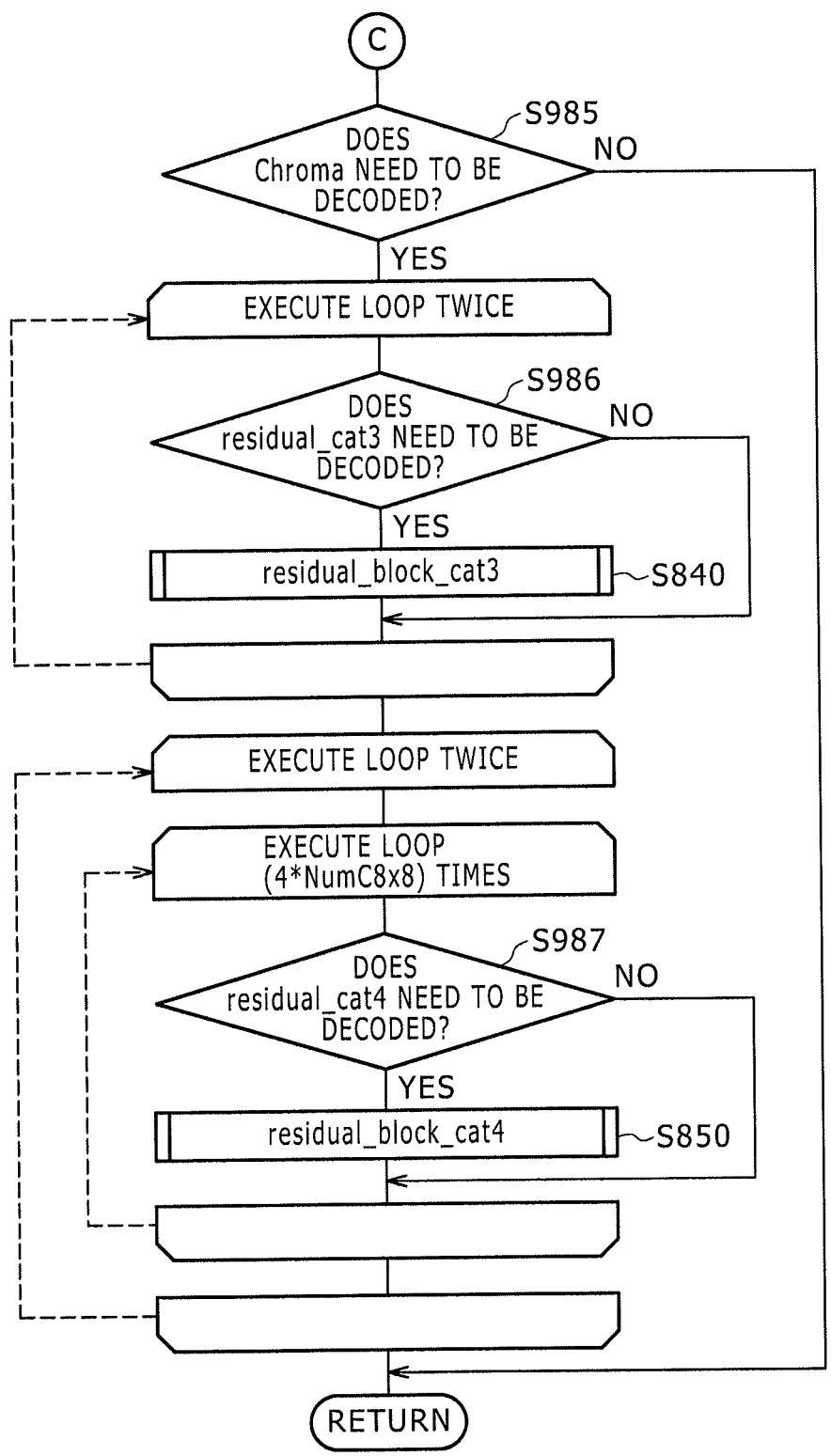
FIG. 24 is a diagram of the second half of the procedure for decoding "residual"

FIG. 23 and FIG. 24 are diagrams of a procedure for decoding "residual" (step S980).

When the macroblock partition prediction mode is "Intra_16×16" (step S981), "residual_block_cat0" is decoded (step S810). Then, whether "residual_cat1" needs to be decoded is determined (step S982), and when it is determined that "residual_cat1" needs to be decoded, "residual_block_cat1" is decoded for four times (step S820). This determination is repeated four times.

When it is determined in step S981 that the macroblock partition prediction mode is not "Intra_16×16," and when "transform_size_8×8_flag" is not "1" (step S983), whether "residual_cat2" needs to be decoded is determined (step S984). When it is determined that "residual_cat2" needs to be decoded, "residual_block_cat2" is decoded for four times (step S830). This determination is repeated four times.

When it is determined in step S983 that "transform_size_8×8_flag" is "1," "residual_block_cat5" is decoded for four times (step S860).

When it is determined that chroma does not need to be decoded, the decoding of "residual" is ended here (step S985). When it is determined that chroma needs to be decoded, whether "residual_cat3" needs to be decoded is determined (step S986), and when "residual_cat3" needs to be decoded, "residual_block_cat3" is decoded (step S840). This determination is repeated twice. In addition, whether "residual_cat4" needs to be decoded is determined (step S987), and when "residual_cat4" needs to be decoded, "residual_block_cat4" is decoded (step S850). This determination is repeated by a double loop of a loop executed 4×"NumC8×8" times and a loop executed twice.

Figure 25:
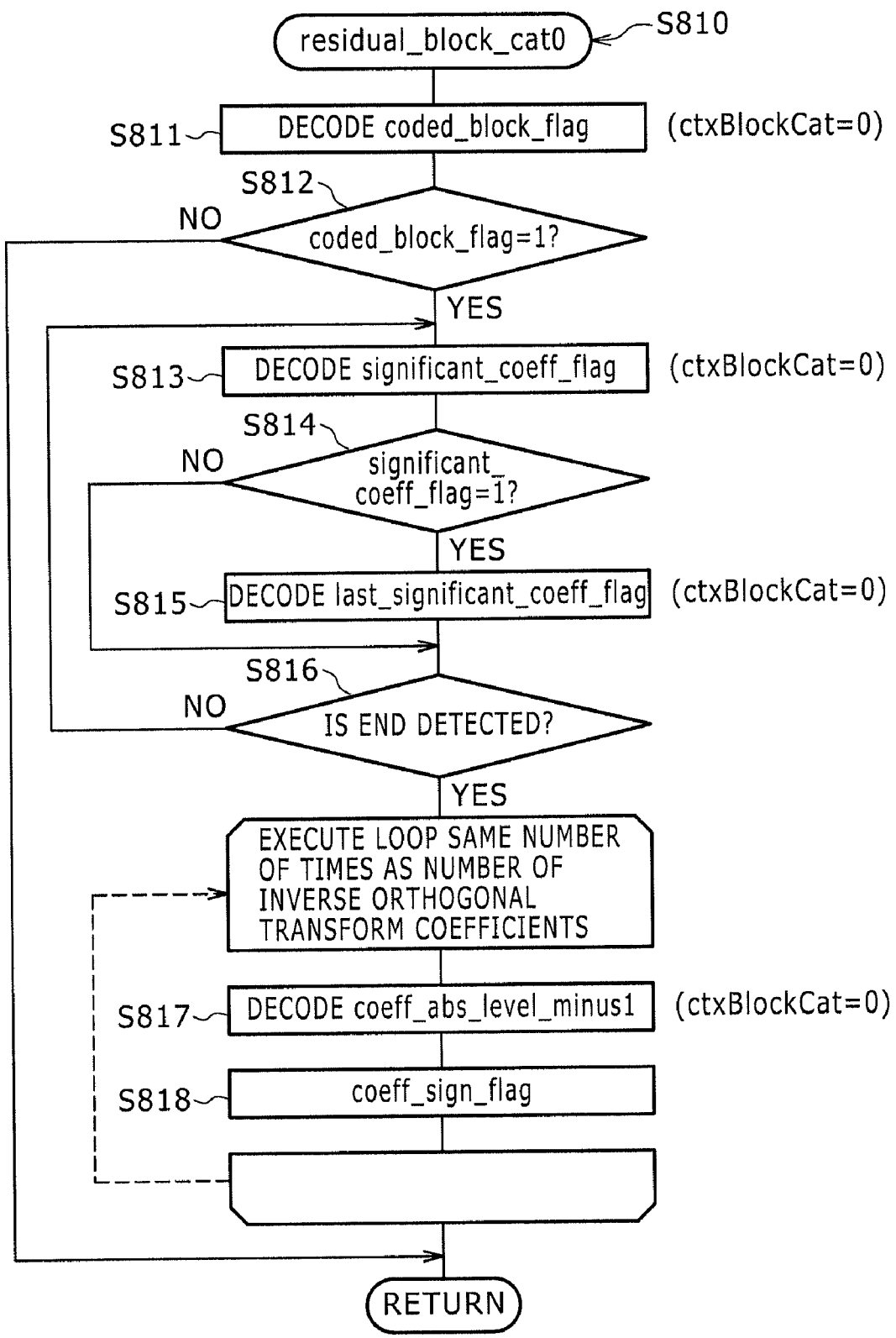
FIG. 25 is a diagram of a procedure for decoding "residual_block_cat0"

FIG. 25 is a diagram of a procedure for decoding "residual_block_cat0" (step S810).

"coded_block_flag" is decoded (step S811). When "coded_block_flag" is not "1," the decoding of "residual_block_cat0" is ended (step S812). Context variables used at this time are the context variables of Block Category 0 of "coded_block_flag" (ctxIdx=85 to 88).

"significant_coeff_flag" is decoded (step S813). When "significant_coeff_flag" is "1" (step S814), "last_significant_coeff_flag" is decoded (step S815). The process from step S813 on down is repeated until an end is detected (step S816). Incidentally, context variables used at this time are the context variables of Block Category 0 of "significant_coeff_flag" (ctxIdx=105 to 119 or 277 to 291) and the context variables of Block Category 0 of "last_significant_coeff_flag" (ctxIdx=166 to 180 or 338 to 352).

After an end is detected in step S816, "coeff_abs_level_minus1" is decoded (step S817). Context variables used at this time are the context variables of Block Category 0 of "coeff_abs_level_minus1" (ctxIdx=227 to 236). In addition, "coeff_sign_flag" is decoded (step S818). The procedure after the detection of the end is repeated a same number of times as the number of inverse orthogonal transform coefficients.

Figure 26:
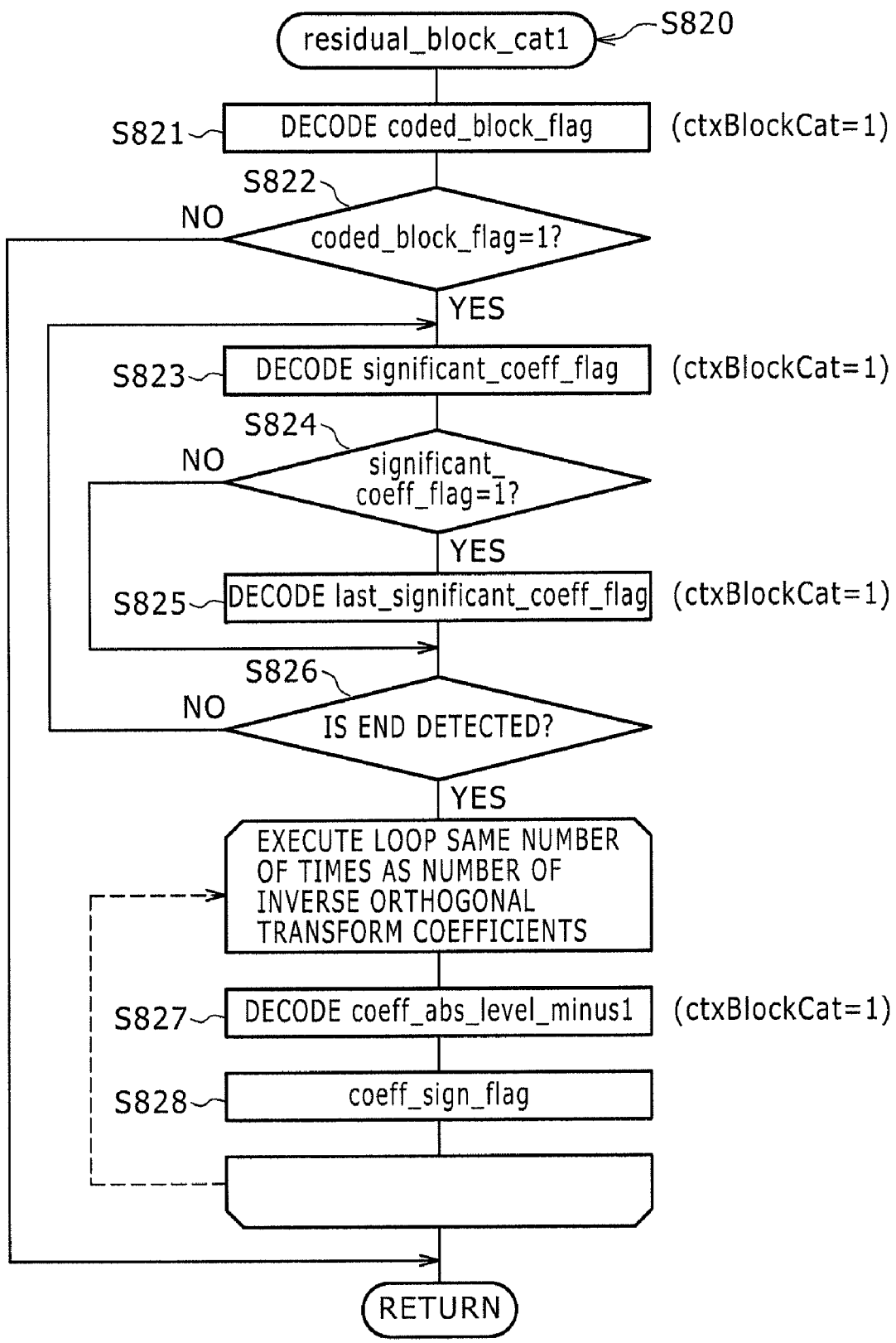
FIG. 26 is a diagram of a procedure for decoding "residual_block_cat1"

FIG. 26 is a diagram of a procedure for decoding "residual_block_cat1" (step S820).

"coded_block_flag" is decoded (step S821). When "coded_block_flag" is not "1," the decoding of "residual_block_cat1" is ended (step S822). Context variables used at this time are the context variables of Block Category 1 of "coded_block_flag" (ctxIdx=89 to 92).

"significant_coeff_flag" is decoded (step S823). When "significant_coeff_flag" is "1" (step S824), "last_significant_coeff_flag" is decoded (step S825). The process from step S823 on down is repeated until an end is detected (step S826). Incidentally, context variables used at this time are the context variables of Block Category 1 of "significant_coeff_flag" (ctxIdx=120 to 133 or 292 to 305) and the context variables of Block Category 1 of "last_significant_coeff_flag" (ctxIdx=181 to 194 or 353 to 366).

After an end is detected in step S826, "coeff_abs_level_minus1" is decoded (step S827). Context variables used at this time are the context variables of Block Category 1 of "coeff_abs_level_minus1" (ctxIdx=237 to 246). In addition, "coeff_sign_flag" is decoded (step S828). The procedure after the detection of the end is repeated a same number of times as the number of inverse orthogonal transform coefficients.

Figure 27:
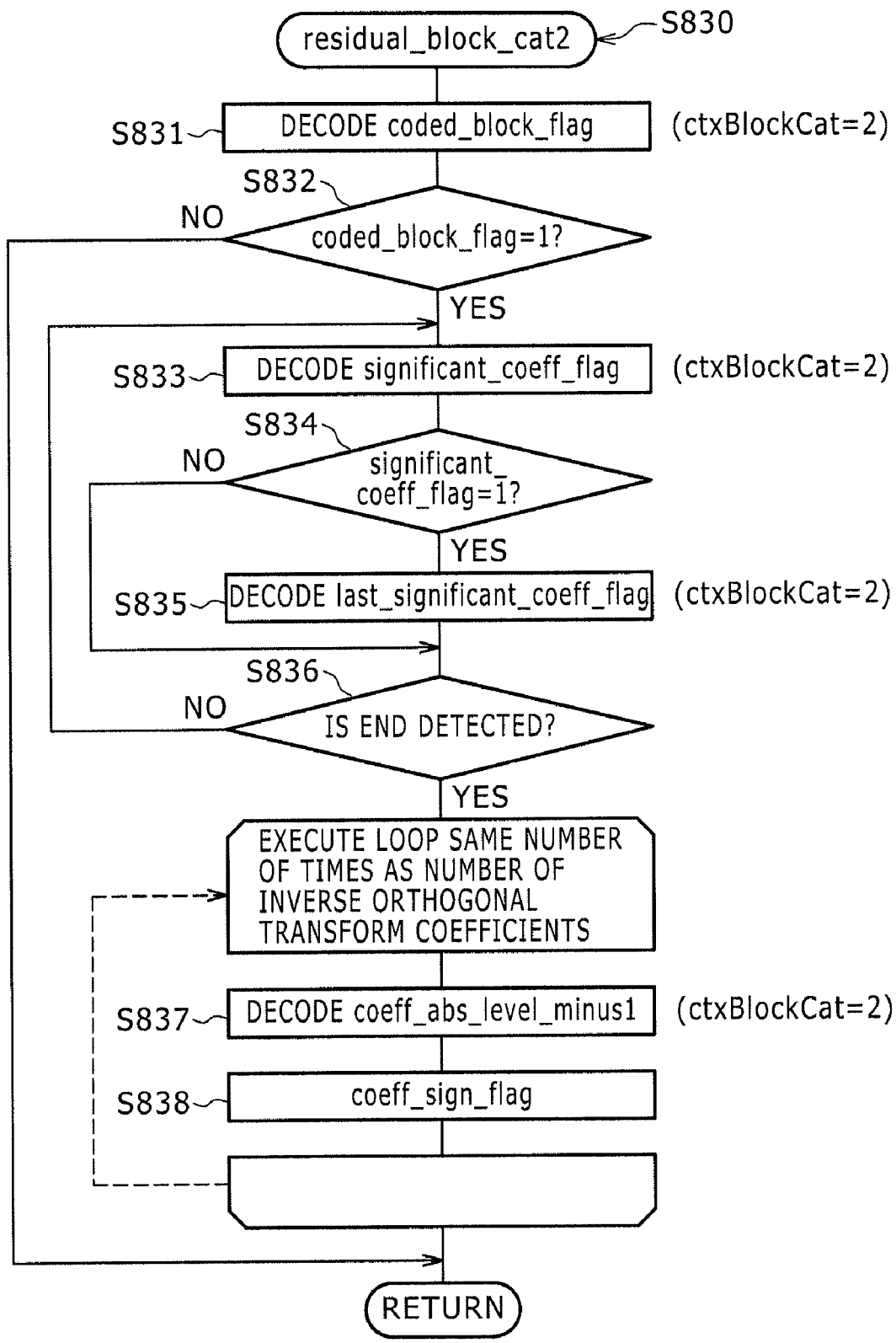
FIG. 27 is a diagram of a procedure for decoding "residual_block_cat2"

FIG. 27 is a diagram of a procedure for decoding "residual_block_cat2" (step S830).

"coded_block_flag" is decoded (step S831). When "coded_block_flag" is not "1," the decoding of "residual_block_cat2" is ended (step S832). Context variables used at this time are the context variables of Block Category 2 of "coded_block_flag" (ctxIdx=93 to 96).

"significant_coeff_flag" is decoded (step S833). When "significant_coeff_flag" is "1" (step S834), "last_significant_coeff_flag" is decoded (step S835). The process from step S833 on down is repeated until an end is detected (step S836). Incidentally, context variables used at this time are the context variables of Block Category 2 of "significant_coeff_flag" (ctxIdx=134 to 148 or 306 to 320) and the context variables of Block Category 2 of "last_significant_coeff_flag" (ctxIdx=195 to 209 or 367 to 381).

After an end is detected in step S836, "coeff_abs_level_minus1" is decoded (step S837). Context variables used at this time are the context variables of Block Category 2 of "coeff_abs_level_minus1" (ctxIdx=247 to 256). In addition, "coeff_sign_flag" is decoded (step S838). The procedure after the detection of the end is repeated a same number of times as the number of inverse orthogonal transform coefficients.

Figure 28:
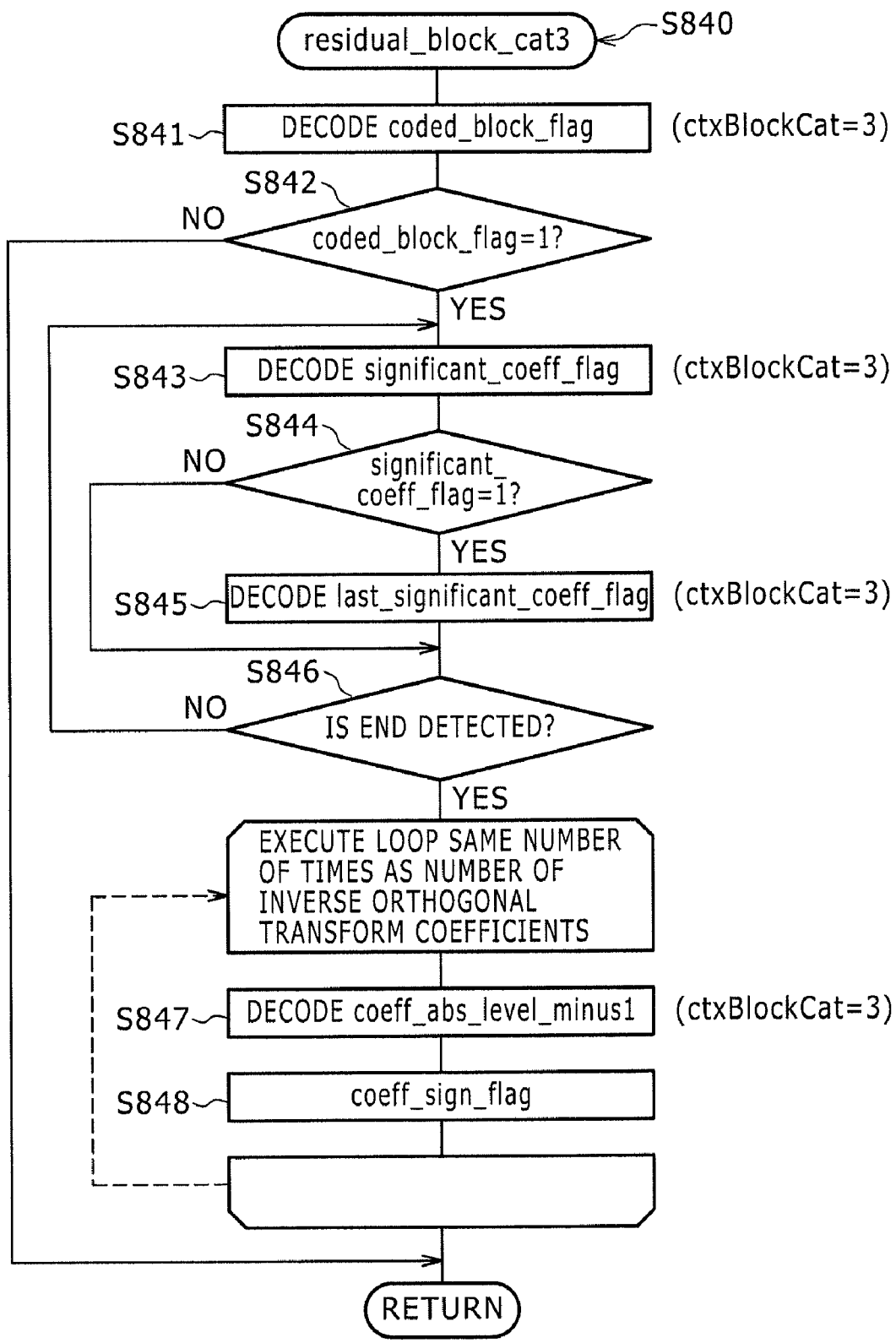
FIG. 28 is a diagram of a procedure for decoding "residual_block_cat3"

FIG. 28 is a diagram of a procedure for decoding "residual_block_cat3" (step S840).

"coded_block_flag" is decoded (step S841). When "coded_block_flag" is not "1," the decoding of "residual_block_cat3" is ended (step S842). Context variables used at this time are the context variables of Block Category 3 of "coded_block_flag" (ctxIdx=97 to 100).

"significant_coeff_flag" is decoded (step S843). When "significant_coeff_flag" is "1" (step S844), "last_significant_coeff_flag" is decoded (step S845). The process from step S843 on down is repeated until an end is detected (step S846). Incidentally, context variables used at this time are the context variables of Block Category 3 of "significant_coeff_flag" (ctxIdx=149 to 151 or 321 to 323) and the context variables of Block Category 3 of "last_significant_coeff_flag" (ctxIdx=210 to 212 or 382 to 384).

After an end is detected in step S846, "coeff_abs_level_minus1" is decoded (step S847). Context variables used at this time are the context variables of Block Category 3 of "coeff_abs_level_minus1" (ctxIdx=257 to 265). In addition, "coeff_sign_flag" is decoded (step S848). The procedure after the detection of the end is repeated a same number of times as the number of inverse orthogonal transform coefficients.

Figure 29:
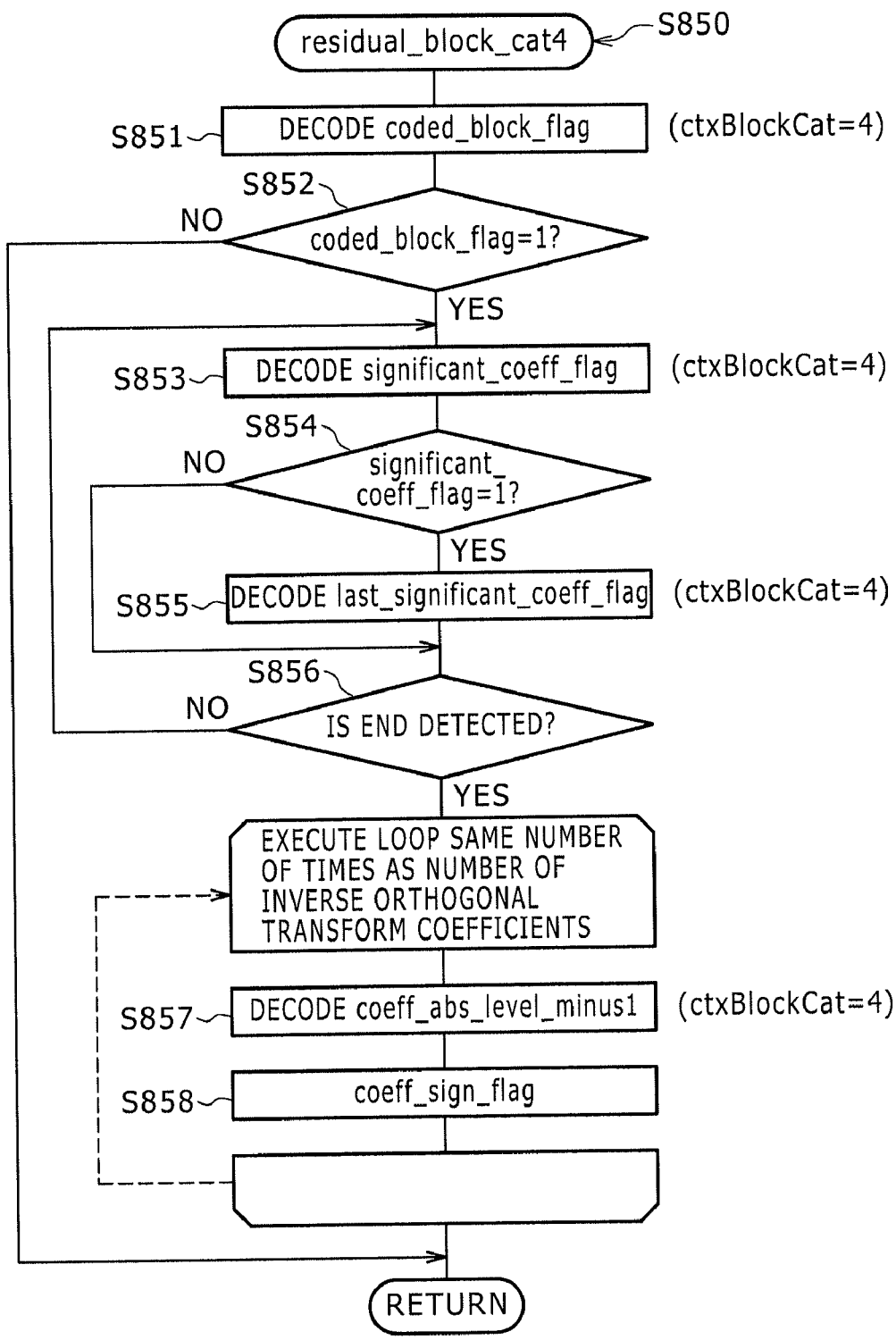
FIG. 29 is a diagram of a procedure for decoding "residual_block_cat4"

FIG. 29 is a diagram of a procedure for decoding "residual_block_cat4" (step S850).

"coded_block_flag" is decoded (step S851). When "coded_block_flag" is not "1," the decoding of "residual_block_cat4" is ended (step S852). Context variables used at this time are the context variables of Block Category 4 of "coded_block_flag" (ctxIdx=101 to 104).

"significant_coeff_flag" is decoded (step S853). When "significant_coeff_flag" is "1" (step S854), "last_significant_coeff_flag" is decoded (step S855). The process from step S853 on down is repeated until an end is detected (step S856). Incidentally, context variables used at this time are the context variables of Block Category 4 of "significant_coeff_flag" (ctxIdx=152 to 165 or 324 to 337) and the context variables of Block Category 4 of "last_significant_coeff_flag" (ctxIdx=213 to 226 or 385 to 398).

After an end is detected in step S856, "coeff_abs_level_minus1" is decoded (step S857). Context variables used at this time are the context variables of Block Category 4 of "coeff_abs_level_minus1" (ctxIdx=266 to 275). In addition, "coeff_sign_flag" is decoded (step S858). The procedure after the detection of the end is repeated a same number of times as the number of inverse orthogonal transform coefficients.

Figure 30:
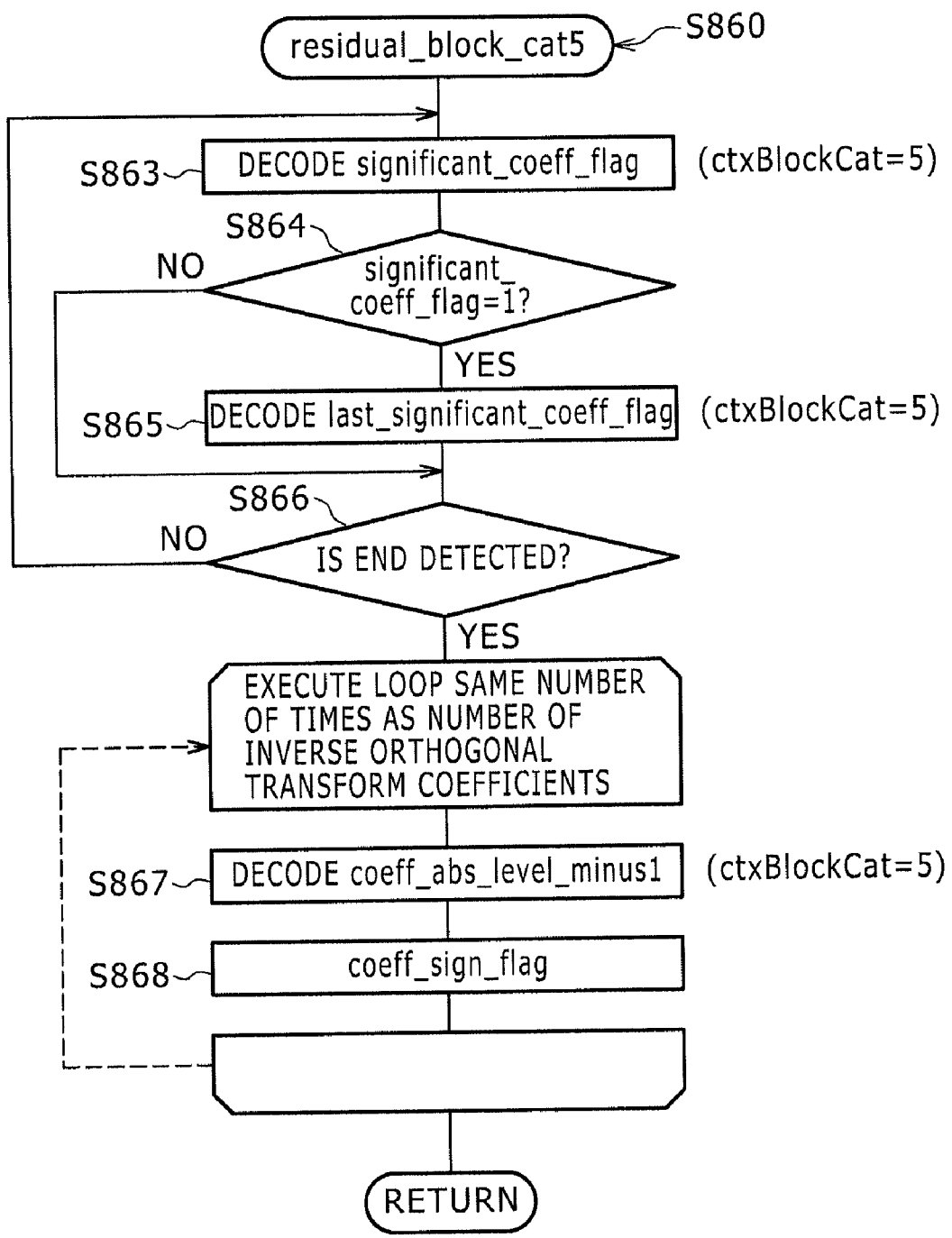
FIG. 30 is a diagram of a procedure for decoding "residual_block_cat5"

FIG. 30 is a diagram of a procedure for decoding "residual_block_cat5" (step S860).

"significant_coeff_flag" is decoded (step S863). When "significant_coeff_flag" is "1" (step S864), "last_significant_coeff_flag" is decoded (step S865). The process from step S863 on down is repeated until an end is detected (step S866). Incidentally, context variables used at this time are the context variables of Block Category 5 of "significant_coeff_flag" (ctxIdx=402 to 416 or 436 to 450) and the context variables of Block Category 5 of "last_significant_coeff_flag" (ctxIdx=417 to 425 or 451 to 459).

After an end is detected in step S866, "coeff_abs_level_minus1" is decoded (step S867). Context variables used at this time are the context variables of Block Category 5 of "coeff_abs_level_minus1" (ctxIdx=426 to 435). In addition, "coeff_sign_flag" is decoded (step S868). The procedure after the detection of the end is repeated a same number of times as the number of inverse orthogonal transform coefficients.

As is understood from the above decoding procedures, three arithmetic registers are necessary for syntax elements decoded in the first half, and three arithmetic registers are necessary for syntax elements decoded in the second half, so that excess transfers can be reduced when there are at least three arithmetic registers. However, after the decoding of "residual," syntax elements decoded in the first half such as "mb_type," "mb_skip_flag" and the like need to be decoded again. Therefore, after the decoding of "residual," efficiency of a process may be decreased by the effect of a wait of the 128-bit registers due to storage into the main memory 300. In order to be able to start decoding "mb_type" and "mb_skip_flag" with the effect of the storage wait being reduced, it suffices to have one arithmetic register separately from the three arithmetic registers. When the four arithmetic registers are thus accessible from the CABAC decoder, excess transfers can be reduced. It is also possible to reduce the effect of latency of a load and storage into the main memory 300 when making a transition from syntax elements decoded in the second half to the decoding of syntax elements decoded in the first half.

It is understood from the above that decoding can be performed efficiently with the register file 120 including a total of eight registers, which are a combination of the four arithmetic registers connected to the CABAC decoder and the four save registers for syntax elements decoded in the first half.

The CABAC decoding arithmetic unit 110 in the embodiment of the present invention is connected to the four arithmetic registers. The four arithmetic registers are used differently according to an instruction. In this case, four instructions, that is, a "cabac_dec0 instruction," a "cabac_dec1 instruction," a "cabac_dec2 instruction," and a "cabac dec3 instruction" are assumed as decoding instructions.

The "cabac_dec0 instruction" is an instruction to decode syntax elements decoded in the second half. Specifically, the "cabac_dec0 instruction" decodes "significant_coeff_flag" using context variables retained in the register CV0, decodes "last_significant_coeff_flag" using context variables retained in the register CV1, and decodes "coeff_abs_level_minus1" using context variables retained in the register CV2.

The "cabac_dec1 instruction" decodes "mvd_l0" and "mvd_l1" using context variables retained in the register CV1.

The "cabac_dec2 instruction" decodes "coded_block_flag," "transform_size_8×8_flag," "mb_field_decoding_flag," and "coded_block_pattern" using context variables retained in the register CV2.

The "cabac_dec3 instruction" decodes syntax elements decoded in the first half other than the above using context variables retained in the register CV3.

The "cabac_dec0 instruction" calculates ctxIdx for decoding a coefficient of an inverse orthogonal transform, performs a process of multilevel conversion from a plurality of decoded bins, and writes decoded data to the main memory 300 via the DMA control section 150. The other "cabac_dec1 to cabac_dec3 instructions" return a process result to the CPU 200 by writing a decoding result to the register of the CPU 200 via the write-back processing section 115. The CPU 200 calculates next ctxIdx and performs a multilevel conversion process according to the value of the process result.

The CABAC decoding arithmetic unit 110 in the embodiment of the present invention also has register-related instructions as follows.

FIG. 31 is a diagram showing an example of the format of a context initialization instruction of the CABAC decoding arithmetic unit 110 in the embodiment of the present invention. This context initialization instruction (init instruction) has "cv_dst," "imm_cidx," "imm_cnum," and "imm_ctxIdx" as operands.

"cv_dst" indicates the register number of a register storing a context variable. "imm_cidx" is an immediate value indicating cidx of a location where the context variable is stored. "imm_cnum" is an immediate value indicating the number of context variables. "imm_ctxIdx" is an immediate value indicating ctxIdx defined in H.264.

An initial value is generated by the initial value parameter table 133 and the context variable initial value generating block 132 according to the operands of the context initialization instruction, and is stored in the transfer buffer 131. Thereby the initial value can be set directly in the register.

FIG. 32 is a diagram showing an example of the format of a context exchange transfer instruction of the CABAC decoding arithmetic unit 110 in the embodiment of the present invention. This context exchange transfer instruction (a swap instruction or a swap_cnd instruction) has "cv_dst," "cv_src," "cnden," and "cndsw" as operands.

"cv_dst" indicates the register number of an exchange transfer destination register. "cv_src" indicates the register number of an exchange transfer source register.

"cnden" is a flag indicating whether to make exchange at the time of a transfer unconditionally or conditionally. When this flag "cnden" is "0," the flag indicates an instruction to perform an exchange transfer unconditionally (swap instruction). When this flag "cnden" is "1," on the other hand, the flag indicates an instruction to perform an exchange transfer conditionally (swap_cnd instruction). Specifically, when the exchange information bits (surplus bit of C14) of "cndsw" and "cv_src" are different from each other, it indicates that an exchange transfer is to be performed. When the exchange information bits of "cndsw" and "cv_src" are equal to each other, it indicates that a transfer is to be performed without exchange. "cndsw" is an object for determining whether exchange is made at the time of the transfer when cnden is "1."

The exchange transfer processing block 134 and the selector 135 perform an unconditional or a conditional exchange transfer according to the operands of the context exchange transfer instruction.

FIG. 33 is a diagram showing an example of the format of a transfer instruction of the CABAC decoding arithmetic unit 110 in the embodiment of the present invention. This transfer instruction (mov instruction) has "cv_dst" and "cv_src" as operands.

"cv_dst" indicates the register number of an exchange transfer destination register. "cv_src" indicates the register number of an exchange transfer source register.

When this transfer instruction is executed, the selector 135 selects and outputs data from the transfer buffer 131.

In the following, attention will be directed to change in syntax elements of context variables, and a flow of execution of main instructions will be extracted and described.

Figure 34:
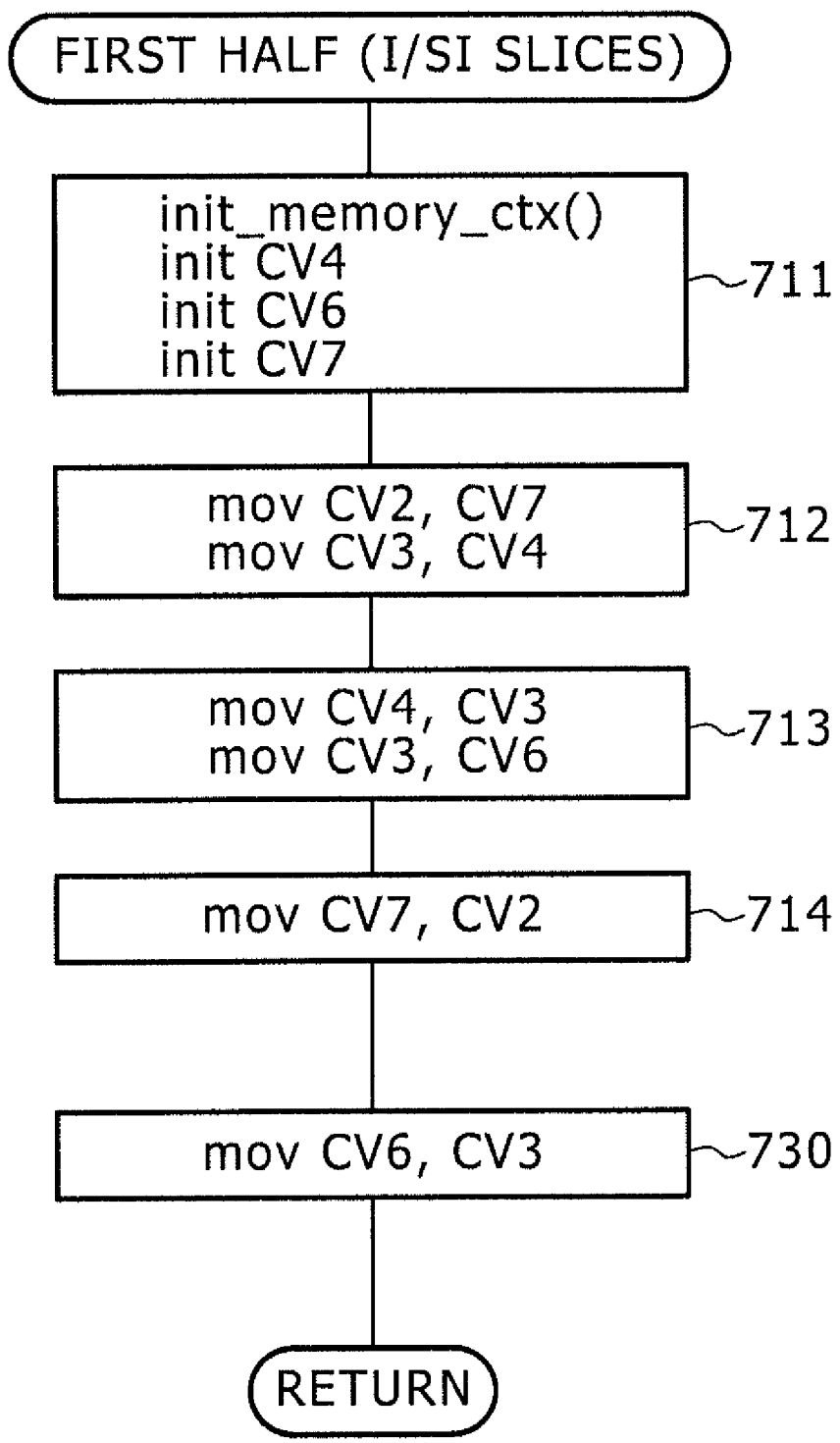
FIG. 34 is a diagram showing an example of process contents related to I slices or SI slices among the syntax elements decoded in the first half in the embodiment of the present invention.

FIG. 34 is a diagram showing an example of process contents related to I slices or SI slices among the syntax elements decoded in the first half in the embodiment of the present invention.

In process 711, an initialization process is performed. "init_memory_ctx( )" is an instruction to initialize context variables for syntax elements decoded in the second half in the register file 120 and store the context variables in the main memory 300. "nit" is a register initialization instruction as described above, and only a register number (cv_dst) as an object is entered in this case. That is, the registers CV4, CV6, and CV7 are initialized.

In process 712, a process of transfer between registers is performed. "mov" is an instruction for transfer between registers, as described above. In this case, the contents of CV7 are transferred to CV2, and the contents of CV4 are transferred to CV3.

In process 713, a next process of transfer between registers is performed. In this case, the contents of CV3 are transferred to CV4, and the contents of CV6 are transferred to CV3.

In process 714, a next process of transfer between registers is performed. In this case, the contents of CV2 are transferred to CV7.

In process 715, a next process of transfer between registers is performed. In this case, the contents of CV3 are transferred to CV6.

Figure 35:
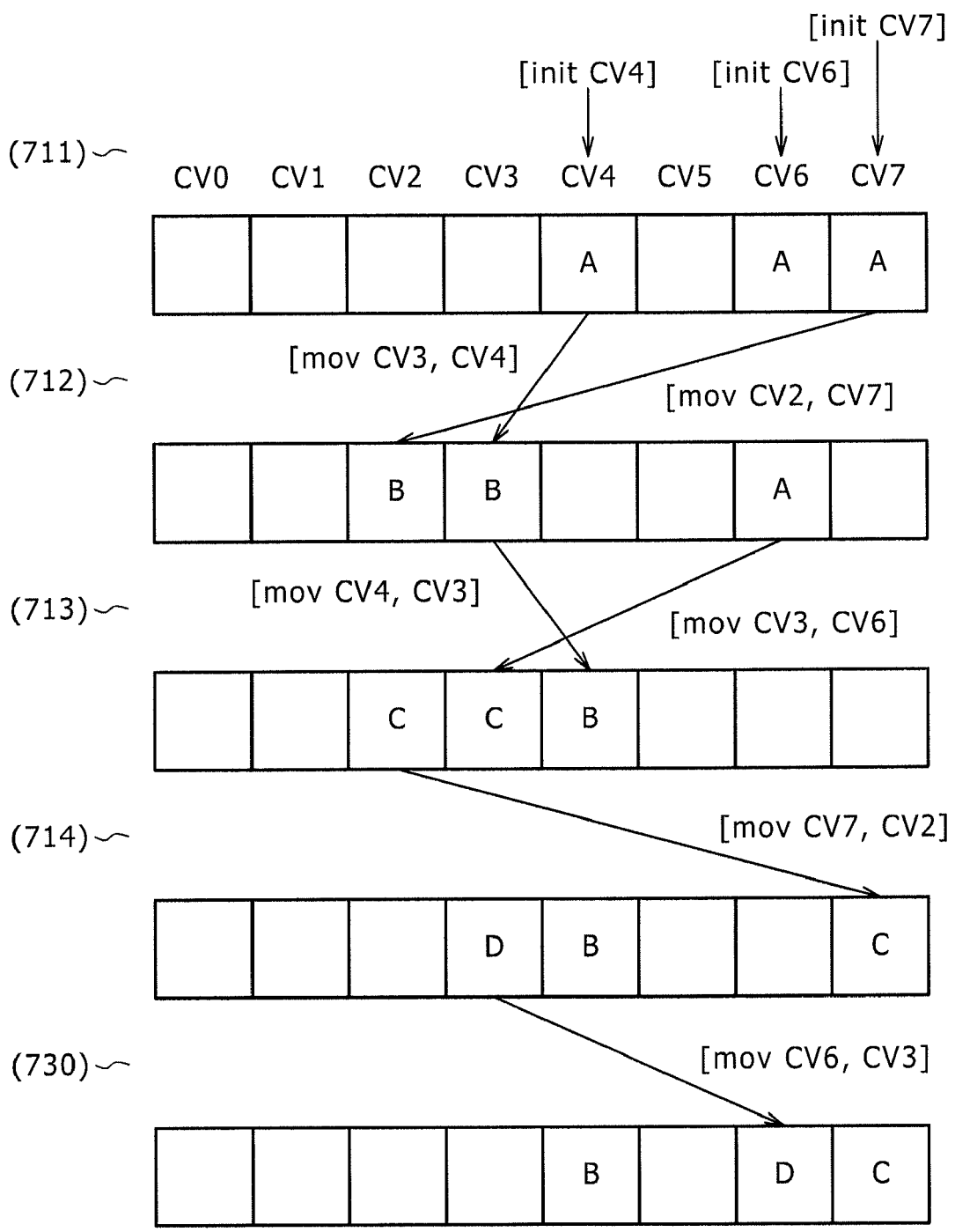
FIG. 35 is a diagram showing a mode of transfer between registers according to the process procedure of FIG. 34.

FIG. 35 is a diagram showing a mode of transfer between registers according to the process procedure of FIG. 34. This figure shows that CV4, CV6, and CV7 are set as locations for saving syntax elements decoded in the first half, that the syntax elements are transferred to CV2 and CV3 before use, and that the syntax elements are saved to CV4, CV6, and CV7 again after the use.

Figure 36:
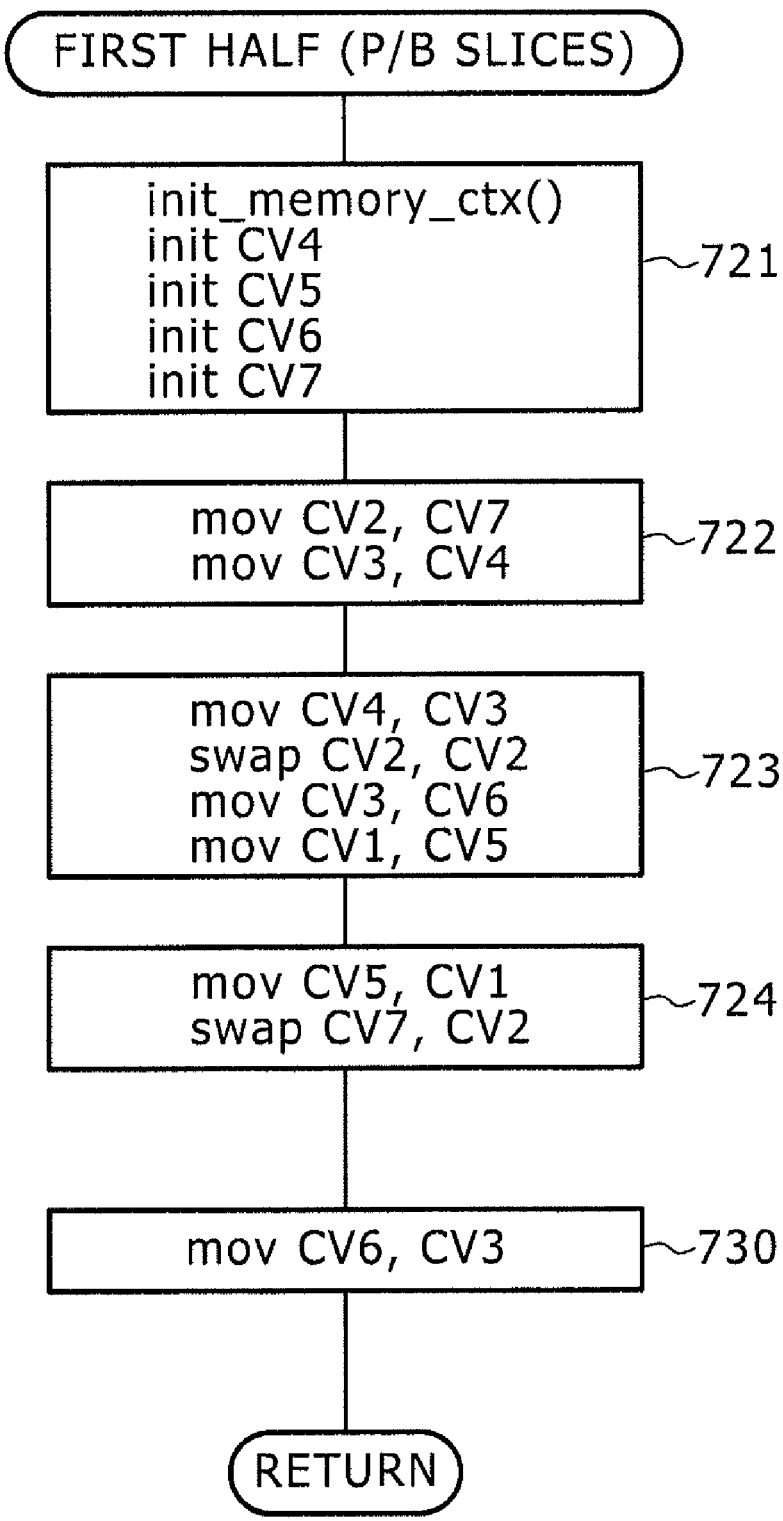
FIG. 36 is a diagram showing an example of process contents related to P slices or B slices among the syntax elements decoded in the first half in the embodiment of the present invention.

FIG. 36 is a diagram showing an example of process contents related to P slices or B slices among the syntax elements decoded in the first half in the embodiment of the present invention.

In process 721, an initialization process is performed. In this case, memory initialization is performed according to "init_memory_ctx( )" as in process 711. Then, the registers CV4 to CV7 are initialized.

In process 722, a process of transfer between registers is performed. In this case, the contents of CV7 are transferred to CV2, and the contents of CV4 are transferred to CV3.

In process 723, a process of transfer and a process of exchange transfer between registers are performed. Specifically, the contents of CV3 are transferred to CV4, the contents of CV2 are exchange-transferred to CV2, the contents of CV6 are transferred to CV3, and the contents of CV5 are transferred to CV1.

In process 724, a next process of transfer and a next process of exchange transfer between registers are performed. Specifically, the contents of CV1 are transferred to CV5, and the contents of CV2 are exchange-transferred to CV7.

In process 725, a next process of transfer between registers is performed. In this case, the contents of CV3 are transferred to CV6.

Figure 37:
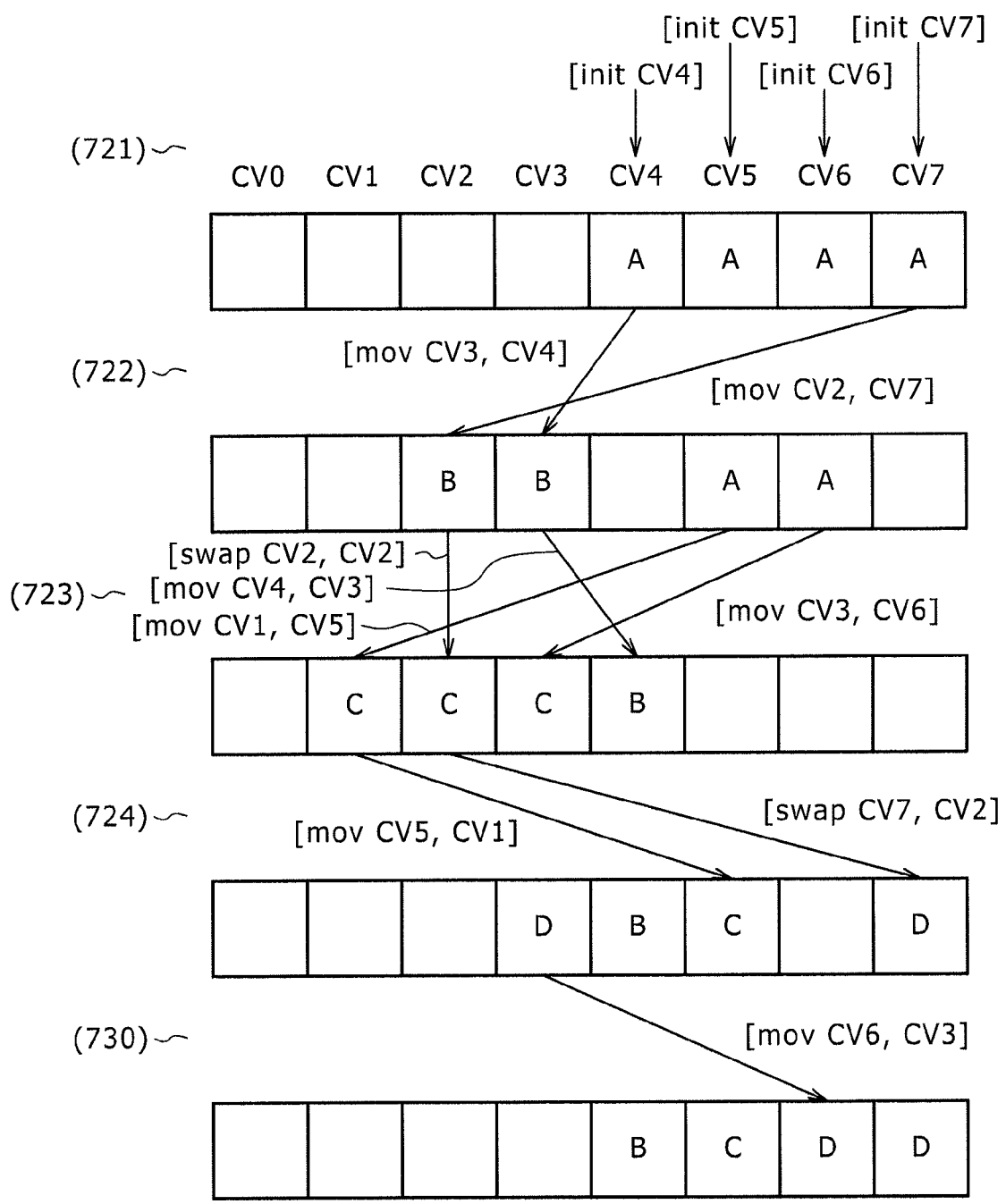
FIG. 37 is a diagram showing a mode of transfer between registers according to the process procedure of FIG. 36.

FIG. 37 is a diagram showing a mode of transfer between registers according to the process procedure of FIG. 36. This figure shows that CV4 to CV7 are set as locations for saving syntax elements decoded in the first half, that syntax elements are transferred to CV1 to CV3 before use, and that the syntax elements are saved to CV4 to CV7 again after the use.

Figure 38:
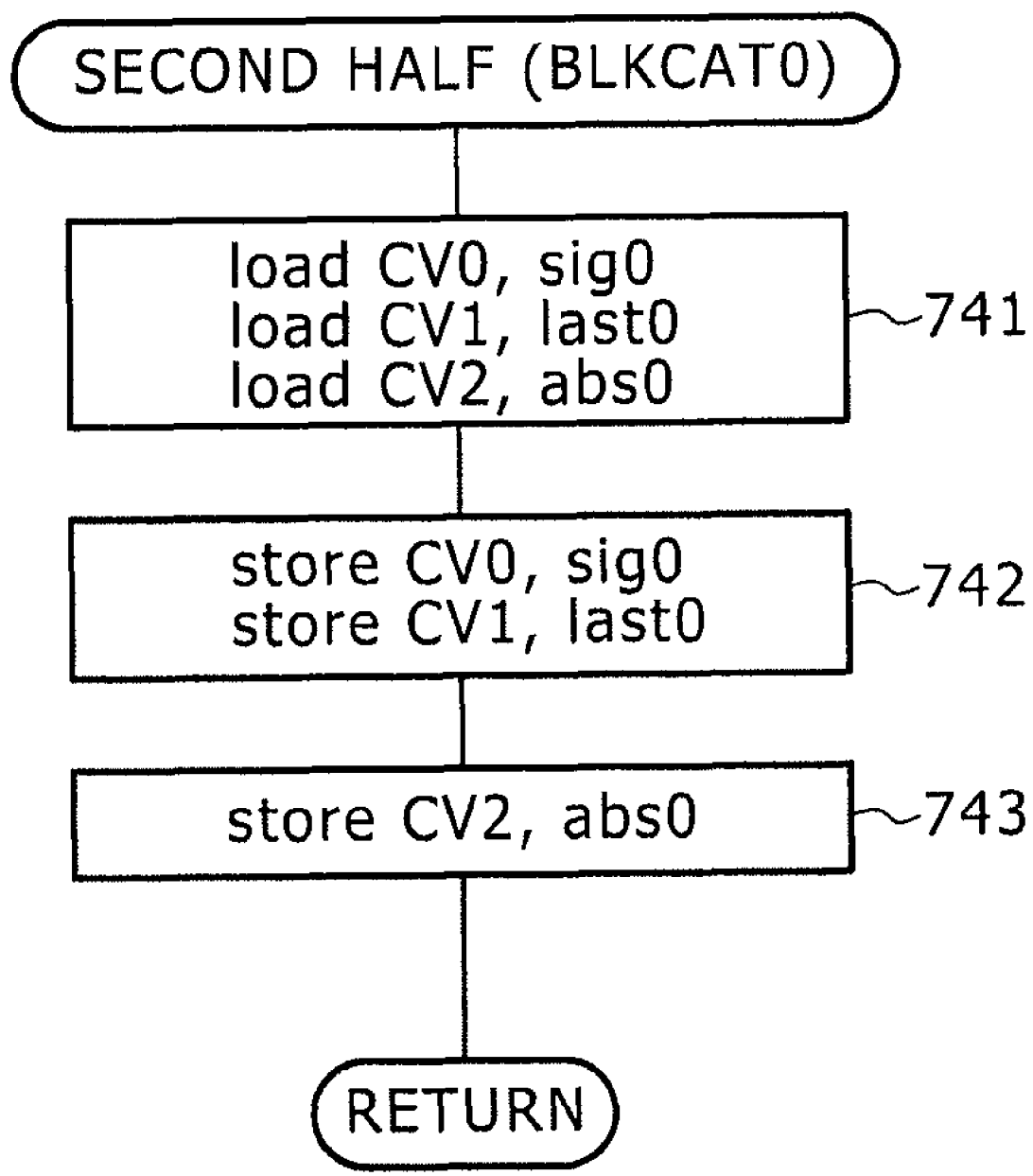
FIG. 38 is a diagram showing an example of process contents related to Block Category 0 among the syntax elements decoded in the second half in the embodiment of the present invention.

FIG. 38 is a diagram showing an example of process contents related to Block Category 0 among the syntax elements decoded in the second half in the embodiment of the present invention.

In process 741, a load from the main memory 300 into the register file 120 is performed. Specifically, the context variables of "significant_coeff_flag" of Block Category 0 are loaded from a storage address (sig0) to CV0. In addition, the context variables of "last_significant_coeff_flag" of Block Category 0 are loaded from a storage address (last0) to CV1. Further, the context variables of "coeff_abs_level_minus1" of Block Category 0 are loaded from a storage address (abs0) to CV2.

In process 742, storage into the main memory 300 is performed. Specifically, the contents of CV0 are stored at sig0, and the contents of CV1 are stored at last0.

In process 743, next storage into the main memory 300 is performed. Specifically, the contents of CV2 are stored at abs0.

Figure 39:
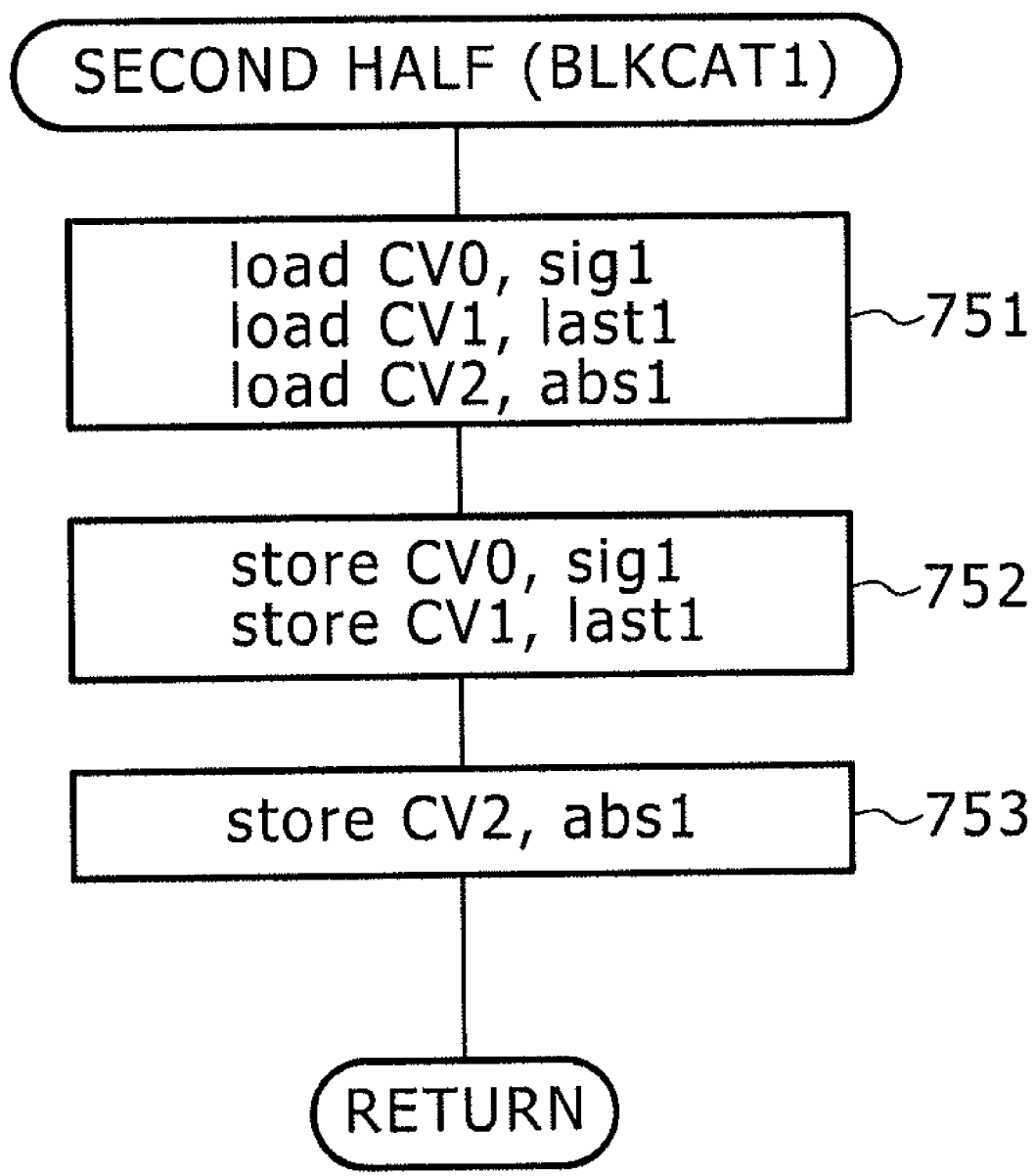
FIG. 39 is a diagram showing an example of process contents related to Block Category 1 among the syntax elements decoded in the second half in the embodiment of the present invention.

FIG. 39 is a diagram showing an example of process contents related to Block Category 1 among the syntax elements decoded in the second half in the embodiment of the present invention.

In process 751, a load from the main memory 300 into the register file 120 is performed. Specifically, the context variables of "significant_coeff_flag" of Block Category 1 are loaded from a storage address (sig1) to CV0. In addition, the context variables of "last_significant_coeff_flag" of Block Category 1 are loaded from a storage address (last1) to CV1. Further, the context variables of "coeff_abs_level_minus1" of Block Category 1 are loaded from a storage address (abs1) to CV2.

In process 752, storage into the main memory 300 is performed. Specifically, the contents of CV0 are stored at sig1, and the contents of CV1 are stored at last1.

In process 753, next storage into the main memory 300 is performed. Specifically, the contents of CV2 are stored at abs1.

Figure 40:
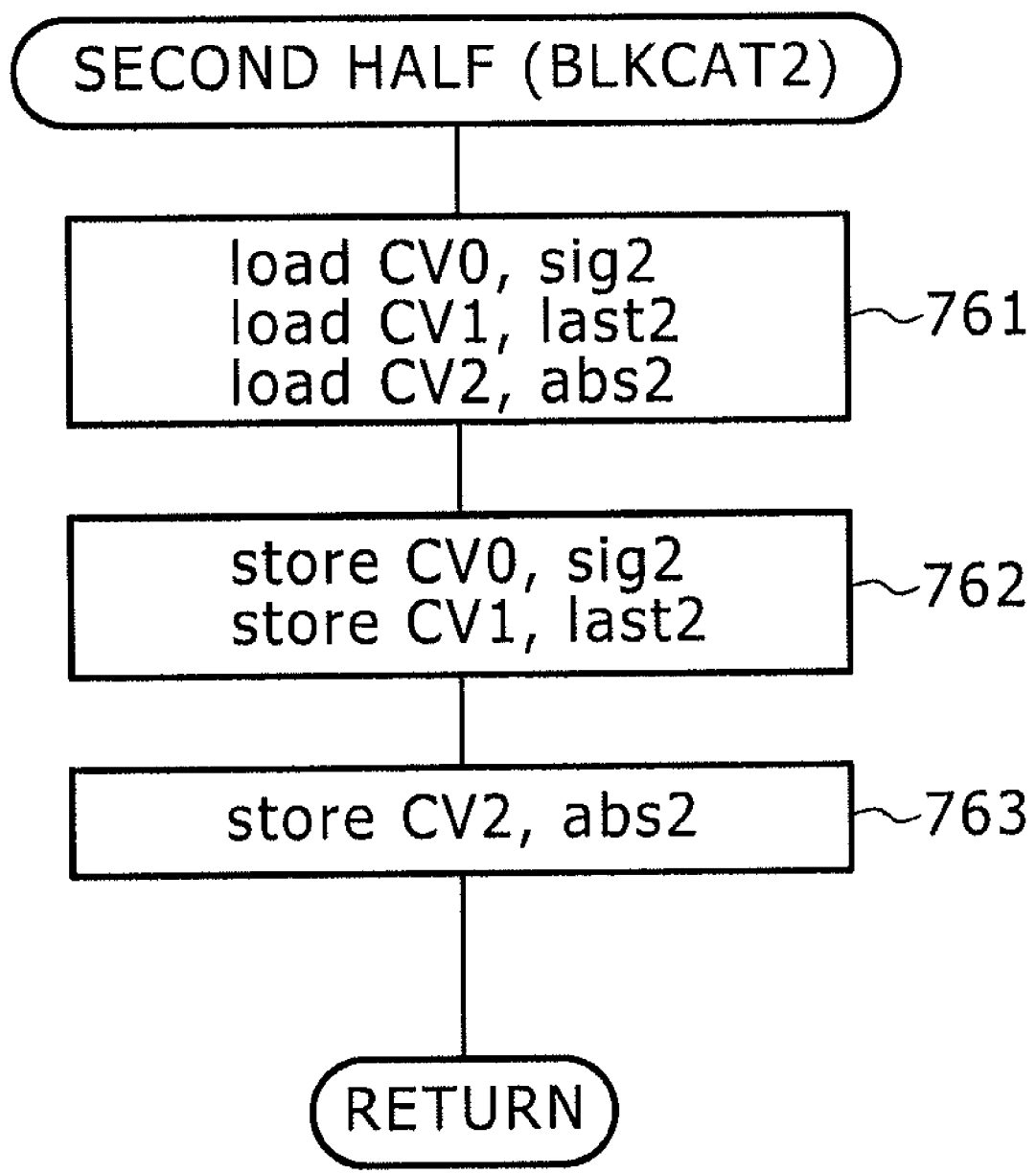
FIG. 40 is a diagram showing an example of process contents related to Block Category 2 among the syntax elements decoded in the second half in the embodiment of the present invention.

FIG. 40 is a diagram showing an example of process contents related to Block Category 2 among the syntax elements decoded in the second half in the embodiment of the present invention.

In process 761, a load from the main memory 300 into the register file 120 is performed. Specifically, the context variables of "significant_coeff_flag" of Block Category 2 are loaded from a storage address (sig2) to CV0. In addition, the context variables of "last_significant_coeff_flag" of Block Category 2 are loaded from a storage address (last2) to CV1. Further, the context variables of "coeff_abs_level_minus1" of Block Category 2 are loaded from a storage address (abs2) to CV2.

In process 762, storage into the main memory 300 is performed. Specifically, the contents of CV0 are stored at sig2, and the contents of CV1 are stored at last2.

In process 763, next storage into the main memory 300 is performed. Specifically, the contents of CV2 are stored at abs2.

Figure 41:
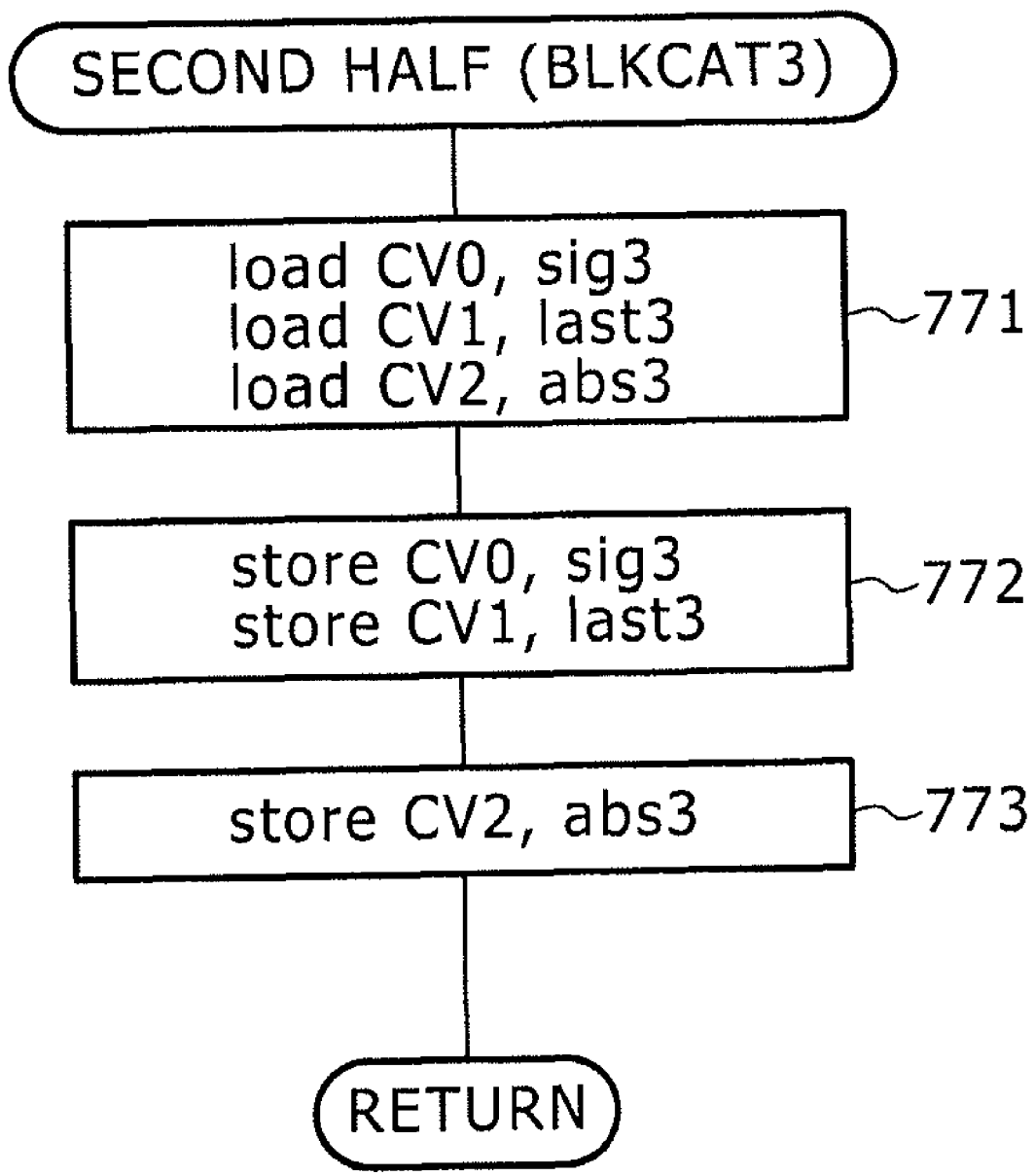
FIG. 41 is a diagram showing an example of process contents related to Block Category 3 among the syntax elements decoded in the second half in the embodiment of the present invention.

FIG. 41 is a diagram showing an example of process contents related to Block Category 3 among the syntax elements decoded in the second half in the embodiment of the present invention.

In process 771, a load from the main memory 300 into the register file 120 is performed. Specifically, the context variables of "significant_coeff_flag" of Block Category 3 are loaded from a storage address (sig3) to CV0. In addition, the context variables of "last_significant_coeff_flag" of Block Category 3 are loaded from a storage address (last3) to CV1. Further, the context variables of "coeff_abs_level_minus1" of Block Category 3 are loaded from a storage address (abs3) to CV2.

In process 772, storage into the main memory 300 is performed. Specifically, the contents of CV0 are stored at sig3, and the contents of CV1 are stored at last3.

In process 773, next storage into the main memory 300 is performed. Specifically, the contents of CV2 are stored at abs3.

Figure 42:
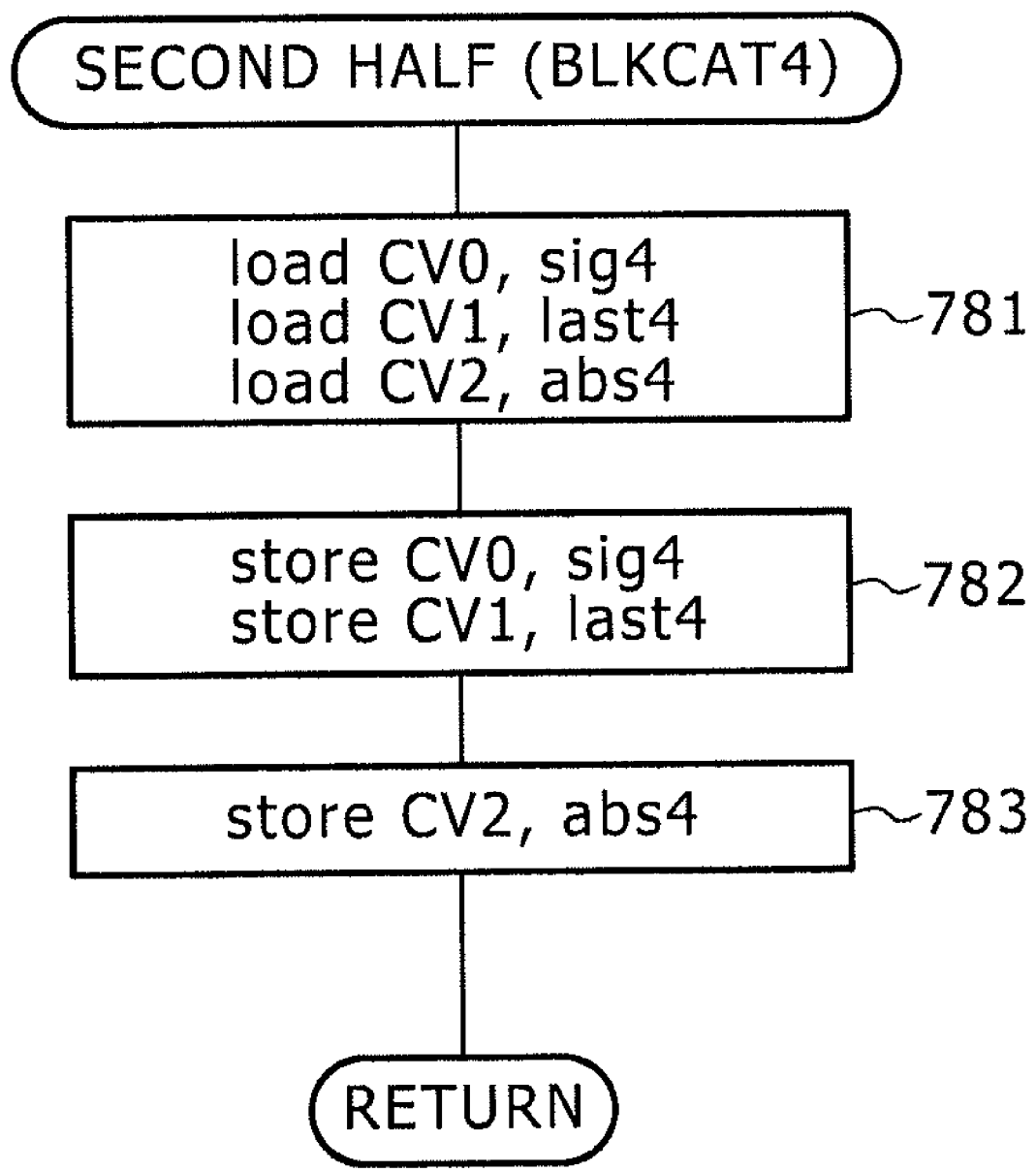
FIG. 42 is a diagram showing an example of process contents related to Block Category 4 among the syntax elements decoded in the second half in the embodiment of the present invention.

FIG. 42 is a diagram showing an example of process contents related to Block Category 4 among the syntax elements decoded in the second half in the embodiment of the present invention.

In process 781, a load from the main memory 300 into the register file 120 is performed. Specifically, the context variables of "significant_coeff_flag" of Block Category 4 are loaded from a storage address (sig4) to CV0. In addition, the context variables of "last_significant_coeff_flag" of Block Category 4 are loaded from a storage address (last4) to CV1. Further, the context variables of "coeff_abs_level_minus1" of Block Category 4 are loaded from a storage address (abs4) to CV2.

In process 782, storage into the main memory 300 is performed. Specifically, the contents of CV0 are stored at sig4, and the contents of CV1 are stored at last4.

In process 783, next storage into the main memory 300 is performed. Specifically, the contents of CV2 are stored at abs4.

Figure 43:
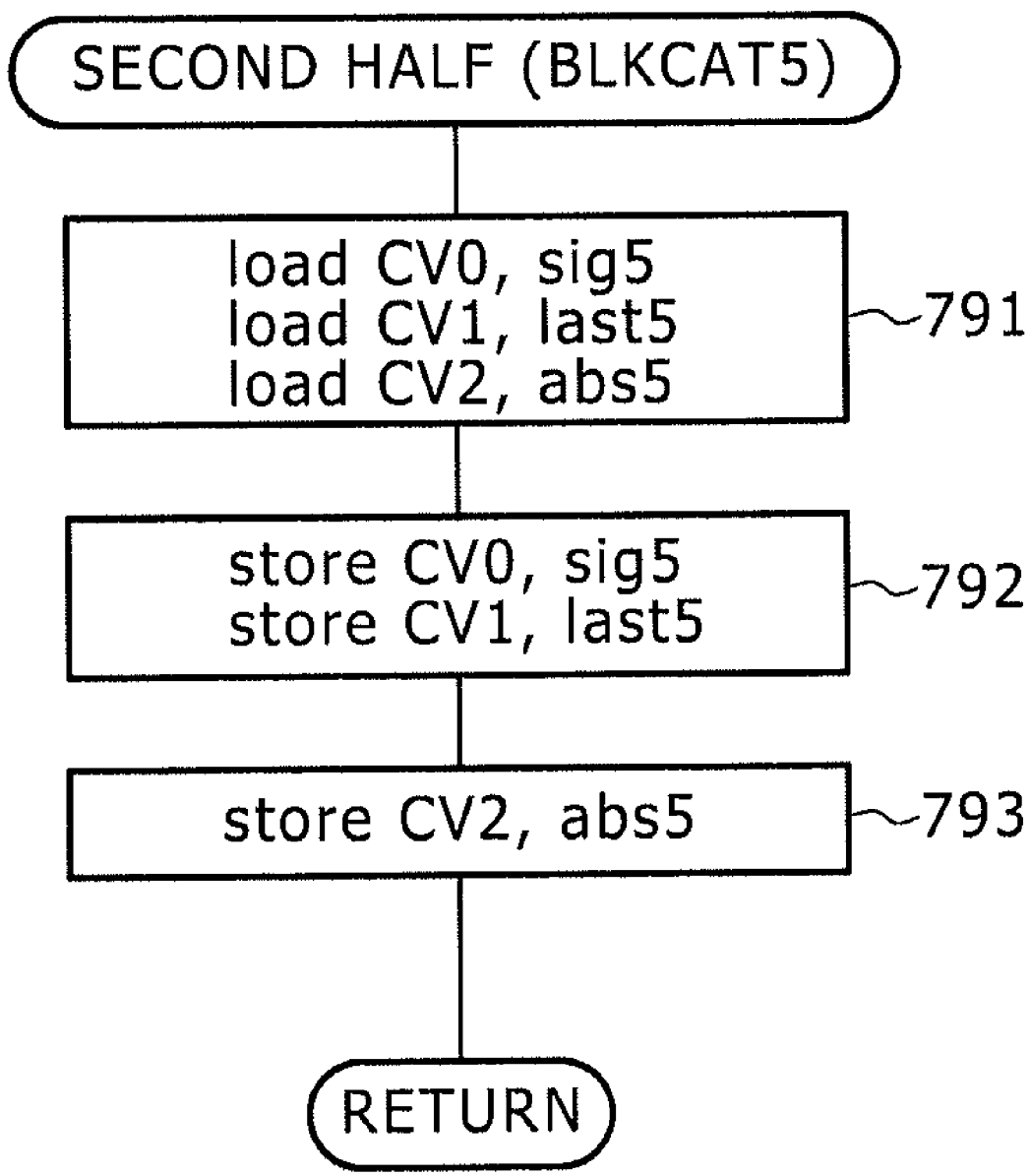
FIG. 43 is a diagram showing an example of process contents related to Block Category 5 among the syntax elements decoded in the second half in the embodiment of the present invention.

FIG. 43 is a diagram showing an example of process contents related to Block Category 5 among the syntax elements decoded in the second half in the embodiment of the present invention.

In process 791, a load from the main memory 300 into the register file 120 is performed. Specifically, the context variables of "significant_coeff_flag" of Block Category 5 are loaded from a storage address (sig5) to CV0. In addition, the context variables of "last_significant_coeff_flag" of Block Category 5 are loaded from a storage address (last5) to CV1. Further, the context variables of "coeff_abs_level_minus1" of Block Category 5 are loaded from a storage address (abs5) to CV2.

In process 792, storage into the main memory 300 is performed. Specifically, the contents of CV0 are stored at sig5, and the contents of CV1 are stored at last5.

In process 793, next storage into the main memory 300 is performed. Specifically, the contents of CV2 are stored at abs5.

Incidentally, because the processes 751 to 753, the processes 761 to 763, the processes 771 to 773, the processes 781 to 783, and the processes 791 to 793 are processes within a loop, when same context variables are consecutively used a number of times, the storing and loading of the context variables can be omitted.

FIG. 44 is a diagram showing a mode of transfer between registers according to the process procedures of FIGS. 38 to 43. This figure shows that syntax elements decoded in the second half are loaded into CV0 to CV2 for each Block Category and stored after CABAC decoding.

A process related to syntax elements decoded in the first half is complex but is low in process quantity. Specifically, the calculation of the context index is complex, and the percentage of the number of bins is low at about 10to 20%. Thus, there is a great effect of latency when context variables are stored in the main memory 300, and therefore the context variables are saved to CV4 to CV7 and decoding is performed.

On the other hand, a process related to syntax elements decoded in the second half is simple but is high in process quantity. It is therefore possible to continue using same context variables consecutively. Specifically, the calculation of the context index is simple, and the percentage of the number of bins is high at about 80 to 90%. Thus, because load or store latency is easily hidden, context variables are stored in the main memory 300, and decoding is performed while the context variables of CV0 to CV2 are replaced at a boundary between block categories.

Figure 45:
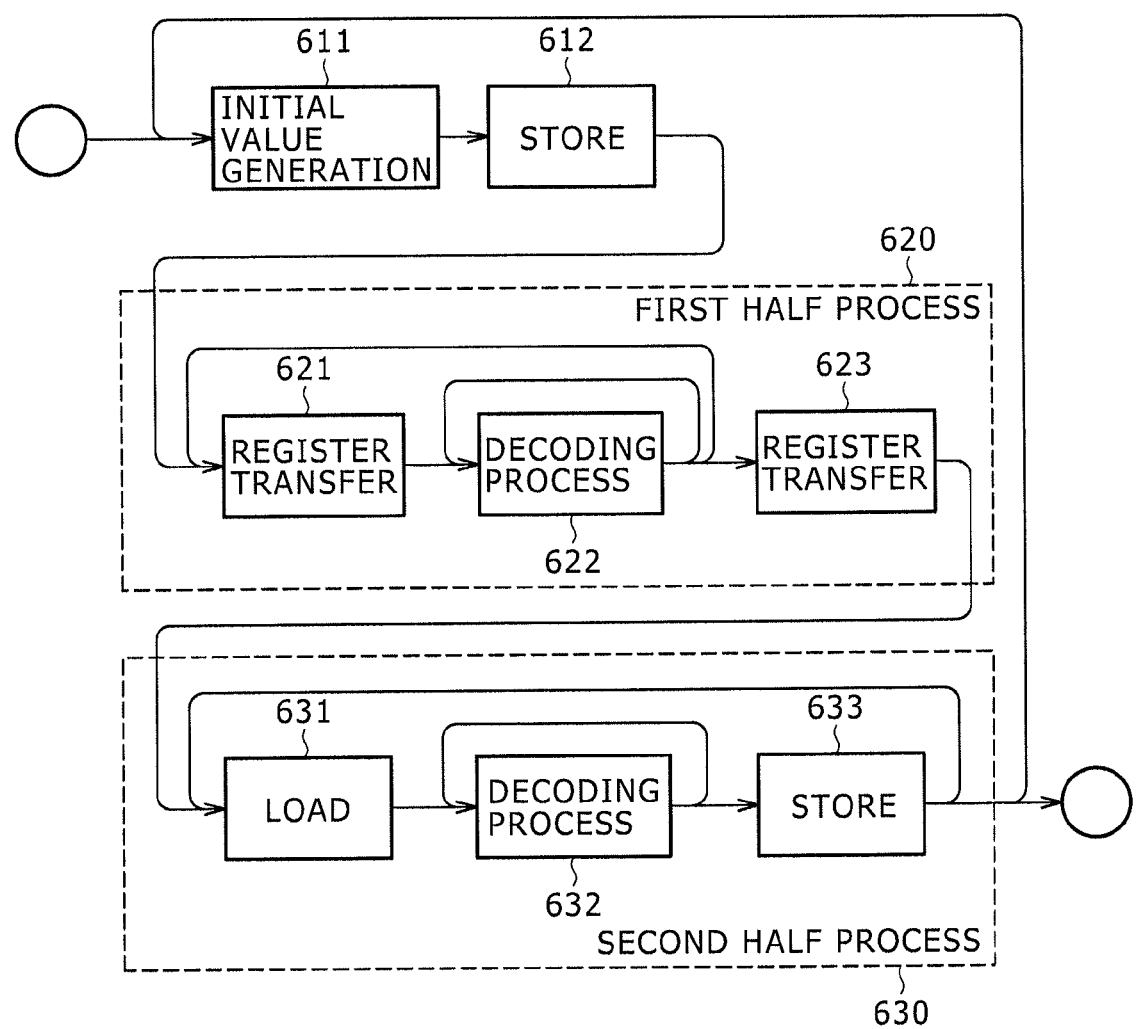
FIG. 45 is a diagram showing an outline of a decoding process in the embodiment of the present invention.

FIG. 45 is a diagram showing an outline of a decoding process in the embodiment of the present invention. In this figure, attention is directed to data operation. First, the initial values of necessary context variables are generated (611), and the initial values of syntax elements decoded in the second half are stored in the main memory 300 while syntax elements decoded in the first half remain saved in the registers CV4 to CV7 (612).

In first half process 620, the context variables saved in CV4 to CV7 are transferred to CV0 to CV3 (621), and a decoding process is performed (622). Then, all the syntax elements to be decoded in the first half are decoded by repeating a process of writing updated context variables back to the original registers CV4 to CV7 (623).

In second half process 630, context variables necessary for each Block Category are loaded from the main memory 300 into CV0 to CV2 (631), and a decoding process is performed (632). Then, all the syntax elements to be decoded in the second half are decoded by repeating a process of storing updated context variables into the main memory 300 (633).

Figure 46:
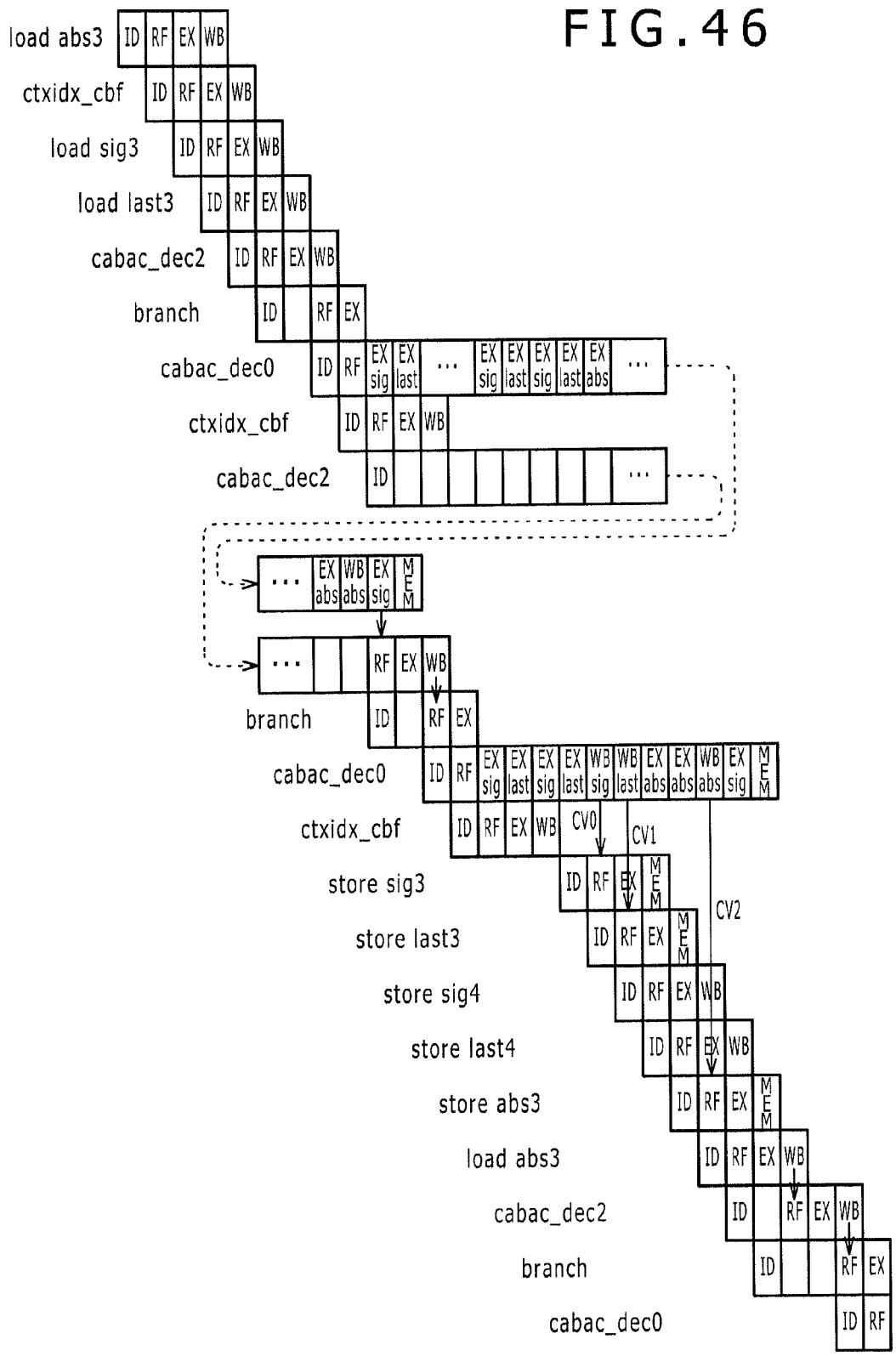
FIG. 46 is a diagram showing an example of load and store latency being hidden in the embodiment of the present invention.
Figure 50:
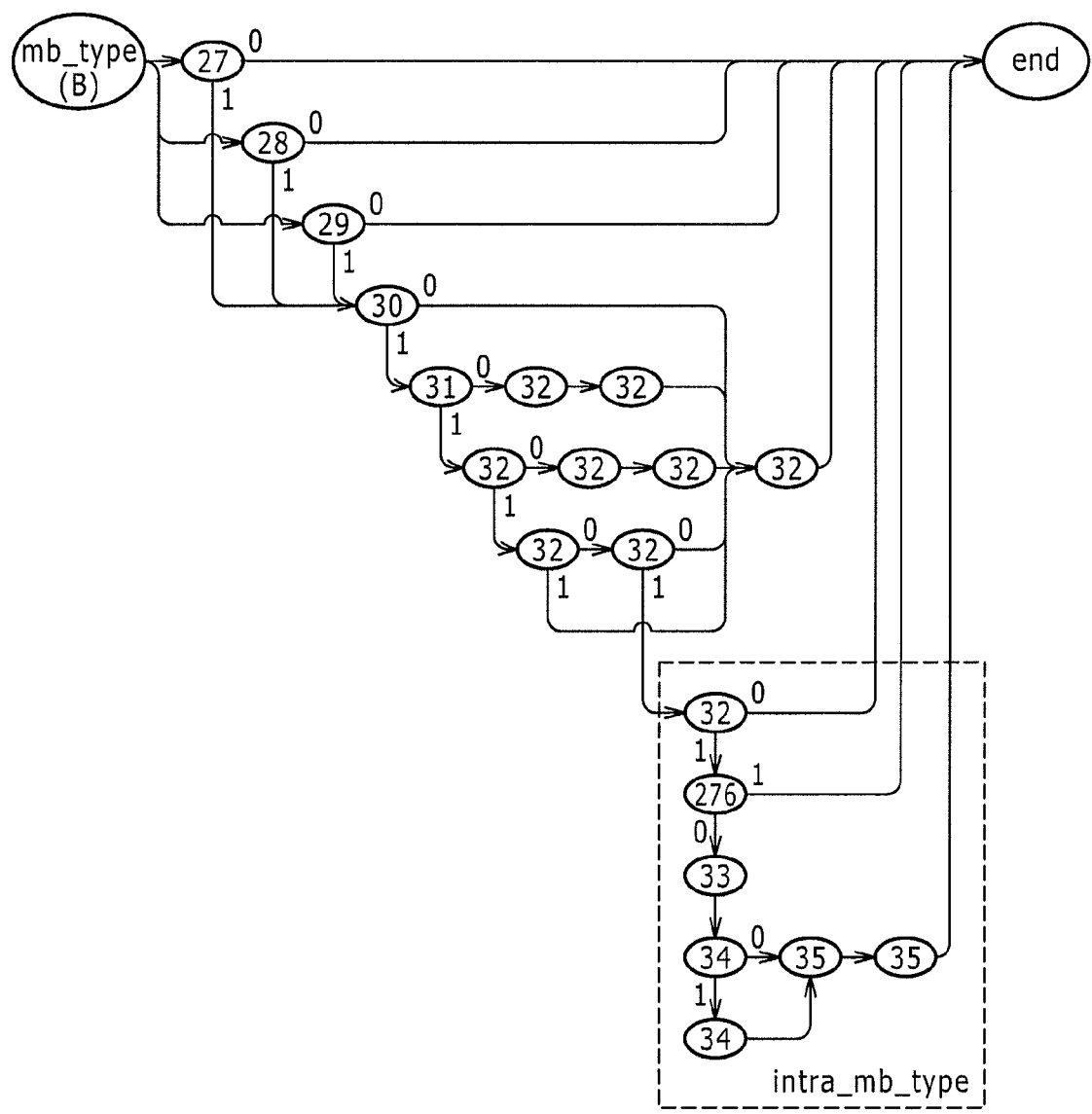
FIG. 50 is a diagram showing a flow of decoding of "mb_type" when a slice type is a B slice.

FIG. 46 is a diagram showing an example of load and store latency being hidden in the embodiment of the present invention. This figure shows a state up to the execution of Block Category 4 after Block Category 3 is decoded twice.

"Branch" is an instruction to perform branching that determines whether to decode coefficients in "cabac_dec0" according to a result of "coded_block_flag" decoded in "cabac_dec2." In this case, the decoding of all coefficients is assumed. Assuming that there is an instruction to calculate the context index of "coded_block_flag," the instruction is set as "ctxIdx_cbf." In this case, a pipeline of four stages is basically assumed. That is, the four stages are a decode stage (ID) in which an instruction fetch and an instruction decode are performed, a register fetch stage (RF) in which an operand fetch is performed from a register, an execution stage (EX) in which an operation process and the like are performed, and a write-back stage (WB) in which a write-back to the register is performed. A memory stage (MEM) in which a process of storage into memory is performed is also provided. It is assumed that loading and storing hit the data cache. Suppose that the register is forwarded (bypassed), and that a result of operation in the execution stage (EX) of an immediately preceding instruction can be referred to in the register fetch stage (RF) of a next instruction without a wait for the completion of the write-back stage (WB).

A "cabac_dec0 instruction" obtains a right to use the registers CV0 to CV2 from the decoding control section 190 in a register fetch stage (RF). Then, the "cabac_dec0 instruction" alternately repeats "EXsig" that decodes "significant_coeff_flag" and "EXlast" that decodes "last_significant_coeff_flag." When a process for one block is completed as a result, the "cabac_dec0 instruction" returns the right to use the registers CV0 and CV1 to the decoding control section 190 in "WBsig" and "WBlast." Thereby "coeff_abs_level_minus1" is decoded by the number of decoded coefficients. However, because "coeff_abs_level_minus1" is a plurality of bins, "EXabs" is repeated a plurality of times for each coefficient, and thereafter "EXsign" that decodes a positive and a negative sign and the like by a decode bypass that does not need a context variable is executed. Then, when "EXabs" for a last coefficient is completed, the right to use CV2 is returned to the decoding control section 190 in "WBabs," and the decoded coefficient is written to the main memory 300 in "MEM." Because the right to use CV0 and CV1 is returned early, a store process and a next load process can be performed during the decoding of "coeff_abs_level_minus1."

Thus, according to the embodiment of the present invention, a plurality of arithmetic registers for supplying context variables to the CABAC decoding arithmetic unit 110 are provided in the register file 120, and a plurality of save registers for saving the context variables of syntax elements decoded in the first half are provided in the register file 120. Thereby decoding can be performed efficiently. In particular, the context variables of syntax elements decoded in the first half are saved to the save registers, and therefore access to the main memory 300 can be suppressed.

It is to be noted that while the embodiments of the present invention represent an example for embodying the present invention, and each have correspondences with specific inventive items in claims as shown in the following, the present invention is not limited to this, and is susceptible of various modifications without departing from the spirit of the present invention.

The present application contains subject matter related to that disclosed in Japanese Priority Patent Application JP 2008-118493 filed in the Japan Patent Office on Apr. 30, 2008, the entire content of which is hereby incorporated by reference.

What is claimed is:

1. An arithmetic decoding device comprising:
an arithmetic decoding unit configured to decode coded data resulting from arithmetic coding on a basis of a context variable indicating a probability state and a most probable symbol;
a plurality of arithmetic registers configured to supply said context variable to said arithmetic decoding unit and retain a result of operation by said arithmetic decoding unit; and
a plurality of save registers configured to save contents retained in said arithmetic registers, wherein said plurality of save registers save only context variables relating to predetermined syntax elements among said context variables.

2. The arithmetic decoding device according to claim 1, wherein said predetermined syntax elements are classified into a plurality of groups, and each of said plurality of save registers saves context variables in correspondence with said classified groups.

3. The arithmetic decoding device according to claim 2, wherein said plurality of groups include a group of syntax elements related to macroblocks, a group of syntax elements related to motion vector information, a group of syntax elements related to pixel prediction, and a group of syntax elements related to block information.

4. The arithmetic decoding device according to claim 3, wherein:
the group of syntax elements related to said macroblocks includes "mb_type," "mb_skip_flag," and "sub_mb_type";
the group of syntax elements related to said motion vector information includes "mvd_l0[ ][ ][0]," "mvd_l1[ ][ ][0]," "mvd_l0[ ][ ][1]," and "mvd_l1[ ][ ][1]";
the group of syntax elements related to said pixel prediction includes "ref_idx_l0," "ref_idx_l1," "mb_qp_delta," "intra_chroma_pred_mode," "prev_intra4×4_pred_mode_flag," "prev_intra8×8_pred_mode_flag," "remintra4×4_pred_mode," and "rem_intra8×8_pred_mode"; and
the group of syntax elements related to said block information includes "mb_field_decoding_flag," "coded_block_pattern," and "transform_size_8×8_flag."

5. The arithmetic decoding device according to claim 4, wherein when a slice type of a decoding object is I or SI, "transform_size_8×8_flag" is included and managed in the group of syntax elements related to said pixel prediction.

6. An arithmetic decoding device comprising:
an arithmetic decoding unit configured to decode coded data resulting from arithmetic coding on a basis of a context variable indicating a probability state and a most probable symbol;
a plurality of arithmetic registers configured to supply said context variable to said arithmetic decoding unit and retain a result of operation by said arithmetic decoding unit: and
a plurality of save registers configured to save contents retained in said arithmetic registers, wherein each of said plurality of arithmetic registers and said plurality of save registers is a register of a 128-bit width and stores 16 context variables with one context variable of 7 bits assigned to each unit of 8 bits, and one or two context variables are stored with 16 bits obtained by collecting one surplus bit of each unit of 8 bits as a surplus register.

7. The arithmetic decoding device according to claim 6, further comprising
an exchange transfer processing block configured to set one of said plurality of arithmetic registers and said plurality of save registers as a transfer source register, exchange 7 bits of two of the 16 context variables stored in the transfer source register, exchange a value of 14 bits of two other context variables and a value of 14 bits of said surplus register, and perform a transfer with one of said plurality of arithmetic registers and said plurality of save registers as a transfer destination register.

8. The arithmetic decoding device according to claim 7, wherein
exchange state information indicating that said exchange has been made is assigned to said surplus register, and
when a value of one specified bit and said exchange state information are equal to each other, said exchange transfer processing block transfers contents stored in said transfer source register to said transfer destination register without making said exchange, and when the value of said one specified bit and said exchange state information are different from each other, said exchange transfer processing block transfers the contents stored in said transfer source register to said transfer destination register after making said exchange and inverting said exchange state information.

9. The arithmetic decoding device according to claim 8, further comprising:
a transfer buffer configured to retain contents stored in one of said plurality of arithmetic registers and said plurality of save registers; and
a context variable initial value generating block configured to generate an initial value of a specified context variable of context variables retained in said transfer buffer,
wherein said transfer buffer transfers the contents stored in said transfer buffer to said transfer destination register after changing the contents stored in said transfer buffer by said initial value generated by said context variable initial value generating block.

* * * * *